United States Patent
Ellinger et al.

(10) Patent No.: US 9,653,493 B2
(45) Date of Patent: May 16, 2017

(54) BOTTOM-GATE AND TOP-GATE VTFTS ON COMMON STRUCTURE

(71) Applicant: Eastman Kodak Company, Rochester, NY (US)

(72) Inventors: Carolyn Rae Ellinger, Rochester, NY (US); Shelby Forrester Nelson, Pittsford, NY (US); Christopher R. Morton, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/737,560

(22) Filed: Jun. 12, 2015

(65) Prior Publication Data
US 2016/0365369 A1    Dec. 15, 2016

(51) Int. Cl.
*H01L 27/12* (2006.01)
*H01L 29/786* (2006.01)
*H01L 29/40* (2006.01)

(52) U.S. Cl.
CPC ...... *H01L 27/1251* (2013.01); *H01L 27/1225* (2013.01); *H01L 27/1237* (2013.01)

(58) Field of Classification Search
CPC ... H01L 29/7869; H01L 29/45; H01L 29/518; H01L 29/78606; H01L 29/786;
(Continued)

(56) References Cited

U.S. PATENT DOCUMENTS 4,633,284 A * 12/1986 Hansell ............ H01L 29/78684
                                                        257/58
5,140,388 A *  8/1992 Bartelink ............ H01L 21/8221
                                                        257/369
(Continued)

FOREIGN PATENT DOCUMENTS

KR    20140153779 A  *  11/2014

OTHER PUBLICATIONS

Dodabalapur et al., "Organic Transistors Two Dimensional Transport and Improved Electrical Characteristics", *Science*, Apr. 1995, pp. 270-271.
Sze, "Physics of Semiconductor Devices", *Semiconductor Devices-Physics and Technology*, John Wiley & Sons, 1981, pp. 438-443.
Sinha, A. et al., *Journal of Science and Technology B*, vol. 24, No. 6, Nov./Dec. 2006, pp. 2523-2532.

*Primary Examiner* — Natalia Gondarenko
(74) *Attorney, Agent, or Firm* — William R. Zimmerli; Kevin E. Spaulding

(57) ABSTRACT

An electronic device includes a vertical-support-element with first and second edges having first and second reentrant profiles, respectively. The first reentrant profile includes first conformal semiconductor and dielectric layers, and a conformal conductive top-gate. A first electrode contacts a first portion of the first conformal semiconductor layer over the top of the vertical-support-element. A second electrode, adjacent to the first edge, contacts a second portion of the first conformal semiconductor layer not over the vertical-support-element. The second reentrant profile includes a conformal conductive bottom-gate, and second conformal dielectric and semiconductor layers. A third electrode, adjacent to the second edge, contacts the second semiconductor layer not over the vertical-support-element. A fourth electrode, over the vertical-support-element, contacts the second semiconductor layer. The first and second electrodes define a first semiconductor channel of a top-gate transistor, the third and fourth electrodes define a second semiconductor channel of a bottom-gate transistor.

17 Claims, 30 Drawing Sheets

(58) Field of Classification Search
CPC ........... H01L 29/42384; H01L 29/4908; H01L 29/66969; H01L 29/78642; H01L 27/127; H01L 27/1214; H01L 27/1248; H01L 27/1222; H01L 27/1225; H01L 27/1237; H01L 27/1251; H01L 27/1262; H01L 27/1288; H01L 21/02554; H01L 21/0274; H01L 21/441; H01L 21/02565; H01L 21/47573; H01L 21/47635; H01L 29/41733; H01L 29/78696; H01L 27/1259; H01L 27/3262; H01L 27/3276; H01L 33/44; H01L 33/52; H01L 27/1203; H01L 27/1211; H01L 28/60; H01L 51/0023; H01L 51/5234; H01L 51/5237; H01L 51/5253
USPC ......... 257/43, 56, 58, 62, 65, 153, 339, 346, 257/365, 366, 387, 57, 618, 66, E29.296; 438/157, 585
See application file for complete search history.

(56) References Cited

U.S. PATENT DOCUMENTS

| | | | |
|---|---|---|---|
| 5,229,310 A * | 7/1993 | Sivan | H01L 27/12 148/DIG. 150 |
| 5,574,294 A * | 11/1996 | Shepard | H01L 29/6675 257/327 |
| 6,429,457 B1 * | 8/2002 | Berggren | H01L 29/6675 257/328 |
| 7,413,982 B2 | 8/2008 | Levy | |
| 7,456,429 B2 | 11/2008 | Levy | |
| 7,789,961 B2 | 9/2010 | Nelson et al. | |
| 8,653,516 B1 | 2/2014 | Nelson et al. | |
| 8,659,092 B2 * | 2/2014 | Chen | H01L 27/1225 257/369 |
| 8,791,023 B2 | 7/2014 | Ellinger et al. | |
| 8,846,545 B2 | 9/2014 | Ellinger et al. | |
| 8,927,434 B2 | 1/2015 | Ellinger et al. | |
| 2004/0195568 A1 * | 10/2004 | Okumura | H01L 27/1237 257/59 |
| 2008/0303037 A1 * | 12/2008 | Irving | B82Y 10/00 257/88 |
| 2009/0130858 A1 | 5/2009 | Levy | |
| 2013/0084692 A1 * | 4/2013 | Nelson | H01L 29/78642 438/479 |
| 2013/0200332 A1 * | 8/2013 | Somenath | B82Y 10/00 257/9 |
| 2014/0061648 A1 | 3/2014 | Levy et al. | |
| 2014/0061795 A1 | 3/2014 | Levy et al. | |
| 2014/0061869 A1 | 3/2014 | Nelson et al. | |
| 2014/0065838 A1 | 3/2014 | Ellinger et al. | |
| 2016/0027812 A1 * | 1/2016 | Kim | H01L 21/76831 257/43 |
| 2016/0133754 A1 * | 5/2016 | Moon | H01L 29/78645 349/43 |

* cited by examiner

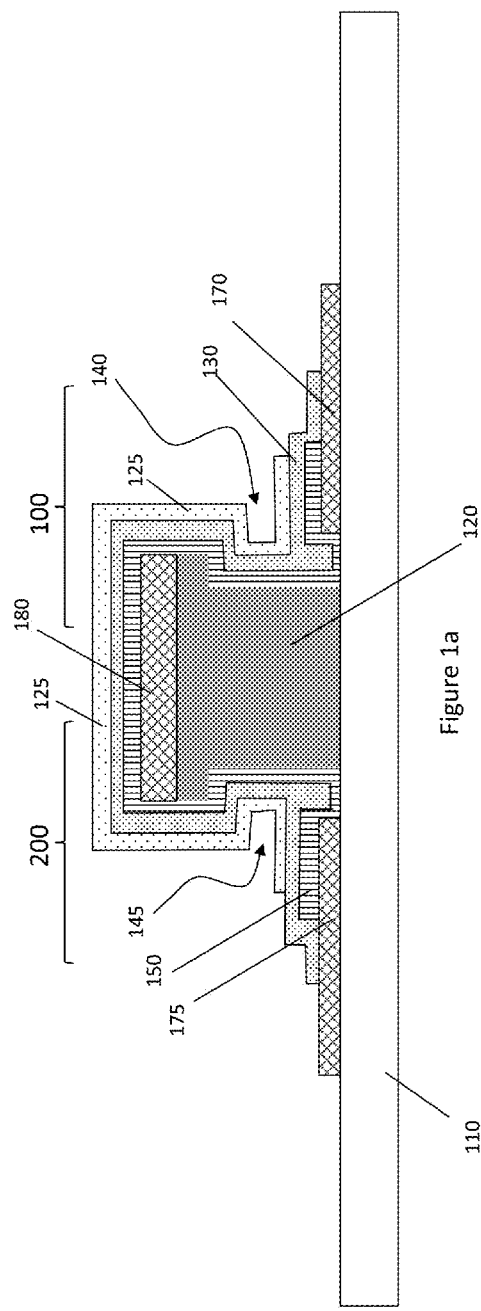
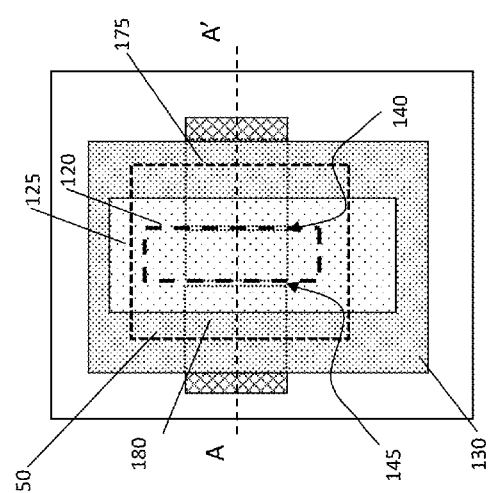

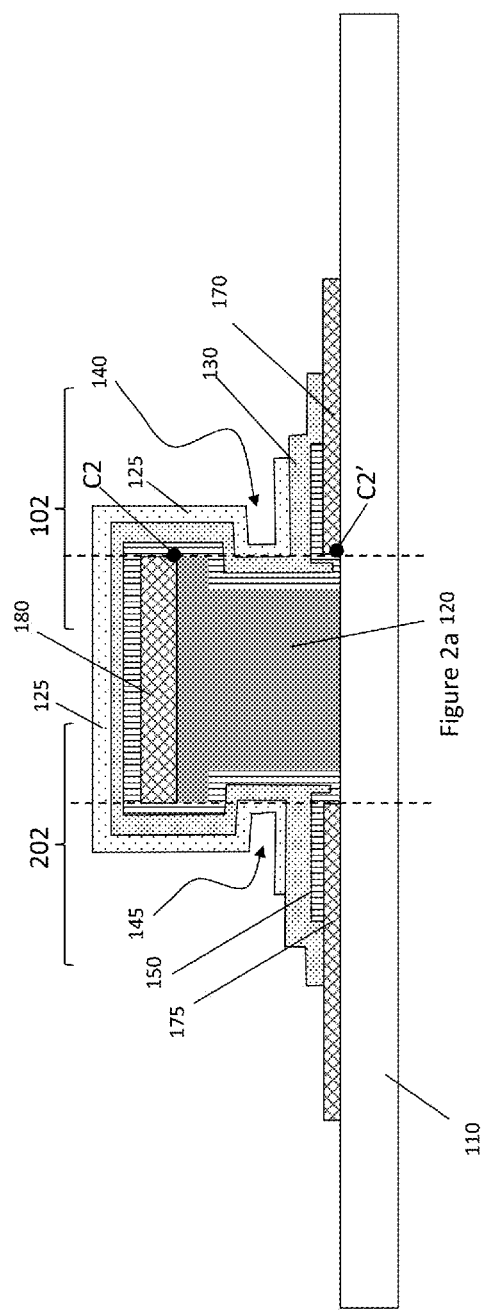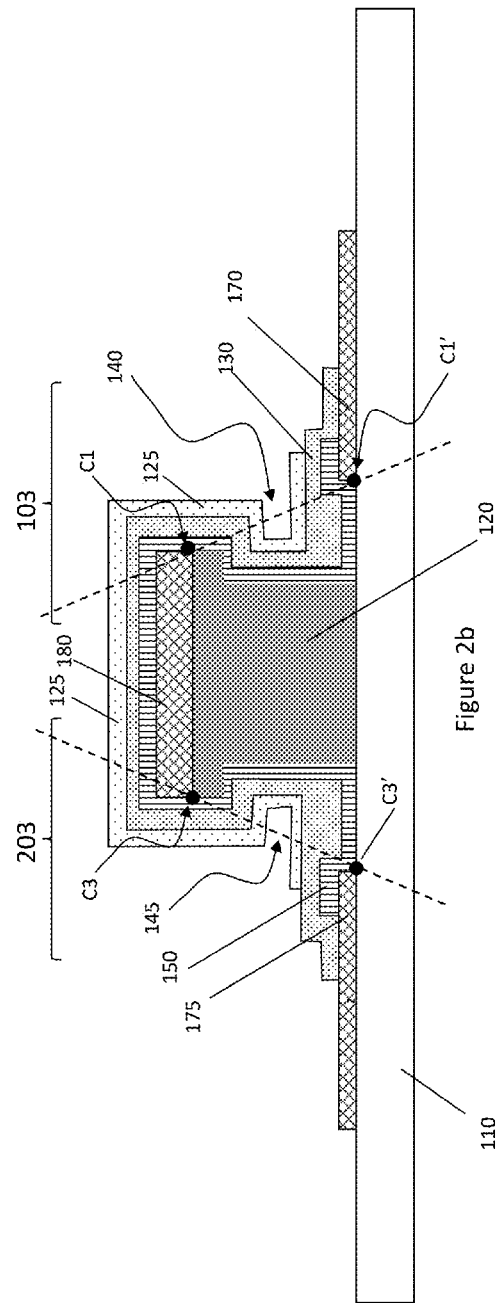

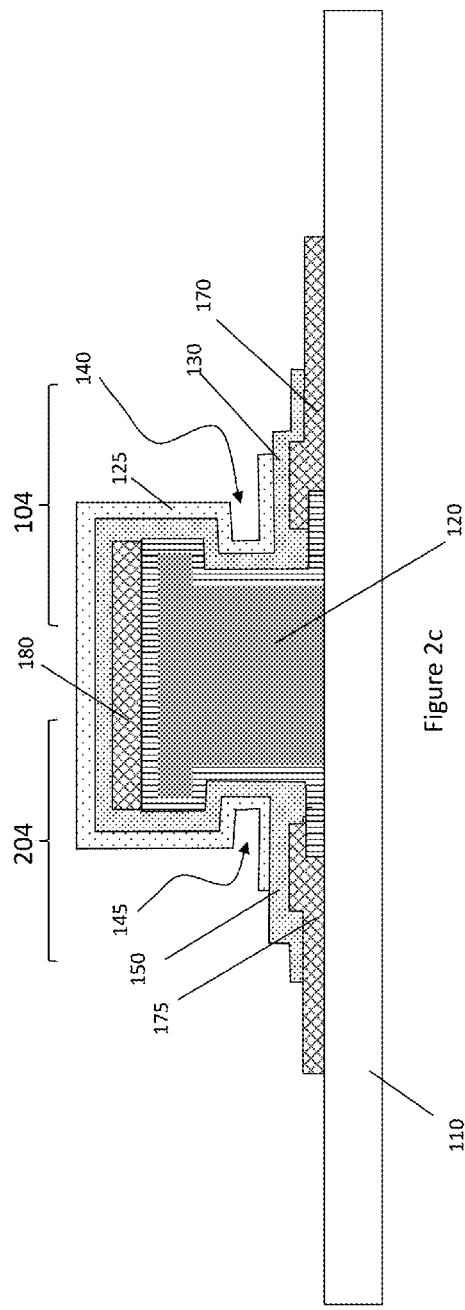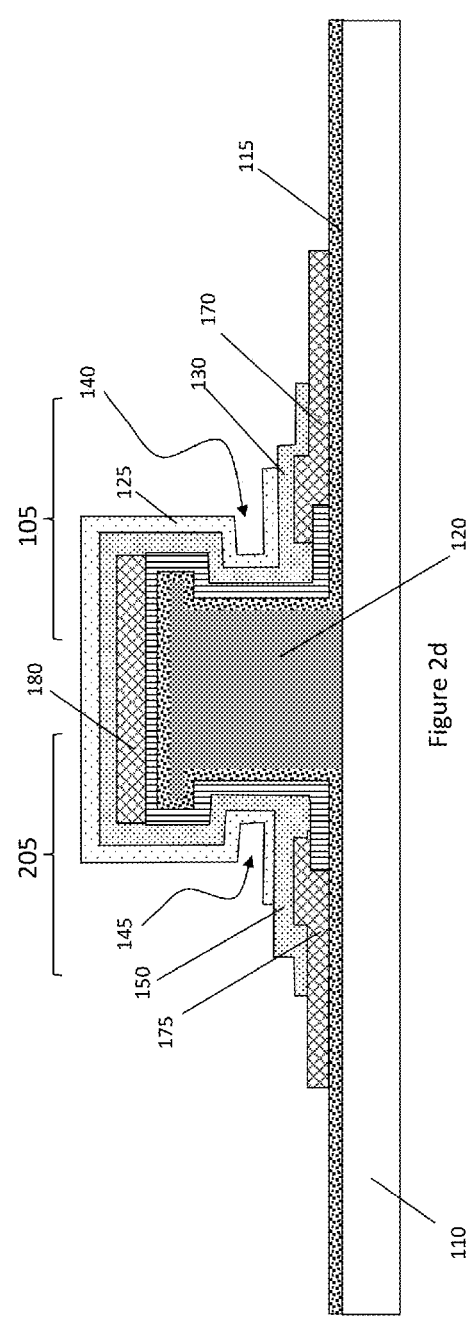

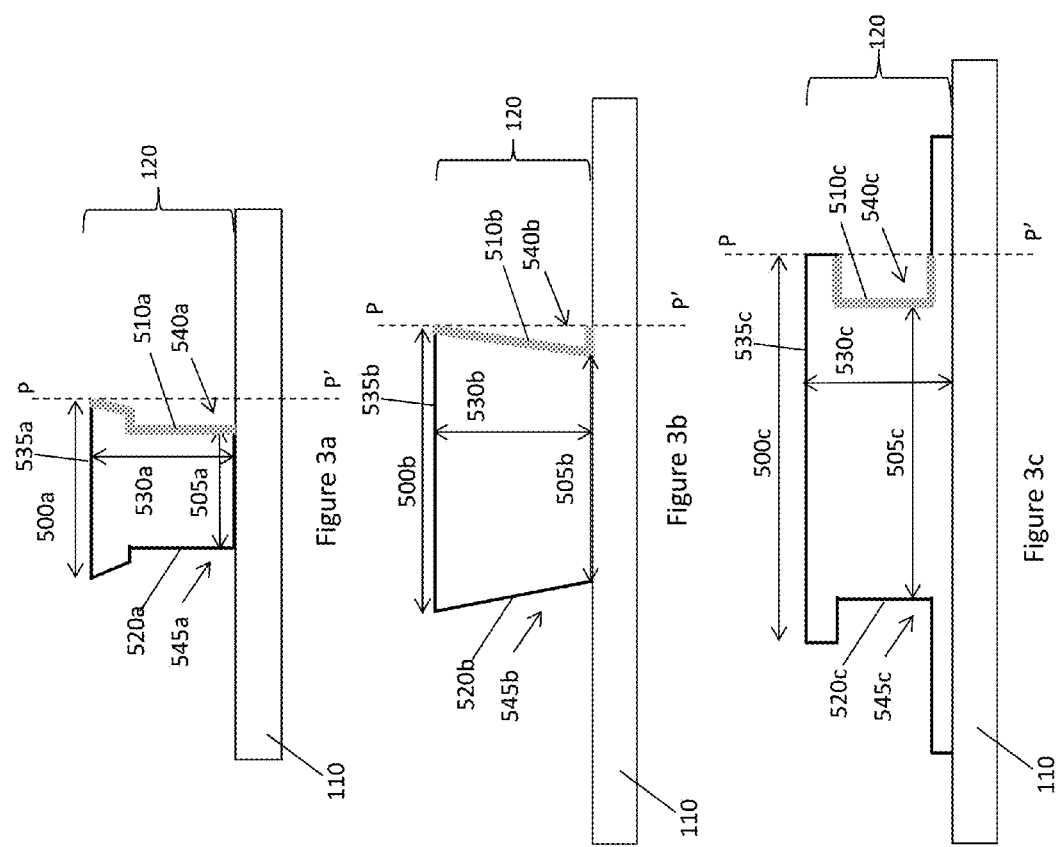

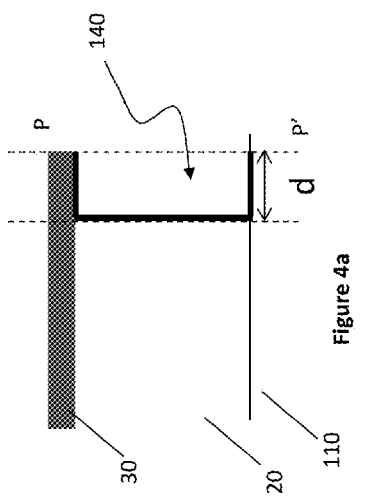
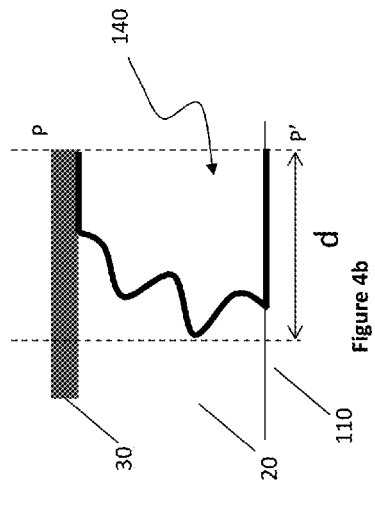
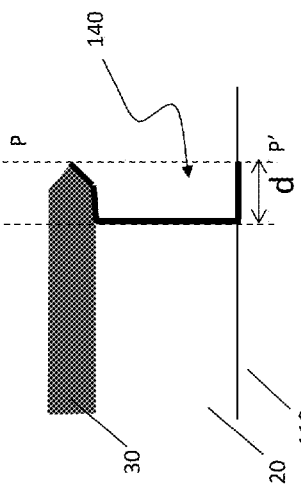
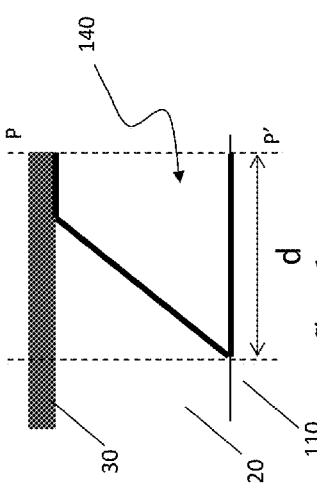
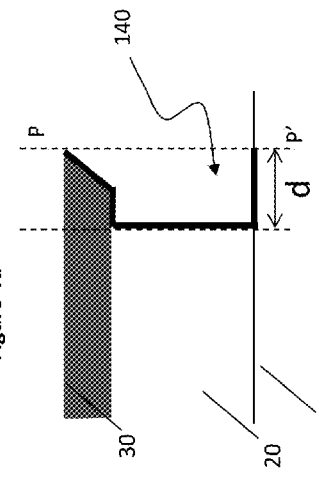
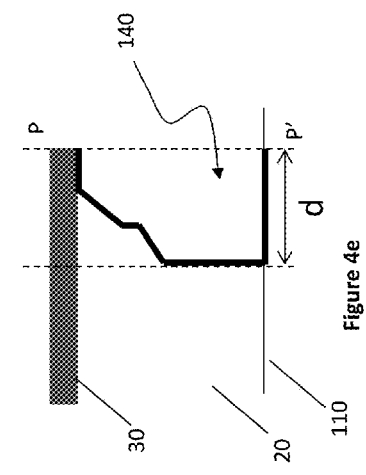

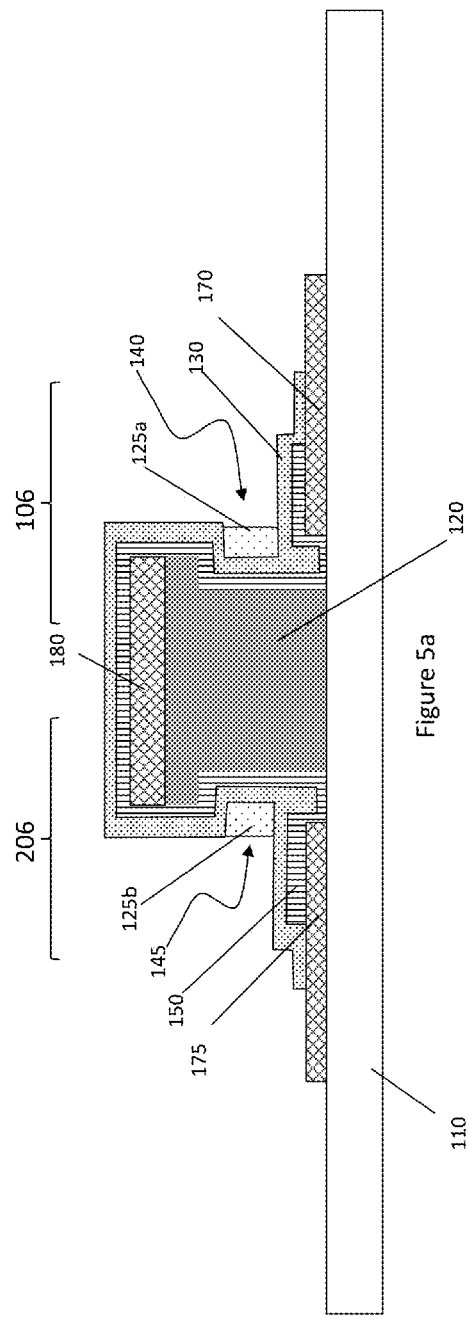
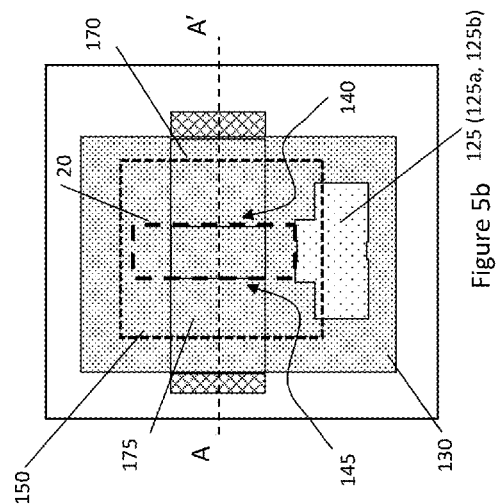

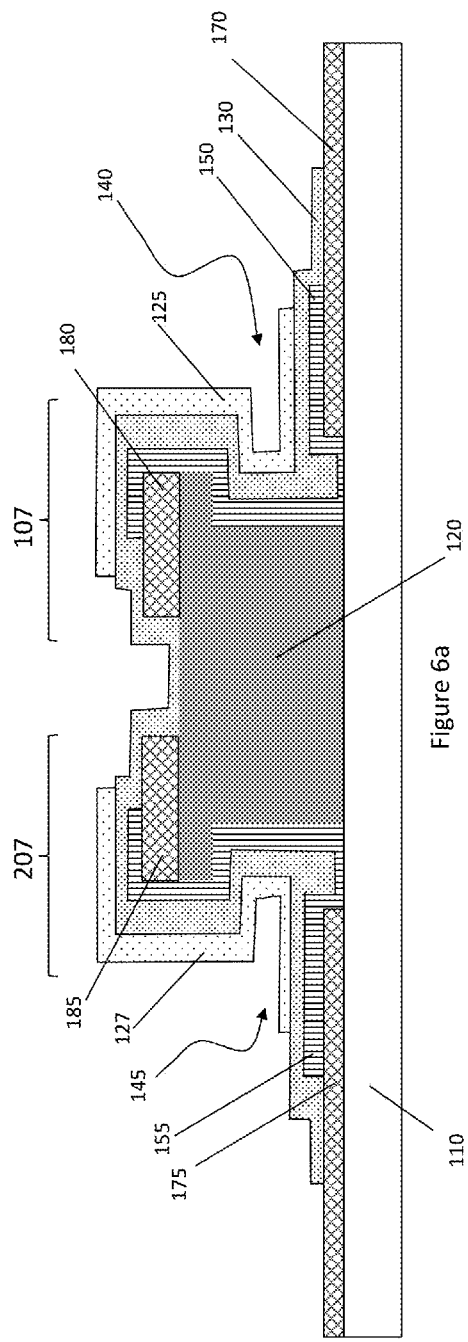
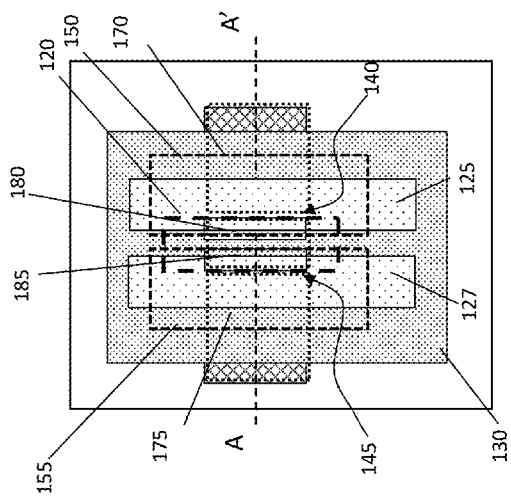
Figure 6a
Figure 6b

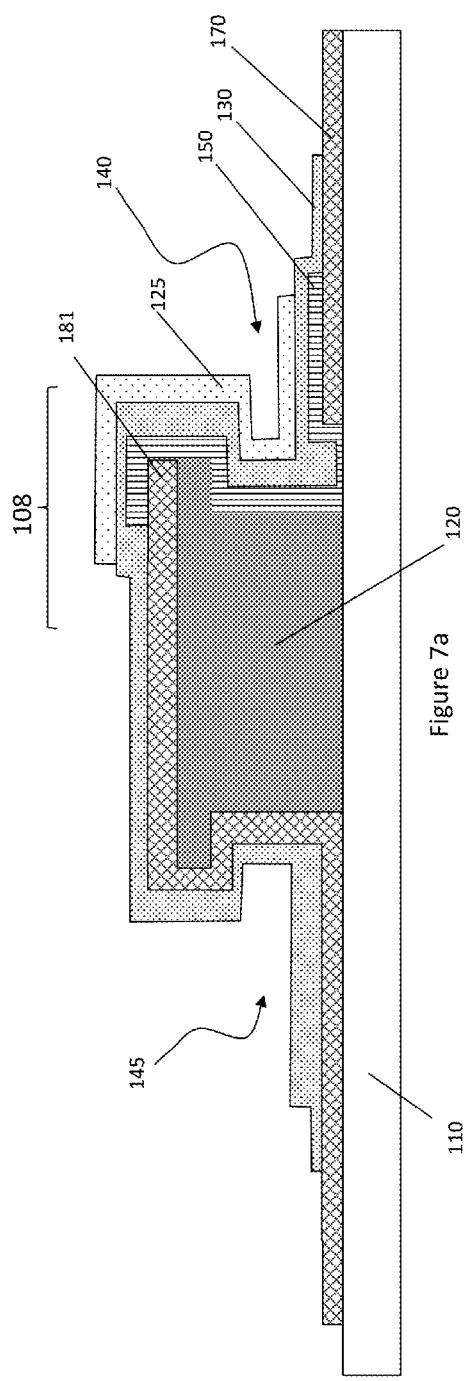
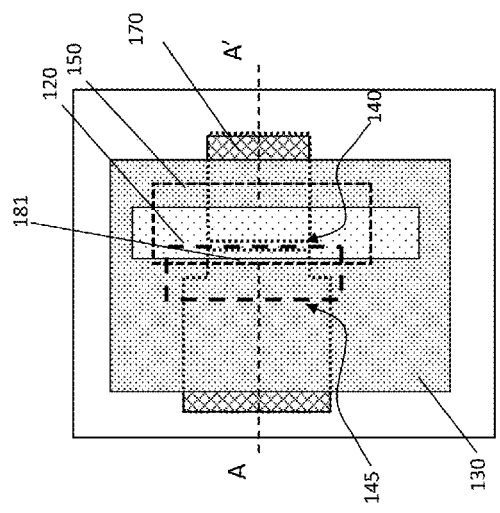

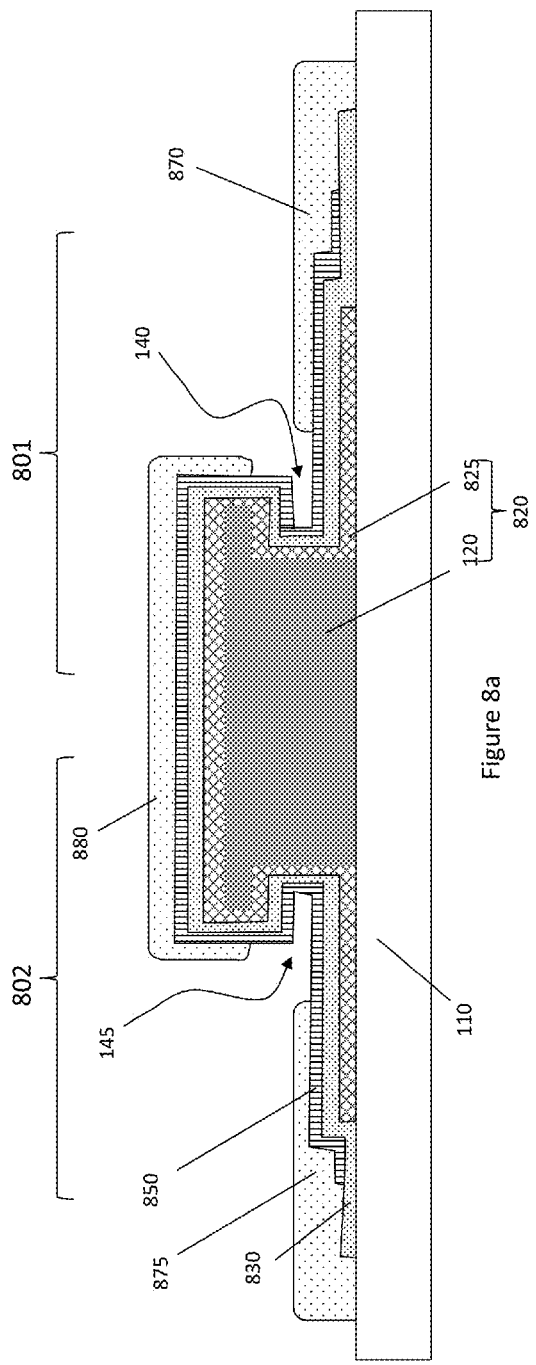
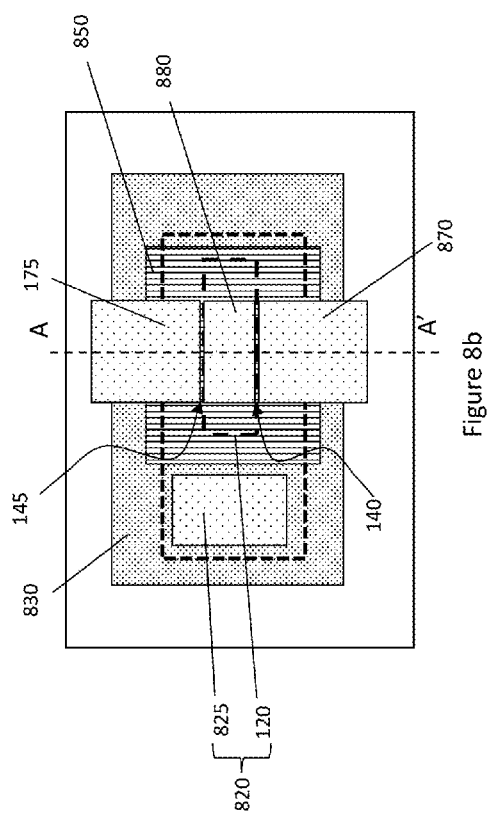
Figure 8a
Figure 8b

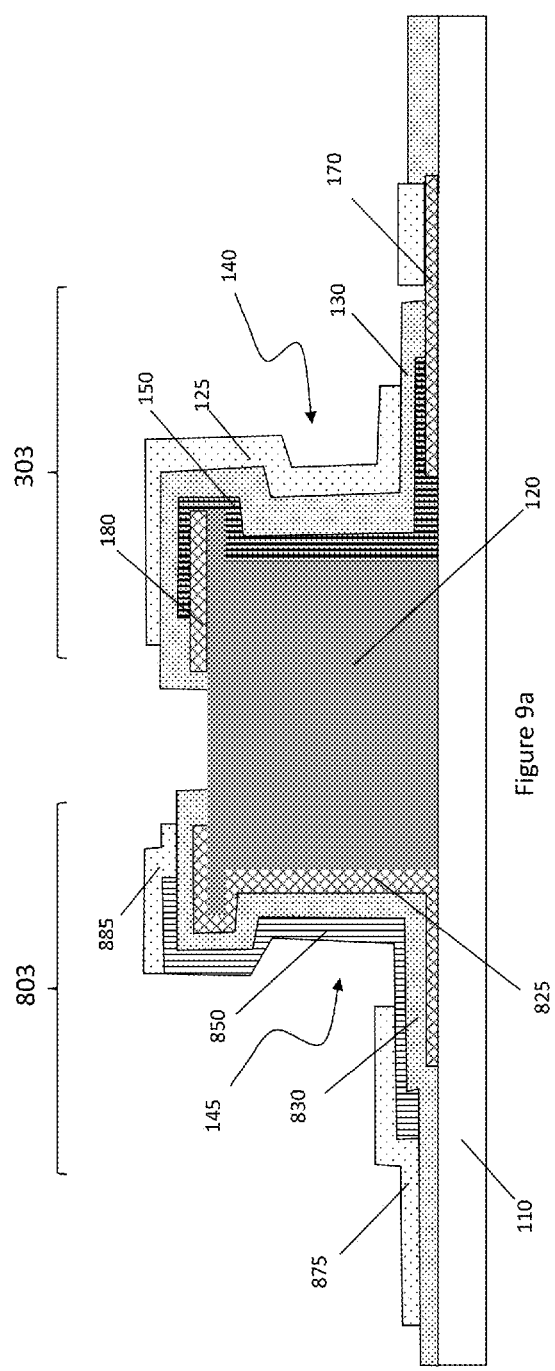
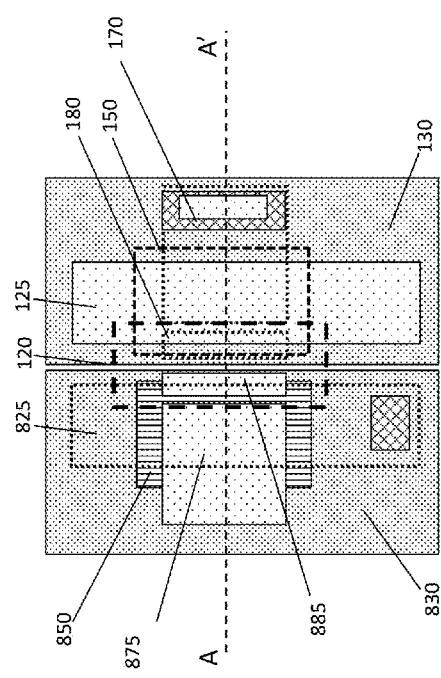
Figure 9a
Figure 9b

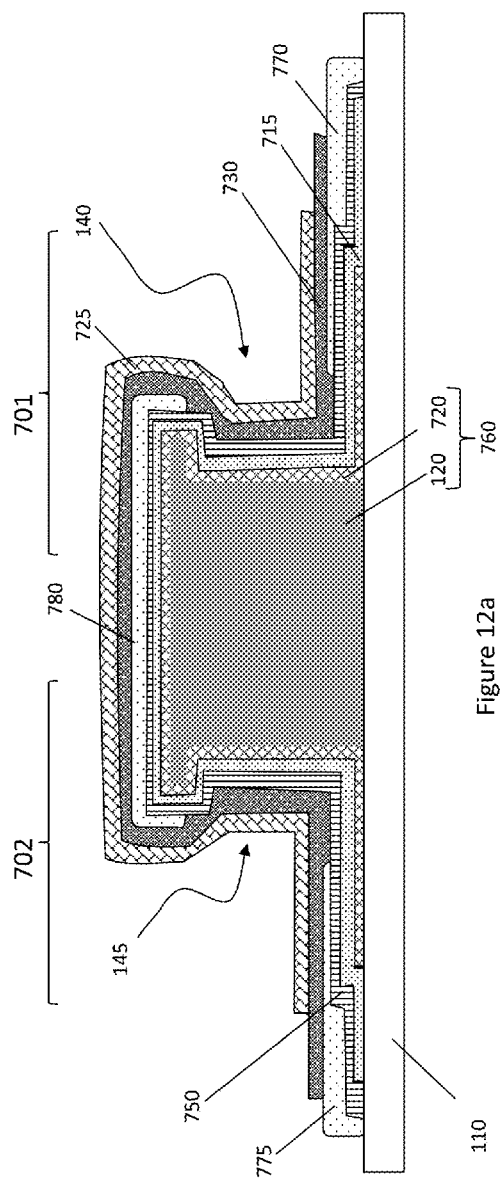
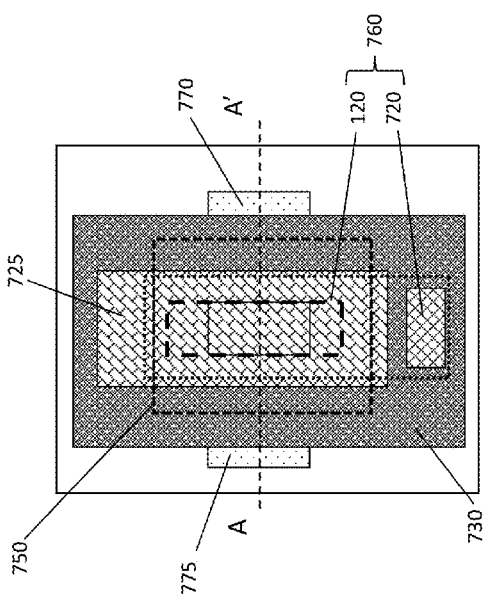

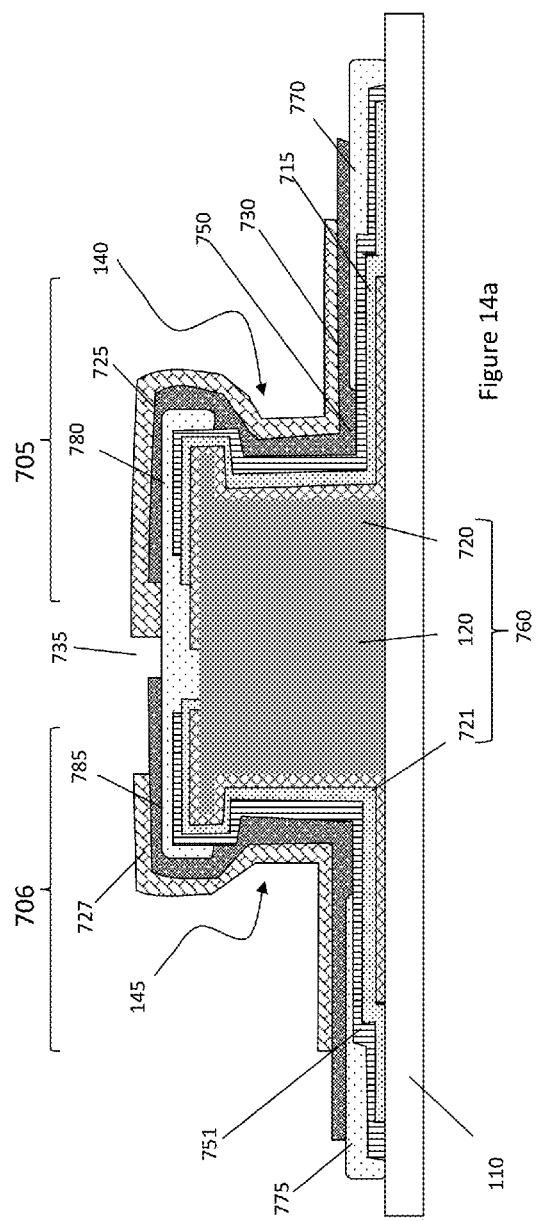
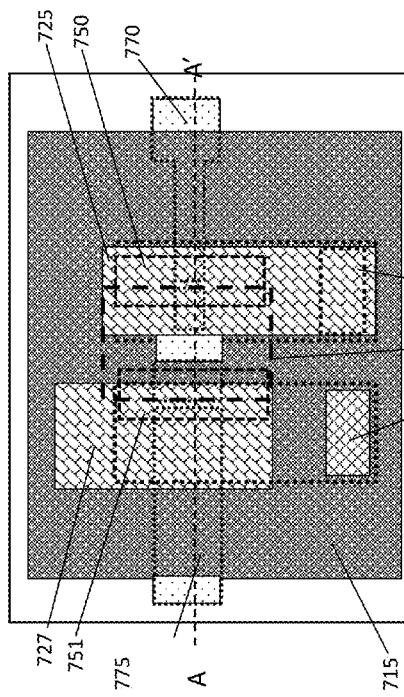
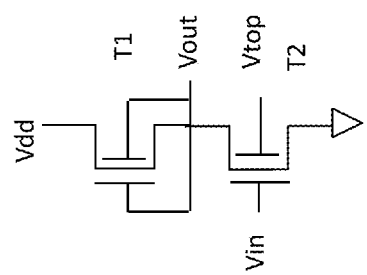
Figure 14a
Figure 14b
Figure 14c

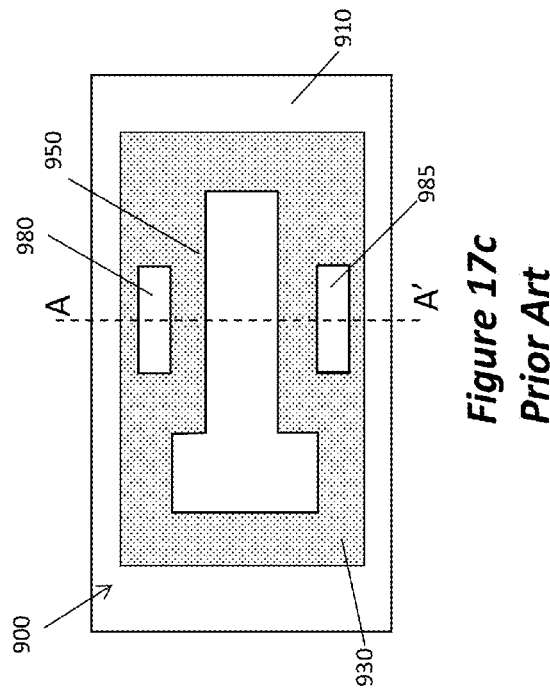
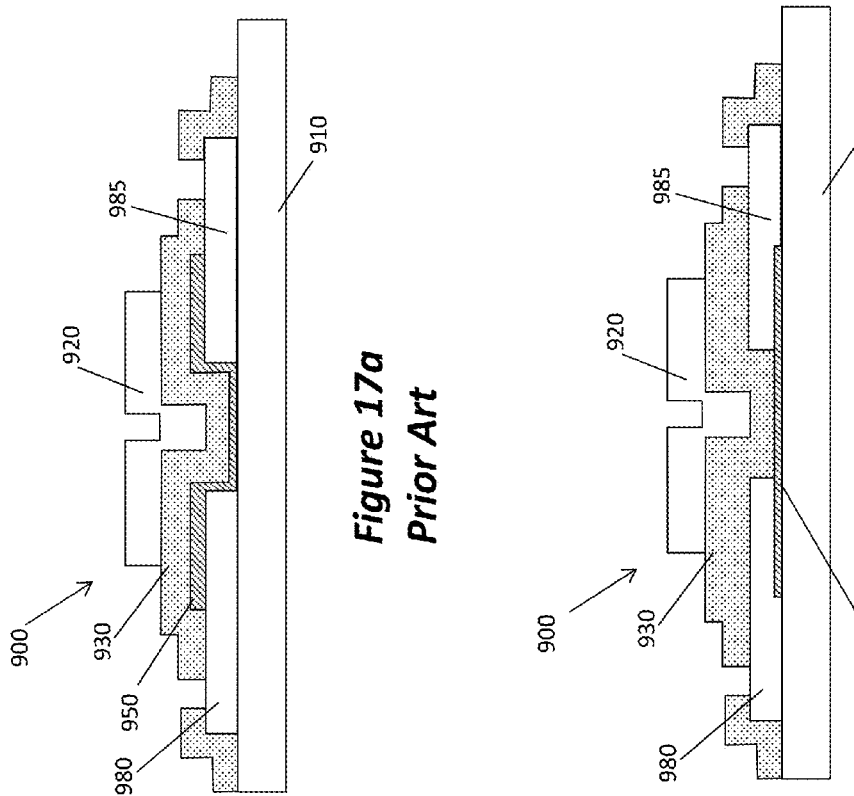
Figure 17a
Prior Art
Figure 17b
Prior Art
Figure 17c
Prior Art

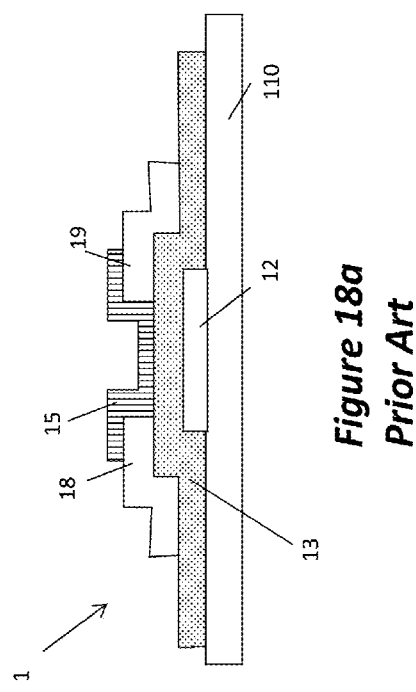
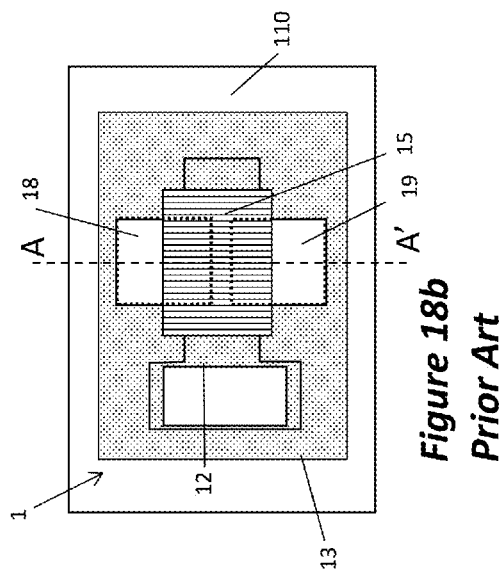
*Figure 18a*
*Prior Art*
*Figure 18b*
*Prior Art*
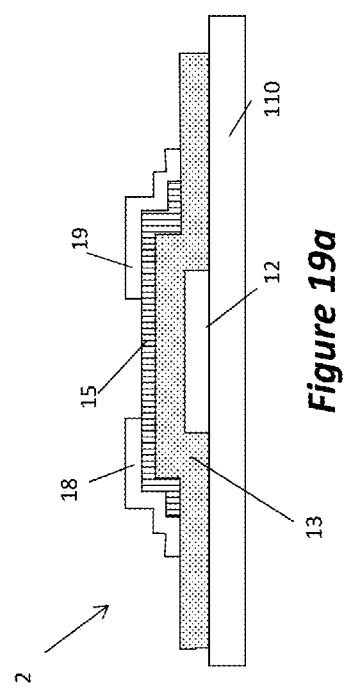
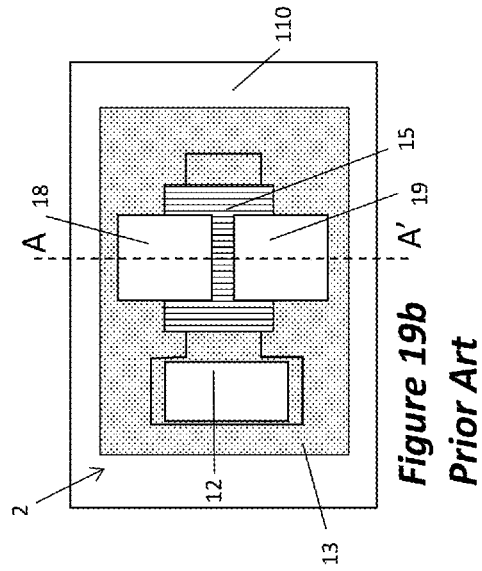
*Figure 19a*
*Figure 19b*
*Prior Art*

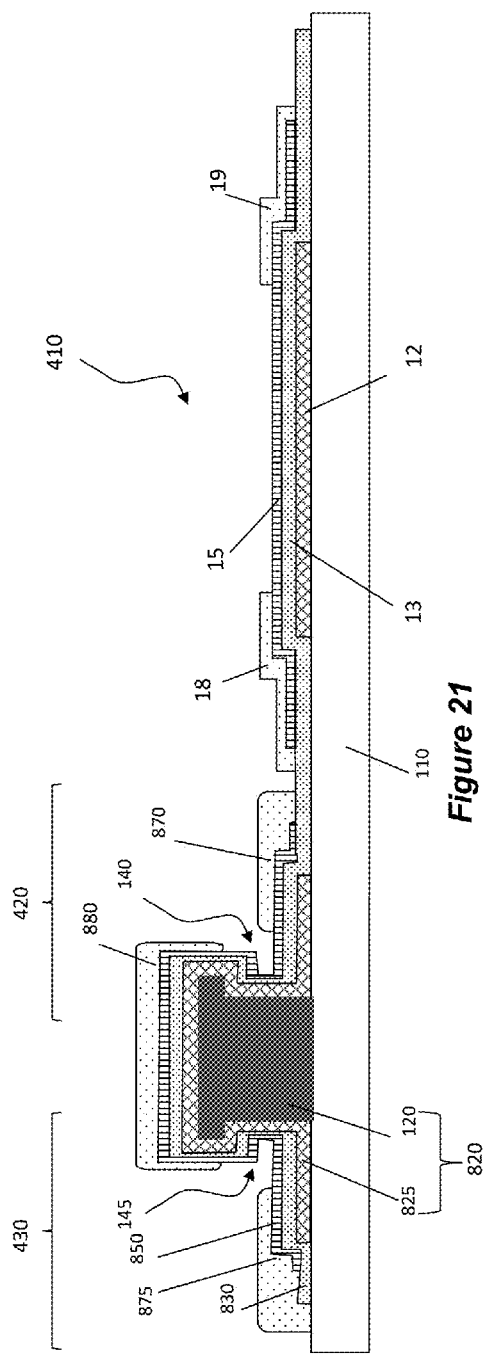
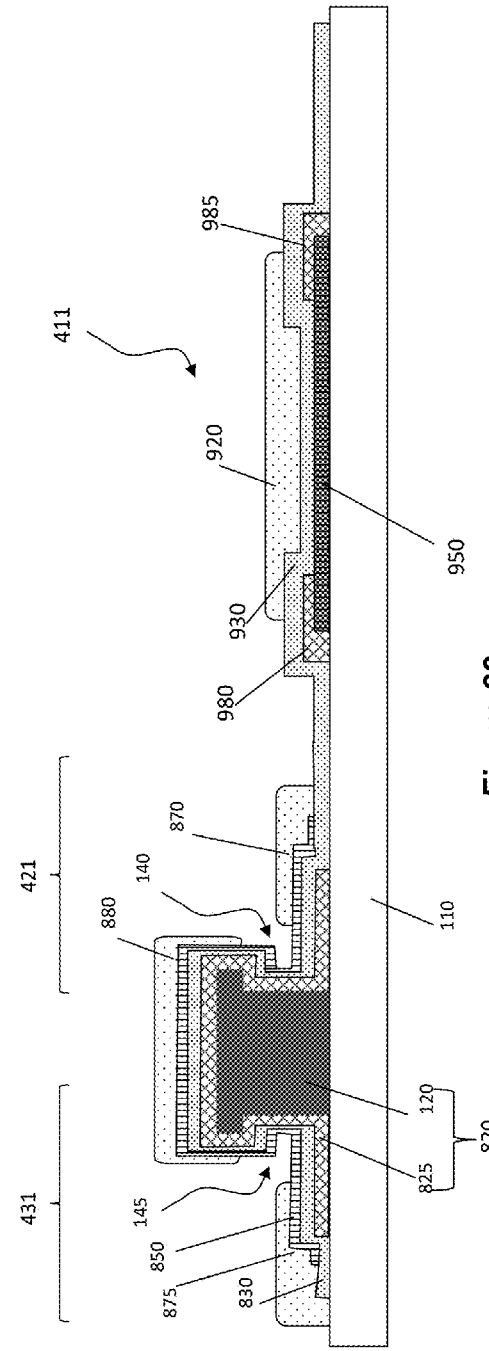

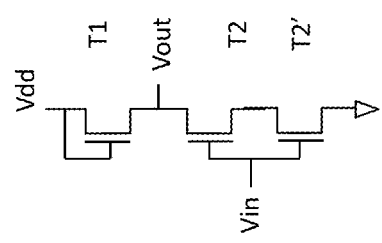
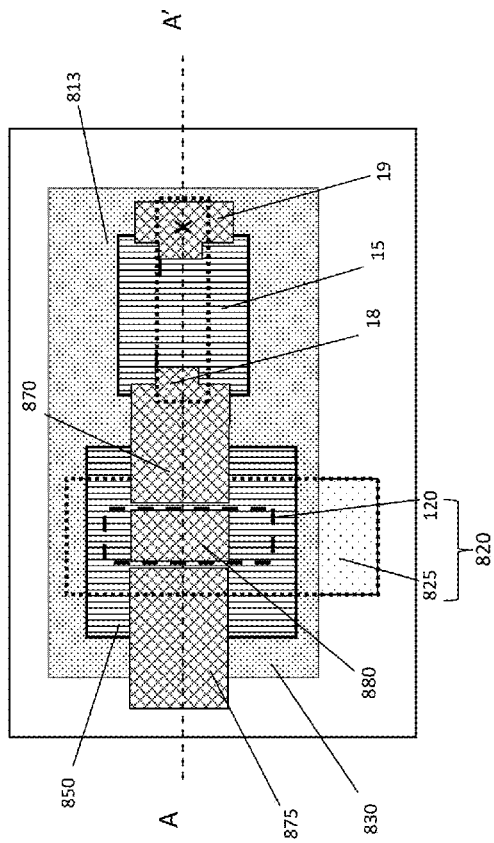
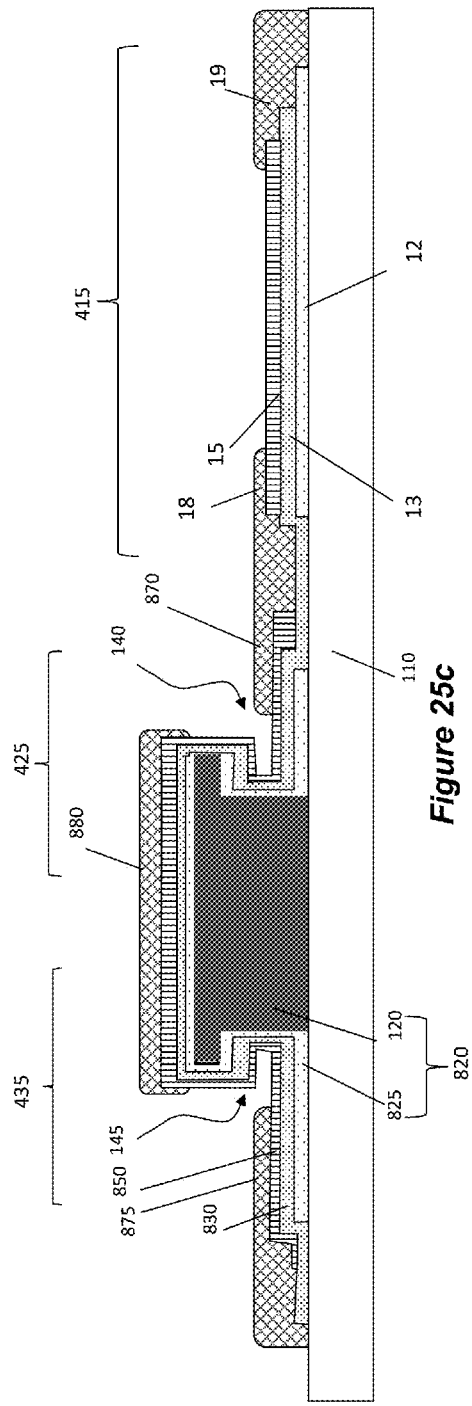
*Figure 25a*
*Figure 25b*
*Figure 25c*

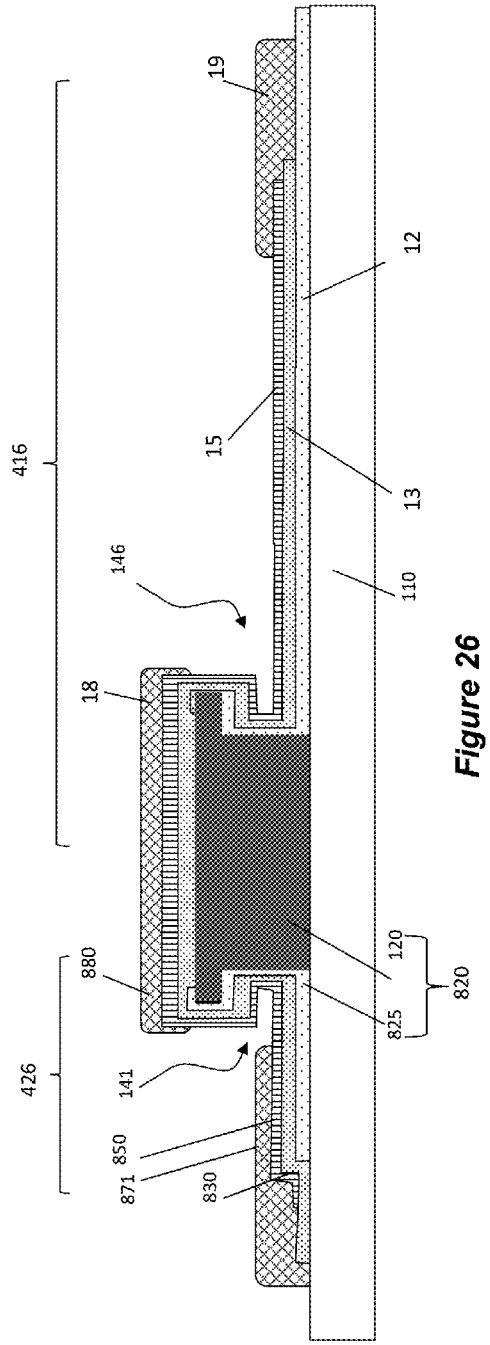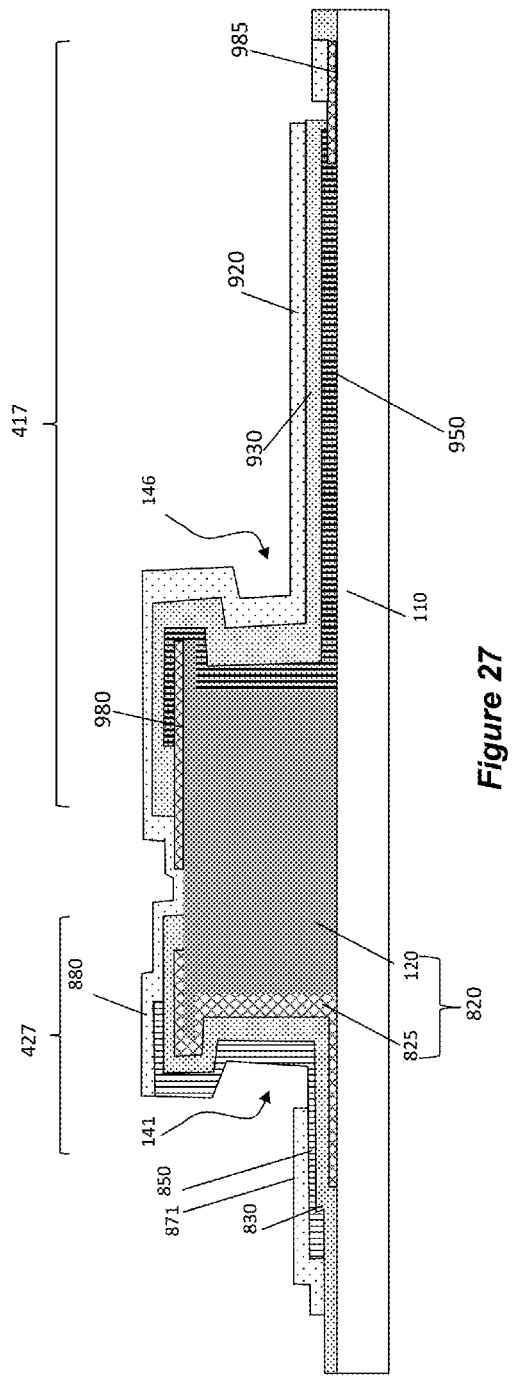

BOTTOM-GATE AND TOP-GATE VTFTS ON COMMON STRUCTURE

Reference is made to commonly-assigned, U.S. patent application Ser. No. 14/737,544, entitled "VERTICAL AND PLANAR TFTS ON COMMON SUBSTRATE", Ser. No. 14/737,549 (now U.S. Pat. No. 9,401,430), entitled "VTFT WITH A TOP-GATE STRUCTURE", Ser. No. 14/737,577, entitled "DUAL-GATE VTFT, all filed Jun. 12, 2015.

FIELD OF THE INVENTION

This invention relates generally to semiconductor devices and in particular to transistor devices.

BACKGROUND OF THE INVENTION

Modern-day electronics systems require multiple patterned layers of electrically or optically active materials, sometimes over a relatively large substrate. Electronics such as radio frequency identification (RFID) tags, photovoltaics, and optical and chemical sensors all require some level of patterning in their electronic circuitry. Flat panel displays, such as liquid crystal displays or electroluminescent displays rely upon accurately patterned sequential layers to form thin film components of the backplane. These electronic components include capacitors, transistors, and power buses. The usual combination of photolithographic patterning methods and selective etch processes has several shortcomings including high cost, difficulty with large substrates, and complexity of selective etch processes.

The feature size obtainable using traditional processing methods is limited by the resolution of the photolithography tools. Currently the minimum feature size for large area display backplanes is around a micron, and requires expensive high end equipment. Minimum feature sizes for large area substrates with less expensive equipment can be much larger. High speed circuit operation requires thin film transistors (TFTs) with high drive current, and many applications additionally require that the drive current be obtained with low voltage operation. It is well known that TFT performance is improved by reducing the channel length. To move beyond the exposure limitation of feature size, vertical transistors of various architectures are currently being studied. In a vertical TFT (VTFT) architecture, the channel is formed perpendicular to the substrate, and therefore the channel length (L) can be controlled by the height of a layer in the transistor.

Recent work in the fabrication of VTFTs, while yielding short channel length devices, has used otherwise standard photolithographic techniques with complex semiconductor processes. For example, since it is not currently possible to put patterns directly on walls which are vertical with respect to the substrate surface, vertical wall patterning has been accomplished using a suitable temporary filler material to partially fill in a trench. The temporary filler material acts as a mask for the portions of the wall located underneath while allowing for processing of the walls above the temporary filler material. This has been used, for example, when an oxide is to be deposited exclusively on vertical walls below a temporary filler material, where the oxide is first deposited or produced over the entire surface of the relief. The relief or trench is initially completely filled with a suitable temporary filler material. Then, the temporary filler material is recessed back to a depth that just covers the desired oxide. After uncovered sections of the oxide are removed, the remaining temporary filler material is removed.

Alternatively, when it is necessary that an oxide be deposited or produced only in upper regions of a vertical wall, an etching stop layer, for example a nitride layer, is first provided over the entire surface of the entire relief pattern. A different material, susceptible to directional etching, for example polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and then the removal of the etching stop layer.

In light of the complicated existing processes there is an ongoing need to provide semiconductor device architectures that include patterned vertical or inclined device surfaces. There is also an ongoing need to provide simple manufacturing techniques capable of processing small device features of semiconductor devices without requiring high resolution alignments and small gap printing for vertical TFTs. There is also an ongoing need to provide higher current semiconductor devices by improving the series resistance of the device.

To maintain good device performance when shrinking the size of the channel, it is typical to scale the layer thicknesses with the size of the device. For example, conventional production CMOS processes with channel lengths of 90 nm and lower often utilize dielectric layer thicknesses of less than 10 nm. While there are many processes to deposit dielectric materials, few result in high quality films at these thicknesses. Atomic layer deposition (ALD) is a process that is both conformal and known to result in high quality thin layers when used with optimized process conditions.

There is growing interest in combining ALD with a technology known as selective area deposition (SAD). As the name implies, selective area deposition involves treating portion(s) of a substrate such that a material is deposited only in those areas that are desired, or selected. Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch.

SAD work to date has focused on the problem of patterning a single material during deposition. There persists a problem of combining multiple SAD steps to form working devices. Processes for building complete devices need to be able to control the properties of the critical interfaces, particularly in field effect devices like TFTs. There remains a need for novel processes to simplify the manufacture of vertical TFTs, as well as a need for novel processes that use SAD and digital patterning processes to pattern devices which have critical vertical features, such as VTFTs.

A particularly useful electronic device in building functional circuitry is an inverter, which functions to invert the polarity of an input signal. In CMOS circuitry, inverters are typically easy to design but disadvantageously expensive to produce and utilize complicated production processes. It is possible to build all NMOS or PMOS inverters. However, particularly for enhancement-depletion mode circuits there are challenges to independently controlling the behavior of each transistor in the inverter circuit. Typically, the depletion mode transistor will have a thicker semiconductor layer than the enhancement mode transistor, increasing process complexity and increasing cost. Other alternatives include using dual gate architectures or multilayer semiconductor stacks, which have similar issues of process complexity and cost. As the industry endeavors to build circuitry using printing methods, individual transistor size has a direct impact on the overall circuit footprint, as the individual component transistors are sized using their channel dimensions. There remains a need to build high quality inverters using simple processes, by employing novel architectures to control individual transistor, and therefore, circuit performance.

More generally, there is a need in the industry to have a flexible process that enables facile fabrication of the components of any electronic circuit. Processes required to form short channel devices have previously been incompatible with processes used to form longer channel devices. There is a need to be able to mix and match components for the best circuit design—rather than being limited by the capabilities of conventional processes.

SUMMARY OF THE INVENTION

According to an aspect of the invention, an electronic device includes a substrate, and a vertical-support-element located on the substrate, the vertical-support-element extending away from the substrate, the vertical-support-element including a first edge having a first reentrant profile and a second edge having a second reentrant profile. A first conformal semiconductor layer is in contact with the vertical-support-element in the first reentrant profile. There is a first electrode located in contact with a first portion of the first conformal semiconductor layer over the top of the vertical-support-element and a second electrode located in contact with a second portion of the first conformal semiconductor layer over the substrate and not over the vertical-support-element, and adjacent to the first edge of the vertical-support-element. A first conformal dielectric layer is on the first semiconductor layer in the first reentrant profile, and a conformal conductive top-gate is on the first conformal dielectric layer in the first reentrant profile. A conformal conductive bottom-gate is in the second reentrant profile and in contact with the VTFT structure. A second conformal dielectric layer is in the second reentrant profile and in contact with the conformal conductive bottom gate. There is a second conformal semiconductor layer in the second reentrant profile and in contact with the second conformal dielectric layer. A third electrode is located over the substrate and not over the vertical-support-element, and adjacent to the second edge, the third electrode in contact with the second semiconductor layer, and a fourth electrode is located over the top of the vertical-support-element and in contact with the second semiconductor layer. The first electrode and the second electrode define a first semiconductor channel of a top-gate transistor, and the third electrode and the fourth electrode define a second semiconductor channel of a bottom-gate transistor.

BRIEF DESCRIPTION OF THE DRAWINGS

In the detailed description of the example embodiments of the invention presented below, reference is made to the accompanying drawings, in which:

FIGS. 1a and 1b are a cross-sectional view and plan view, respectively, of one embodiment of the top-gate vertical transistor of the present invention;

FIGS. 2a through 2d are cross-sectional views of alternative embodiments of the top-gate vertical transistor of the present invention;

FIGS. 3a through 3c are schematic cross-sectional views of alternative vertical-support-elements of the present invention having reentrant profiles;

FIGS. 4a through 4f are various examples of vertical-support-elements having reentrant profiles formed using a post and cap;

FIGS. 5a and 5b are a cross-sectional view and plan view, respectively, of another embodiment of the top-gate vertical transistor of the present invention with lower overlap capacitance;

FIGS. 6a and 6b are a cross-sectional view and plan view, respectively, of two independently operable top-gate vertical transistors on the same vertical-support-element of the present invention;

FIGS. 7a and 7b are a cross-sectional view and plan view, respectively, of another embodiment of a single top-gate vertical transistor on a vertical-support-element of the present invention;

FIGS. 8a and 8b are a cross-sectional view and plan view, respectively, of a bottom-gate transistor on a vertical-support-element;

FIGS. 9a and 9b are a cross-sectional view and plan view, respectively, of a top-gate vertical transistor and a bottom-gate transistor on the same vertical-support-element of the present invention;

FIGS. 10b and 10c are a cross-sectional view and plan view, respectively, of a top-gate vertical transistor and a bottom-gate transistor on the same vertical-support-element operable as an enhancement-depletion mode inverter having the equivalent circuit of FIG. 10a;

FIGS. 12a and 12b are a cross-sectional view and plan view, respectively, of two dual-gate vertical transistors on the same vertical-support-element of the present invention;

FIGS. 14a and 14c are a cross-sectional view and plan view, respectively, of two dual-gate vertical transistors on the same vertical-support-element operable as an inverter having the equivalent circuit of FIG. 14b;

FIG. 14b is a schematic diagram of the equivalent circuit of the dual-gate transistors shown in FIGS. 14a and 14c;

FIG. 15b is a cross-sectional view of two bottom-gate vertical transistors on the same vertical-support-element operable as an all-enhancement-mode inverter having the equivalent circuit of FIG. 15a;

FIGS. 17a and 17b are cross-sectional views corresponding to the plan view shown in FIG. 17c of a typical prior art top-gate planar TFT;

FIG. 17c is a plan view of a typical prior art top-gate planar TFT shown in FIGS. 17a and 17b;

FIG. 18a is a cross-sectional view corresponding to the plan view shown in FIG. 18b of a typical prior art bottom-gate planar TFT with coplanar contacts;

FIG. 19a is a cross-sectional view of the plan view shown in FIG. 19b of a typical prior art bottom-gate planar TFT with staggered contacts;

FIG. 21 is a cross-sectional view of an electronic element of the present invention with a bottom-gate VTFT and a bottom-gate planar TFT on a common substrate having the same material layers;

FIG. 22 is a cross-sectional view of an electronic element of the present invention with a bottom-gate VTFT and a top-gate planar TFT on the same substrate;

FIG. 25a is a schematic diagram of a circuit;

FIGS. 25b and 25c are a plan view and cross-sectional view, respectively, of a bottom-gate vertical transistor and a planar bottom-gate TFT configured to be operable as an all-enhancement-mode inverter having the equivalent circuit of FIG. 25a;

FIG. 26 is cross-sectional view, respectively, of a bottom-gate vertical transistor and a planar bottom-gate TFT configured to be operable as an all-enhancement-mode inverter having the equivalent circuit of FIG. 15a;

FIG. 27 is cross-sectional view, respectively, of a top-gate vertical transistor and a bottom-gate transistor on the same vertical-support-element operable as an enhancement-depletion mode inverter having the equivalent circuit of FIG. 10a;

DETAILED DESCRIPTION OF THE INVENTION

Figure 10A:
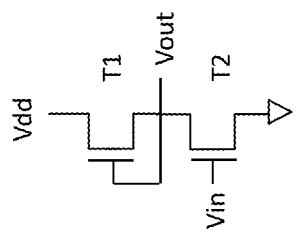
FIG. 10a is a schematic diagram of a circuit.

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the figures provided are not drawn to scale but are intended to show overall function and the structural arrangement of some embodiments of the present invention.

Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

For the description that follows, the term "gas" or "gaseous material" is used in a broad sense to encompass any of a range of vaporized or gaseous elements, compounds, or materials. Other terms used herein, such as: "reactant", "precursor", "vacuum", and "inert gas", for example, all have their conventional meanings as would be well understood by those skilled in the materials deposition art. The term "over" refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

The embodiments of the present invention relates to thin film transistors (TFTs) with different architectures and configurations, including variable dielectric layer thickness, that can all be formed on a common substrate. The ability to easily fabricate multiple types of transistors on a common substrate allows for freedom in circuit design. The ability to spatially control the dielectric layer thickness provides a means for adding extra protection against shorting, reduced capacitance, and the use of dielectric layer thickness to size the various TFTs in a circuit, in addition to the commonly used channel dimensions, width (W) and length (L). Two types of TFTs are useful in circuit design—enhancement-mode and depletion-mode devices. An enhancement-mode transistor is a transistor in which there is negligible off-current flow, relative to on-current flow, between a source and a drain at zero gate voltage; typically off-current values of metal oxide TFTs are less than $10^{-8}$ A, often as low as $10^{-11}$ A. In other words, the transistor device is normally off. In contrast, a depletion-mode transistor is normally on meaning that more than substantially negligible current flows between a source and a drain at zero gate voltage.

When the TFT operates in an enhancement-mode, the charges injected from the source electrode into the semiconductor are mobile and a current flows from source to drain, mainly in a thin channel region within about 100

Angstroms of the semiconductor-dielectric interface. See A. Dodabalapur, L. Torsi H. E. Katz, *Science* 1995, 268, 270, hereby incorporated by reference. In the absence of a gate field the channel ideally has few charge carriers; as a result there is ideally no source-drain conduction when the device is in off mode.

The off-current in an enhancement-mode device is defined as the current flowing between the source electrode and the drain electrode when charge has not been intentionally injected into the channel by the application of a gate voltage. This occurs for a gate-source voltage more negative, assuming an n-channel device, than a certain voltage known as the threshold voltage. See Sze in *Semiconductor Devices—Physics and Technology*, John Wiley & Sons (1981), pages 438-443, hereby incorporated by reference. The on-current is defined as the current flowing between the source electrode and the drain electrode when charge carriers have been accumulated intentionally in the channel by application of an appropriate voltage to the gate electrode and the channel is conducting. For an n-channel accumulation-mode TFT, this occurs at a gate-source voltage more positive than the threshold voltage. It is desirable for this threshold voltage to be slightly positive, for enhancement mode n-channel operation. Switching between on and off states is accomplished by the application and removal of an electric field from the gate electrode across the gate dielectric to the semiconductor-dielectric interface, effectively charging a capacitor.

Advantageous enhancement mode TFT device characteristics include a large ratio of the on-current to the off-current, and a steep sub-threshold slope. In the operation of such a TFT device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the zinc-oxide-based semiconductor TFT can be expressed by the approximate equation (see Sze in *Semiconductor Devices—Physics and Technology*, John Wiley & Sons (1981)):

$$I_d = \frac{W}{2L}\mu\, C_{ox}(V_g - V_{th})^2$$

where $I_d$ is the saturation source-drain current, $C_{ox}$ is the geometric gate capacitance associated with the insulating layer (dielectric layer), W and L are physical device dimensions, $\mu$ is the carrier mobility in the zinc-oxide-based semiconductor, $V_g$ is the applied gate voltage, and $V_{th}$ is the threshold voltage. Ideally, the TFT allows passage of current only when a gate voltage of appropriate polarity is applied. However, with zero gate voltage, the off current between source and drain depends on the intrinsic conductivity $\sigma$ of the zinc-oxide-based semiconductor as well as the state of the semiconductor back channel.

The term "vertical transistor" as used herein refers to transistors where the source and drain that define a single channel are at two different distances from the substrate surface (as measured orthogonal to the substrate). This arrangement results in vertical transistors where at least a portion of the channel is vertically oriented with respect to the substrate, which is to say not parallel to the top surface of the substrate. The vertical transistors of the present invention are vertical thin-film transistors, and are referred to by the acronym VTFT. Vertical transistors of the present invention include those with portions of their channels in an arrangement that is parallel to the substrate surface, as long as they also have a portion which is not parallel. The advantage of VTFTs in circuit design is their short channel lengths, typically much shorter than that is easily obtainable by techniques to form standard planar transistors.

As used herein, a long channel vertical transistor is a vertical transistor whose channel length is more typical of that of a planar and therefore long for a transistor having a vertical architecture. Long channel vertical transistors have source and drain electrodes that are at different distances from the substrate (making it a vertical transistor), but the majority of the semiconductor channel is parallel to the substrate. Long channel vertical transistors have advantages over both planar and vertical transistors in designs where the integration of short channel (typical VTFTs) and longer channel TFTs is desired. The ability to use a portion of the vertical-support-element in the longer channel vertical TFT construction allows for the reduction of circuit footprint over mixed vertical and true planar TFTs.

The term "planar transistor" as used herein refers to transistors where the source and drain electrodes which define a single channel are at the same distance from the substrate surface (as measured orthogonal to the substrate). This arrangement results in planar transistors where the channel is parallel to the substrate surface.

Transistors of the present invention are useful in building logic gates. The term "logic gate" has the commonly understood definition. Logic gates include the AND, OR, NOT, NAND, NOR, EXOR and EXNOR gates. A NOT gate is also called an inverter, and is referred to as such herein. Although the inverter is used as a representative logic gate to describe how the transistors geometries of the present invention can be useful in circuits, it should be understood that the transistor architectures of the present invention are equally useful in constructing other types of logic gates.

The particular process sequence for fabricating inorganic thin film transistors and electronic devices from semiconductor, dielectric, conductive materials is determined by the structure of the desired transistor. There are four primary useful structures for thin-film transistors. In the production of a field effect transistor in a so-called inverted structure, a gate electrode can be first deposited on a substrate, for example a vacuum- or solution-deposited metal or organic conductor, or an ALD-deposited conductor. The gate electrode is insulated with a dielectric (often referred to as the gate-dielectric), then source and drain electrodes and a layer of the inorganic semiconductor material are applied on top, such that the source and drain electrodes define the length of the channel in the transistor. The source and drain contact geometry is referred to as coplanar. Alternatively, in a second structure, a gate electrode is deposited first, followed by a gate-dielectric, the semiconductor is applied, and finally the contacts for the source electrode and drain electrode are deposited on the semiconductor layer, again defining the length of the channel in the transistor, and resulting in a staggered contact geometry. These transistors where the gate is between the channel in the semiconductor layer and the substrate, sometimes referred to as "inverted", are referred to as "bottom-gate" transistors herein.

In an alternative third structure, the source and drain electrodes are deposited first, then the semiconductor is deposited, and finally the dielectric and gate electrode are deposited on top—resulting in a staggered contact geometry. In an alternative fourth structure, the semiconductor is deposited first, prior to depositing the source and drain electrodes—resulting in a coplanar contact geometry. These transistors where the gate is in on the side of the semiconductor opposite the substrate, are referred to as "top-gate" transistors herein.

In most embodiments, a field effect transistor includes an insulating layer, a gate electrode, a semiconductor layer including an inorganic material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer and the source electrode and the drain electrode both contact the semiconductor layer. Both planar and vertical transistors can have bottom- or top-gate architectures, with staggered or coplanar contacts. In the case of a vertical top-gate transistor, the gate is on the side of the semiconductor opposite the vertical-support-element.

The vertical transistors of the present invention are formed using a vertical-support-element. As used herein, the vertical-support-element can be any structure which has a reentrant profile. The vertical-support-element can be uniform in material composition, or be formed of multiple materials. The vertical-support-element can also be referred to as a post, as long as the post has the required reentrant profile. The vertical-support-element can be formed using a post and cap, where the cap extends beyond the wall of the post to define the reentrant profile. The vertical-support-element has a height extending away from the substrate. Preferably, the height dimension of the vertical-support-element is less than 10 microns. U.S. application Ser. Nos. 14/198,628; 14/198,630; 14/198,631; 14/198,647; 14/198,652; 14/198,658; and 14/198,664, filed Mar. 6, 2014, are all related to devices containing and methods of forming vertical-support-elements using structural polymer posts with an inorganic thin-film cap and are hereby incorporated by reference. The vertical-support-element can be formed from any material, including both conductive and insulating materials. For vertical top-gate architectures it is preferred that the vertical-support-element be an insulating structure, that is to say formed from insulating or dielectric materials. An electrically conductive gate structure, as used herein, refers to the structure that contains the conductive material which will be used to gate the vertical transistor channel. In some embodiments, the electrically conductive gate structure includes a vertical-support-element and an electrically conductive gate layer.

The phrase "structural polymer" as used herein refers to the polymeric material used in the formation of the vertical-support-element, including the polymer post, and is additionally useful to distinguish the structural polymer material from other polymeric materials or polymer layers that may be used in the process. The structural polymer is a polymer that is stable in the final application, and a wide variety of structural polymers may be used. Illustrative of structural polymers are polyesters, polyetheresters, polyamides, polyesteramides, polyurethanes, polyimides, polyetherimides, polyureas, polyamideimides, polyphenyleneoxides, phenoxy resins, epoxy resins, polyolefins, polyacrylates, polyethylene-co-vinyl alcohols (EVOH), and the like or their combinations and blends. The preferred structural polymers are epoxy resins and polyimides. The structural polymer can be a thermoplastic polymer. The polymer can be a curable composition, including either thermal or radiation curable composition. The polymer does not need to be radiation curable or photosensitive, but photosensitive formulations are useful in the present invention so long as the final cured polymer layer has the structural and mechanical properties required in the final application.

Polyimide is a preferred structural polymer due to the combination of film properties such as low stress, low coefficient of thermal expansion, low moisture uptake, high modulus and good ductility for microelectronic applications. The rigid rod polyimide structure of Cured PI-2600 products available from Hitachi DuPont MicroSystems, for instance, are well suited for use as a dielectric layer for semiconductor applications. Epoxy resins are also preferred due to their thermal and chemical properties. Radiation curable compositions comprising a highly branched, multifunctional epoxy bisphenol A-novolac resin, such as Epon SU-8 from Momentive Specialty Chemicals Inc. is one example of a useful epoxy resin, although non-radiation curable compositions are more preferred.

The process of making the vertical thin film transistors of the present invention can be carried out below a support temperature of about 300° C., more preferably below 250° C., or even at temperatures around room temperature (about 25° C. to 70° C.). These temperatures are well below traditional integrated circuit and semiconductor processing temperatures, which enable the use of any of a variety of relatively inexpensive supports, such as flexible polymeric supports. Thus, embodiments of the invention enable production of relatively inexpensive devices on flexible substrates without the need for photolithography and enable rapid pattern changes due to printing the patterns.

The substrates used in the present invention can be any material that acts as a mechanical support for the subsequently coated layers. The substrate can include a rigid material such as glass, silicon, or metals. Particularly useful metals include stainless steel, steel, aluminum, nickel, and molybdenum. The substrate can also include a flexible material such as a polymer film or paper. Useful substrate materials include organic or inorganic materials. For example, the substrate can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 μm to about 1 cm.

A flexible support or substrate can be used in the present invention. Using a flexible substrate allows for roll processing, which can be continuous, providing economy of scale and economy of manufacturing relative to flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate any electric components such as thin film transistors. Nominally rigid materials that are flexible due to their thinness may also be used. These include glass at thicknesses below 200 μm and metals at thicknesses below 500 μm.

In some example embodiments, the substrate can include a temporary support or support material layer, for example, when additional structural support is desired for a temporary purpose, e.g., manufacturing, transport, testing, or storage. In these example embodiments, substrate can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The substrate can be bare indicating that it contains no substantial materials on its surface other the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The substrate can also include on its surface patterned materials. These patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

The thin-film transistors of the present invention are composed of dielectric, semiconductor and conductor materials. In preferred embodiments of the present invention the dielectric, semiconductor and conductor materials are inorganic thin films. A dielectric material is any material that is a poor conductor of electricity. Such materials typically exhibit a bulk resistivity greater than $10^{10}$ Ω-cm. Examples of dielectrics are $SiO_2$, HfO, ZrO, $Si_xN_y$, and $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, and gallium arsenide. Particularly preferred semiconductors are zinc oxide-based semiconductors including, zinc oxide, indium zinc oxide, and gallium indium zinc oxide. The semiconductors can be doped to render them n-type or p-type, or to modulate the number of charge carriers present. Conductors of the present invention include metals, such as Al, Ag, Au, Cr, Mo, or In and inorganic conducting oxides, such as indium doped tin oxide (ITO) or aluminum-doped zinc oxide (AZO).

The dielectric and semiconductor inorganic materials layers of the present invention are conformal, and are preferably deposited using an atomic layer deposition (ALD) process. ALD is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed from the vacuum chamber. A second precursor is then applied to react with the first precursor on the substrate. The excess of the second precursor is removed from the vacuum chamber and the process is repeated.

Recently, a new ALD process called spatial atomic layer deposition has been developed which negates the need for a vacuum chamber. This process, commonly referred to as S-ALD or SALD, is described in at least one of U.S. Pat. No. 7,413,982, U.S. Pat. No. 7,456,429, U.S. Pat. No. 7,789,961, and US 2009/0130858, the disclosures of which are incorporated by reference herein. SALD produces coatings with thicknesses that can be considered consistent, uniform, or even exact. SALD produces coatings that can be considered conformal or even highly conformal material layers. SALD is also compatible with a low temperature coating environment. Additionally, SALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, SALD is well suited for manufacturing the present invention.

The preferred process of the present invention employs SALD, a continuous spatially dependent ALD (as opposed to pulsed or time dependent ALD). The process of the present invention allows operation at atmospheric or near-atmospheric pressures and is capable of operating in an unsealed or open-air environment. The process of the present invention is adapted such that material is deposited only in selected areas of a substrate.

Atomic layer deposition can be used in embodiments of the present invention to deposit a variety of inorganic thin films that are metals or that comprise a metal-containing compound. Such metal-containing compounds include, for example (with respect to the Periodic Table) a Group V or Group VI anion. Such metal-containing compounds can, for example, include oxides, nitrides, sulfides or phosphides of zinc, aluminum, titanium, hafnium, zirconium or indium, or combinations thereof.

Oxides that can be made using the process of the present invention include, but are not limited to: zinc oxide (ZnO), aluminum oxide ($Al_2O_3$), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, $Mg_xZn_{1-x}O$, and LiZnO.

Metals that can be made using the process of the present invention include, but are not limited to: copper, tungsten, aluminum, nickel, ruthenium, and rhodium. It will be apparent to the skilled artisan that alloys of two, three, or more metals can be deposited, compounds may be deposited with two, three, or more constituents, and such things as graded films and nano-laminates can be produced as well.

The embodiments of the present invention all relate to thin film inorganic materials and devices that contain them. Example embodiments of the present invention use selective area deposition (SAD) in combination with atomic layer deposition (ALD). SAD employs a patterned material referred to as a "deposition inhibitor material", "deposition inhibiting material", or simply an "inhibitor" that inhibits the growth of a thin film material on the substrate when the substrate is subjected to an atomic layer deposition. There have been previous studies on using a selective area to generally pattern ALD coatings and more specifically to pattern a semiconductor layer. For example, Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. The use of SAD to pattern multilayer dielectric layers for use in electronic devices has been reported in at least one of U.S. Publication No. 2014/0065838, US Publication No. 2014/0061869, U.S. Pat. No. 8,927,434, U.S. Pat. No. 8,791,023, U.S. Pat. No. 8,846,545, US Publication No. 2014/0061795, US Publication No. 2014/0061648 and U.S. Pat. No. 8,653,516, the disclosures of which are incorporated by reference herein.

By inhibiting the growth where the deposition material is present, the deposition only deposits in regions (selective areas) of the substrate where the inhibitor is not present. The phrase "deposition inhibitor material" and its equivalents refer herein to any material on the substrate that inhibits the deposition of material during atomic layer deposition (ALD). The "deposition inhibitor material" includes the material applied to the substrate as well as the material resulting from any optionally subsequent crosslinking or other reaction that modifies the material that may occur prior to depositing an inorganic thin film on the substrate by atomic layer deposition. A polymeric deposition inhibitor material may be crosslinked after applying the polymer onto the substrate, before or during the patterning step.

The deposition inhibitor material can be a compound or polymer that, after being applied, is subsequently polymerized, crosslinked, or polymerized and crosslinked. The deposition inhibitor material can be a compound or polymer that forms a self-assembled monolayer on the substrate. Polymers are preferably addition polymers such as, for example, a poly(perfluoroalkyl methacrylate); poly(methyl methacrylate); poly(cyclohexyl methacrylate); poly(benzyl methacrylate); poly(iso-butylene); poly(9,9-dioctylfluorenyl-2,7-diyl); polystyrene; poly(vinyl alcohol); poly(hexafluorobutyl methacrylate), and copolymers thereof, wherein the alkyl has one to six carbon atoms.

Crosslinking can be used to insolubilize a polymeric deposition inhibitor material after application onto the surface of the substrate. The crosslinking can occur prior to patterning or can occur during patterning in order to contribute to the patterning step, for example, by employing crosslinking initiated by, and patterned by, actinic radiation, followed by removal of non-crosslinked polymer, for example, by solvent.

The deposition inhibiting material layer includes one of a self-assembled monolayer, a polymer, and a water-soluble polymer. The self-assembled monolayer can be performed by exposing the substrate to a vapor, a liquid, or a liquid solution of a precursor material. The polymer can be soluble in any convenient solvent and can have any useful molecular weight, preferably in the range of 2,000 to 2,000,000. It can include a single functional group, or may include a plurality of functional groups. In the case of a plurality of functional groups, the polymer can be a random, periodic, or block polymer. Polymers soluble in polar solvents such as water, alcohols, or ketones are particularly preferred. Polymers can include amide groups, such as poly(amide), poly(vinylpyrollidone), and poly(2-ethyl-oxazoline). Polymers may include ether linkages, such as poly(ethylene glycol). Polymers can include alcohol functionalities, such as poly(vinyl alcohol). Polymers can include neutralized acid groups such as sodium poly(styrene sulfonate) and the sodium salt of poly(acrylic acid).

In some embodiments, the deposition inhibitor material is chosen specifically for the material to be deposited. The deposition inhibitor material has a given inhibition power. The inhibition power is defined as the layer thickness at or below which the deposition inhibitor material is effective. Preferably, the deposition inhibitor material, during use, exhibits an inhibition power of at least 50 Å, more preferably at least 100 Å, most preferably at least 300 Å. The deposition of the deposition inhibitor material can be in a patterned manner, such as using inkjet, flexography, gravure printing, microcontact printing, offset lithography, patch coating, screen printing, or transfer from a donor sheet. In alternative embodiments, a uniform layer of the deposition inhibitor material can be deposited and then patterned to form a patterned layer of the deposition inhibitor material. Preprocessing treatments for patterning the inhibitor include patterning of substrate prior to inhibitor application to modify the hydrophobicity, electric charge, absorption, or roughness of the substrate. Post processing treatments include light exposure, light exposure and subsequent liquid based development, and ablation.

Providing the patterned deposition inhibiting material layer on the substrate includes using at least one of an inkjet printing process, a flexographic printing process, a gravure printing process, and a photolithographic printing process. The active inhibiting material can be suspended or dissolved in a solvent or vehicle. The material can include surfactants, stabilizers, or viscosity modifiers. The printed material can be dried using natural convection, forced convection, or radiant heat. The material can be treated to change its morphology or chemical composition. A preferred chemical composition change is to crosslink the material. The change in morphology or chemical composition can be accomplished by exposure to a vapor phase or liquid phase reactant, or treatment with heat or light. Preferred processes include the crosslinking of material with ultra-violet (UV) light.

In some embodiments, the deposition inhibitor material can be used in the reentrant profile of the vertical-support-element to prevent the growth thin-film material inside the reentrant profile. Deposition inhibitor in the reentrant profile can be used to pattern a conformal conductive layer, such as a conductive metal oxide, the resulting in two vertically spaced apart electrodes. US application Ser. Nos. 14/198, 621; 14/198,623; 14/198,636; and 14/198,643, filed Mar. 6, 2014, describe the formation of vertical transistors using selective area deposition to define the source and drain, and are hereby incorporated by reference. As described, the deposition inhibitor can be patterned via exposure (photolithographically), or by printing. When the deposition inhibitor is applied via printing, patterns can be designed such that the inhibitor wicks (moves by capillary action) along the reentrant profile of the vertical-support-element. Previously incorporated U.S. application Ser. No. 14/198,628 filed Mar. 6, 2014 describes the use selective area deposition to form vertically separated electrodes over an insulating vertical-support-element formed from a structural polymer post and an inorganic cap.

According to one embodiment of the present invention, an electronic device comprises a substrate and a vertical-support-element on the substrate. The vertical-support-element extends away from the substrate to a top and includes a first edge having a first reentrant profile. There is a conformal semiconductor layer in contact with the vertical-support-element in the reentrant profile, a first electrode located in contact with a first portion of the semiconductor layer over the top of the vertical-support-element, and a second electrode located in contact with a second portion of the semiconductor layer over the substrate and not over the vertical-support-element, and adjacent to the first edge of the vertical-support-element. There is a conformal insulating material layer on the semiconductor layer in the reentrant profile, and a conformal conductive gate on the conformal insulating material layer over the first edge of the vertical-support-element in the first reentrant profile. The first electrode and the second electrode define a transistor having a channel in the semiconductor layer between the first electrode and the second electrode.

Turning now to the Figures, a schematic cross-sectional view of vertical transistors 100 and 200 of the present invention is shown FIG. 1a, taken along the line A-A' of the plan view shown in FIG. 1b. The electronic device shown in FIG. 1a, has TFTs 100 and 200 on a substrate 110, where each TFT 100, 200 is a vertical transistor, where the vertical portion is defined by a vertical-support-element 120 (also sometimes called a post structure herein). The vertical-support-element 120 is on the substrate 110, and the vertical-support-element extends away from the substrate 110 to a top, the vertical-support-element including a first edge having a first reentrant profile 140. There is a conformal semiconductor layer 150 in contact with the vertical-support-element 120 in the reentrant profile 140, a first electrode 180 located in contact with a first portion of the semiconductor layer 150 over the top of the vertical-support-element 120 and a second electrode 170 located in contact with a second portion of the semiconductor layer 150 over the substrate 110 and not over the vertical-support-element 120, and adjacent to the first edge of the vertical-support-element. There is a dielectric layer 130 on the semiconductor layer 150 in the reentrant profile 140, and a conformal conductive gate 125 on the conformal insulating material layer 130 over the first edge of the vertical-support-element in the first reentrant profile 140. The first electrode 180 and the second electrode 170 define the vertical transistor 100 having a channel in the semiconductor layer 150 between the first electrode 180 and the second electrode 170.

Vertical transistors 100 and 200 are formed over a single post structure, and are connected in series, and as shown share a common gate. For simplicity, the following description will focus on top-gate vertical transistor 100 with the understanding that the descriptions apply equally to top-gate vertical transistor 200. Top-gate vertical transistor 100 includes a substrate 110. Substrate 110, often referred to as a support, can be rigid or flexible as described above. On substrate 110 is a vertical-support-element 120, the vertical-support-element 120 having a height dimension extending away from the substrate 110 to a top defined by a length dimension, and a width dimension, over the substrate 110, the vertical-support-element having edges along the height dimension. The top of the vertical-support-element 120, extends beyond the edges of the vertical-support-element 120 in at least the width dimension. As shown in FIG. 1a, the portion of the top of the vertical-support-element 120 which extends beyond the edges of the vertical-support-element 120 forms a first reentrant profile 140 and a second reentrant profile 145.

To better understand the requirements for the vertical-support-element 120, we will turn briefly to FIGS. 3a through 3c and FIGS. 4a through 4f. As shown in FIGS. 3a, 3b and 3c the vertical-support-element 120 can have any shape which has a height dimension 530a, 530b, 530c extending away from the substrate 110 to a top 535a, 535b, 535c. The vertical-support-element 120 also has edges along the height dimension, a first edge 510a, 510b, 510c including a first reentrant profile 540a, 540b, 540c and a second edge 520a, 520b, 520c opposite the first edge 510a, 510b, 510c and including a second reentrant profile 545a, 545b, 545c. The vertical-support-element 120 has a width at the top 500a, 500b, 500c, and a minimum width 505a, 505b, 505c between the top and the substrate that is smaller than the width of the top. The reentrant profile is defined as the profile of the vertical-support-element 120 that lies within the boundaries of the top of the vertical-support-element 120, the substrate 110, and a line drawn orthogonal to the substrate from the edge of the top (as shown by lines P-P' in FIGS. 3a, 3b and 3c). To aid in understanding, the first reentrant profile 340a, 340b, and 340c in each figure is shown in bold. Additionally, the vertical-support-element 120 can have portions that extend beyond the reentrant profile, as shown in FIG. 3c. The vertical-support-element 120 shown in these figures can be fully formed of insulating materials. In alternative embodiments for use in architectures requiring a bottom-gate, the vertical-support-element can be fully formed of conducting materials. FIGS. 3a, 3b and 3c illustrate reentrant profiles obtainable with either an electrically conductive core or insulating structural polymer core. It should be recognized that the first and second reentrant profiles shown in FIGS. 3a, 3b and 3c (540a, 540b, 540c and 545a, 545b, and 545c) are equivalent to the first and second reentrant profiles 140 and 145 of FIGS. 1a and 1b.

In some embodiments, the vertical-support-element 120 can be formed from a post and cap, preferably a structural polymer post and an inorganic cap. The range of useful variants of the reentrant profile formed with a post 20 and cap 30 can be better understood from FIGS. 4a through 4f which each contain a closer cross-sectional view of reentrant profile 140 of a vertical-support-element 120 that has been formed from a post 20 and cap 30. As shown, reentrant profile 140 can have any shape that as defined by the extension of a cap 30 beyond the edge of post 20. Preferably, the cap extends beyond the edge of the post by a distance that is less than the eight of the post. The reentrant profile 140 is defined as the profile that lies within the boundaries of the cap 30, the substrate 110 and a line drawn orthogonal to the substrate from the edge of the cap at the point of furthest extension (as shown by lines P-P' in FIGS. 4a through 4f). This is equivalent to the requirement illustrated in FIGS. 3a through 3d that the top of the vertical-support-element 120 extends beyond the base of the vertical-support-element. To aid in understanding, the first reentrant profile 140 in each figure is shown in bold. As shown, each reentrant profile has an associated depth, d, which is defined as the maximum extension of the cap from the post, measured parallel to the substrate. FIG. 4a illustrates a simplified profile, consistent with vertical-support-element 120 profile that is used to demonstrate the embodiments of the present invention. As shown in FIGS. 4d and 4f, the cap 30 can have a non-uniform edge profile. FIGS. 4b, 4c, and 4f are all embodiments where the edges of the post are not straight vertical edges orthogonal to the substrate; instead they can have any profile as long as the edge does not extend beyond the end of the cap.

Returning now to FIGS. 1a and 1b, there are three electrodes (180, 170, 175) that are the source and drain electrodes for top-gate VTFT 100 and 200. Source and drain have conventionally accepted meanings. For top-gate VTFT 100, either the first electrode 180 or the second electrode 170 can be designated the source (or drain) as is required by the application or circuit. The first electrode 180 and the second electrode 170 can include a conductive layer stack. The first electrode 180, second electrode 170 and third electrode 175 can be a single conductive material, as shown in FIG. 1a, or can comprise any number of conductive material layers. The first electrode 180 is located in contact with a first portion of the semiconductor layer 150 over the top of the vertical-support-element 120. The second electrode 170 electrode is located in contact with a second portion of the semiconductor layer 150 over the substrate 110 and not over the vertical-support-element 120. As shown in FIG. 1a, the first electrode can also be in contact with the top of the vertical-support-element. The first electrode 180 and second electrode 170 define a first semiconductor channel of top-gate VTFT 100, where semiconductor channel has the conventionally accepted meaning, and is in the semiconductor layer 150 between the first electrode 180 and second electrode 170.

The conformal semiconductor layer 150 conforms to the first reentrant profile 140 and second reentrant profile 145 of transistors 100 and 200 and maintains the shape, and is in contact with the vertical-support-element 120 in the reentrant profile 140. Semiconductor material layer 150 is a conformal semiconductor material layer. Preferably the semiconductor layer 150 is a thin film inorganic semiconductor material layer. The conformal dielectric layer 130 conforms to the reentrant profiles 140 and 145, and is in contact with the semiconductor layer 150. Dielectric layer 130 can be said to coat and maintain the reentrant profiles 140 and 145. The dielectric layer 130 is a conformal insulating material layer. Dielectric layer 130 is often referred to as a dielectric material layer, or an insulating layer, and can be formed of a single material layer or multiple dielectric material layers (multi-layer dielectric stack). Preferably the dielectric layer 130 is a thin film inorganic dielectric material layer.

The conductive conformal gate layer 125 is on the conformal dielectric layer 130 in the first reentrant profile 140. The conductive conformal gate layer 125 is on the side of the semiconductor layer 150 opposite the vertical-support-element 120, and can be said to be a top-gate. The conductive conformal gate layer 125 can be a single conductive material, as shown in FIG. 1a, or can comprise any number of conductive material layers. The conductive conformal gate layer is preferably a conductive metal oxide material.

As shown in FIG. 1a, the vertical TFT 100 is formed in series and shares a common gate with vertical TFT 200. In this configuration there are three electrodes including the shared first electrode 180 over the vertical-support-element 120, a second electrode 170 for TFT 100 not over the vertical-support-element 120, and a third electrode 175 for TFT 200 not over the vertical-support-element 120 (on the opposite side of vertical-support-element 120 from the second electrode 170 electrode of TFT 100). As shown, the vertical-support-element 120 has a second edge along the height dimension and the top of the vertical-support-element extends beyond the second edge to define a second reentrant profile 145. The third electrode 175 is located in contact with a third portion of the semiconductor layer 150 over the substrate 110 and not over the vertical-support-element 120, and adjacent to the second reentrant profile 145. The distance between the first electrode 180 and third electrode 175 is greater than zero when measured orthogonal to the substrate surface. The first electrode 180 and the third electrode 175 define a semiconductor channel of the second transistor 200.

The first electrode 180 and the second electrode 170 define the channel of the first VTFT 100, and the third electrode 175 and the first electrode 180 define the channel of the second VTFT 200. The configuration shown in FIGS. 1a and 1b allows contact to the vertical transistors 100 and 200 to be made on the substrate level so the transistors are operated in series, rather than making connection at the top of the vertical-support-element 120. It should be understood that the present invention includes a single vertical transistor where the electrodes are disposed as 170 and 180 in FIG. 1a.

As shown, the electrically conductive gate layer 125 functions as the gate for transistors 100 and 200. In some example embodiments of transistor 100, electrode 170 functions as the drain of transistor 100 and electrode 180 functions as the source of transistor 100. In other example embodiments of transistor 100, electrode 170 functions as the source and electrode 180 functions as the drain. The semiconductor device is actuated in the following manner. After transistor 100 is provided, a voltage is applied between the electrode 170 and the electrode 180. A voltage is also applied to the electrically conductive gate 125 to electrically connect the electrode 170 and the electrode 180.

Still referring to FIGS. 1a and 1b, vertical transistor 200 is formed at the same time as vertical transistor 100 is formed. Transistor 200 can be actuated in the following manner. A voltage is applied between the electrode 175 and the electrode 180, which is shared with vertical transistor 100. A voltage is applied to the gate layer 125, which is shared with vertical transistor 100, to electrically connect the electrode 175 and 180.

Alternatively, transistor 100 and transistor 200 can be actuated in series by applying a voltage between electrode 170 and electrode 175. A voltage is applied to the gate layer 125, which simultaneously electrically connects electrode 180 to electrode 170 and connects electrode 180 to electrode 175. This can be advantageous for circuit applications because external electrical connections do not need to be made to the elevated third electrode 180.

In other embodiments, the conductive layer can be patterned to independently gate transistor 100 and 200; in these embodiments gates 125 and 127 can be formed as shown in FIGS. 6a and 6b each being a separate region within a common conductive material layer.

The reentrant profile 140 of transistor 100 allows a dimension of the semiconductor channel of the transistor 100 to be associated with the thickness of the vertical-support-element 120, which is defined by the height of the vertical-support-element 120. Advantageously, this architecture of the present invention reduces reliance on high resolution or very fine alignment features during the manufacture of transistors that include short channels. Furthermore, the separation of the first electrode 180 and second electrode 170 is primarily determined by the reentrant profile 140 in the vertical-support-element 120. Additionally, the first electrode 180, second electrode 170 and the third electrode 175 are formed simultaneously and have the same material composition and layer thickness.

As shown in FIGS. 1a and 1b, the second electrode 170 and the third electrode 175 are located adjacent to the first and second reentrant profiles 140, 145, respectively. The second electrode 170 and the third electrode 175 are vertically spaced from the first electrode 180 due to the height of the vertical-support-element 120. The second electrode 170 and the first electrode 180 define a first channel having ends of the first transistor 100 and the third electrode 175 and the first electrode 180 define a second channel having ends of the second transistor 200. Stated another way, the distance between the first electrode 180 and second electrode 170 is greater than zero when measured orthogonal to the substrate surface. Together with the gate 125, dielectric layer 130, and semiconductor layer 150 define the first top-gate vertical transistor 100, including a portion of the channel which is vertical with respect to the substrate surface.

The transistor architecture shown in FIGS. 1a and 1b can be formed from various materials. The first electrode 180, second electrode 170, and third electrode 175 can be any conductive material, and in some embodiments are transparent conductive oxides. It is one advantage of the present invention that the vertical transistors can be fully transparent. It is also an advantage that all of the materials can be metal oxides that are deposited from a common piece of equipment. The inorganic material cap, the conformal conductive material gate layer, the conformal insulating material layer, the conformal semiconductor material layer, the first electrode, the second electrode, and the third electrode can each include a metal oxide. The vertical-support-element 120 can comprise a polyester, polyetherester, polyamide, polyesteramide, polyurethane, polyimide, polyetherimide, polyurea, polyamideimide, polyphenyleneoxide, phenoxy resin, epoxy resin, polyolefin, polyacrylate, polyethylene-co-vinyl alcohol, or a copolymer thereof, or a mixture thereof; preferably the vertical-support-element 120 comprises an epoxy resin or polyimide.

The vertical-support-element 120 can be used for various vertical transistor geometries, depending on the processing tools available. The schematic cross-sectional view of vertical top-gate transistors 102 and 202 of an embodiment of the present invention is shown FIG. 2a. The vertical transistors 102 and 202 are identical in components and operation to the vertical transistors 100 and 200 shown in FIG. 1a. The embodiment shown in FIG. 2a is representative of vertical transistors 102 and 202 formed by a line-of-sight deposition process for the first electrode 180, the second electrode 170 and the third electrode 175. Line-of-sight deposition processes include evaporation and sputtering. As shown, the first electrode 180 and the second electrode 170 are aligned near vertically. The first electrode 180 has an end (C2) and the second electrode 170 has an end (C2'), such that the end (C2) of the first electrode 180 and the end (C2') of the second electrode 170 are vertically aligned.

An alternative embodiment of the present invention is shown in the schematic cross-sectional view of vertical transistors 103 and 203 in FIG. 2b. The vertical transistors 103 and 203 are identical in components and operation to the vertical transistors 100 and 200 shown in FIG. 1a. The embodiment shown in FIG. 2b is representative of vertical transistors 103 and 203 formed by a selective area deposition (SAD) process where the first reentrant profile 140 and second reentrant profile 145 are filled with a deposition inhibitor by capillary action, and the first electrode 180, the second electrode 170 and the third electrode 175 are deposited using ALD. As shown, the first electrode 180 and the second electrode 170 are spaced further apart resulting in a longer channel length of the first transistor 103 than seen in the previous embodiments shown in FIG. 1a by transistor 100 and in FIG. 2a by transistor 102. As shown, a SAD process results in vertical transistors where a portion of the channel is vertically oriented with respect to the substrate as with the previous embodiments. As shown, vertical top-gate transistors 103 and 203 each have a portion of their channel that is parallel to the substrate surface in addition to the portion which is not parallel.

The wicking process used to form the vertical transistor of FIG. 2b typically results in the inhibitor wetting out of the reentrant profile onto the substrate. The channel defined by the first electrode 180 and the second electrode 170 preferably has a length dimension that is less than 10 times the height of the vertical-support-element 120. The use of a wicked deposition inhibitor also results in a transistor channel that has a length that varies along the width dimension, where the transistor width is into the page and the length is defined along the reentrant profile 140. The distance between C1 and C1' will vary along the width of the channel which is along the length of the vertical-support-element (into the page dimension) of the transistor 103. The channel defined by the first electrode 180 and the second electrode 175 has a width dimension and a length dimension, and the length dimension can vary along the width dimension of the transistor 103.

As shown in FIG. 2b, the second electrode 170 and the third electrode 175 are located adjacent to the first and second reentrant profiles 140, 145, respectively. A first line extending between the ends of the first channel is shown in FIG. 2b by line C1-C1'. A second line extending between the ends of the second channel is shown in FIG. 2b by line C3-C3'. As shown in FIG. 2b the first line C1-C1' is not parallel to the second line C3-C3'. Vertical transistors having this relationship between their channels cannot be formed over a broad areas by line-of-sight deposition techniques such as thermal evaporation of metals. In alternative embodiments, the lines can be diverging or converging.

FIGS. 2c and 2d are schematic cross-sectional views of an alternative embodiment of the present invention. In both FIGS. 2c and 2d the source and drain of VTFT 104, 105 electrodes make contact to the opposite side of the semiconductor layer than was shown in FIG. 1a, and have a top-gate coplanar geometry. As seen in FIG. 2c, the first electrode 180 is over the vertical-support-element 120 and in contact with the semiconductor layer 150. The second electrode 170 is adjacent to the first reentrant profile 140, and in contact with a second portion of the semiconductor layer 150 located over the substrate 110 and not over the vertical-support-element 120. The position of the electrodes and the semiconductor layer are a consequence of the fabrication process. As shown in FIG. 2c, the conformal semiconductor layer 150 was deposited prior to depositing the first and second electrodes 180, 170, and is in contact with the vertical-support-element 120.

The alternative embodiment shown in FIG. 2d illustrates the optional second conformal dielectric layer 115 covering the vertical-support-element 120 and at least a portion of the substrate 110. The conformal dielectric layer 115 is located at least between the semiconductor layer 150 and the vertical-support-element 120. As shown in FIG. 2d, TFTs 105 and 205 are a vertical transistors, where the vertical portion is defined by a vertical-support-element 120, which is covered by a conformal dielectric material layer 115. With the exception of the conformal dielectric material layer 115, the elements of the vertical thin film transistor 105 and 205 shown in FIG. 2d are the same as those for vertical thin film transistors 104 and 204 and should be understood from the description of FIG. 2c. The dielectric material layer 115 in this embodiment can be used to encapsulate the polymer post and cap used to form the vertical-support-element 120, and can provide a single material surface for building the vertical transistor of the present invention. The addition of dielectric material layer 115 can be used to avoid issues of non-uniform nucleation or thin film growth on the vertical-support-element 120 and substrate surfaces 110. Preferably the dielectric material layer 115 is an inorganic thin film dielectric material layer. The dielectric material layer 115 is a conformal layer, which is preferably deposited using ALD due to the conformal nature of the ALD process. As shown, the dielectric material layer 115 maintains the first and second reentrant profiles 140 and 145.

An alternative embodiment of the present invention is illustrated by the schematic cross-sectional view of vertical transistors 106 and 206 shown FIG. 5a, taken along the line A-A' of the plan view shown in FIG. 5b. This embodiment of the present invention has reduced overlap capacitance. As shown, the gate layer 125 is composed of two sections 125a and 125b which are in the reentrant profiles 140,145 defined by the vertical-support-element 120, but not over the top of the vertical-support-element 120. In this embodiment the two sections 125a and 125b are each confined to be within the dimensions of the first and second reentrant profiles 140 and 145, and do not extend beyond the dimensions of the top of the vertical-support-element 120. Thus the conformal conductive material gate layer 125 is only located in the first reentrant profile 140 and in the second reentrant profile 145 in the region of the channels. The two sections of the gate layer 125 can be connected to each other outside of the of the channel region, as illustrated in FIG. 5b. As shown, the two portions 125a and 125b of gate layer 125 physically and electrically connected forming a common gate for the vertical top-gate transistors 106, 206 that are in series, and are a variation of the embodiment shown in FIGS. 1a and 1b. The vertical transistors 106,206 having the gate layer 125 of FIGS. 5a and 5b, with two portions 125a and 125b, functions in the same manner as the vertical transistors 100 and 200 of FIGS. 1a and 1b. In alternative embodiments, the two portions of the gate can be patterned such that each TFT has an independently operable gate.

The schematic cross-sectional view of vertical transistors 107 and 207 shown FIG. 6a, taken along the line A-A' of the plan view shown in FIG. 6b is an embodiment of the present invention which results in two separate vertical top-gate transistors on opposite sides of the vertical-support-element 120, separated along the width of the vertical-support-element 120. In this embodiment the gate layer is patterned to be discontinuous, resulting in two separate patterned conductive conformal gates 125 and 127 for VTFTs 107 and 207 respectively. Similar to FIGS. 1a and 1b, the second electrode 170 and third electrode 175 are located adjacent to the first and second reentrant profiles 140, 145 respectively, on either side of vertical-support-element 120 and not over the top of the vertical-support-element 120. The first electrode 180 is over the vertical-support-element 120, and adjacent to the first reentrant profile 140. The first electrode 180 and the second electrode 170 define the semiconductor channel of the first VTFT 107. The fourth electrode 185 is over the vertical-support-element 120, and adjacent to the second reentrant profile 145. The fourth electrode 185 and the third electrode 175 define the semiconductor channel of the second VTFT 207. The second electrode 180 and the fourth electrode 185 are physically and electrically separate, such that the two separate vertical transistors 107 and 207 are independently operable and formed using a single vertical-support-element 120. As shown in FIGS. 6a and 6b, the semiconductor layer can be common, but patterned into two separate regions 150 and 155. In alternative embodiments, VTFT 107 and VTFT 207 can be formed with different semiconductor materials.

The schematic cross-sectional view of vertical top-gate transistor 108 is shown FIG. 7a, taken along the line A-A' of the plan view shown in FIG. 7b is an alternative embodiment of the present invention where a single VTFT is formed over the vertical-support-element 120. As shown in FIGS. 7a and 7b is a single vertical top-gate transistor 108 formed with reentrant profile 140. In this embodiment the gate layer is patterned to be in first reentrant profile 140, but not in the second reentrant profile 145. The source/drain electrode configuration for VTFT 108 is similar to VTFT 100, wherein the first electrode 181 is in contact with the semiconductor 150 over the top of the vertical-support-element 120. The second electrode 170 is located adjacent to the first reentrant profiles 140 and not over the top of the vertical-support-element 120. The first electrode 181 is over the vertical-support-element 120, and patterned such that it conformally coats the second reentrant profile 145. The first electrode 181 and the second electrode 170 define the semiconductor channel of the top-gate VTFT 108.

Bottom-gate transistors can also be formed over the vertical-support-element 120. Previously incorporated U.S. application Ser. No. 14/198,628, filed Mar. 6, 2014, describes bottom-gate vertical transistors formed over a polymer post with an inorganic cap. The combination of the polymer post and inorganic cap can be used to form the vertical-support-element 120 of the present invention, and should be understood from the previous description. FIG. 8a is a schematic cross-sectional view of bottom-gate vertical transistors 801 and 802, taken along the line A-A' of the plan view shown in FIG. 8b. As shown in FIG. 8a, TFTs 801 and 802 each have a vertical transistor structure, where the vertical portion is defined by the vertical-support-element 120. The gate layer 825 is in contact with at least the edge of the vertical-support-element 120, the dielectric layer 830 is in contact with the gate 825, and the semiconductor layer 850 is in contact with the first electrode 880. The vertical-support-element 120 and gate layer 825 form an electrically conductive gate structure 820 having a first reentrant profile 140 and a second reentrant profile 145.

Vertical transistors 801 and 802 have a common gate 825 and are connected in series and are formed over a single vertical-support-element 120. Vertical transistors 801 and 802 are the bottom-gate analogs of the top-gate vertical transistors 100 and 200 shown in FIGS. 1a and 1b. For simplicity, the following description will focus on vertical transistor 801 with the understanding that the descriptions apply equally to vertical transistor 802. Vertical transistor 801 includes a substrate 110 and a vertical-support-element 120, which should be understood from the previous descriptions. A conformal conductive layer forms the gate layer 825 on the edges of the vertical-support-element 120 in the reentrant profile and over at least a portion of the substrate 110 not over the VTFT structure 120. As shown in FIG. 8a, the gate layer 825 conformally covers the top and reentrant profiles 140, 145 of the vertical-support-element 120, and is also in contact with the substrate 110. The insulating layer 830 conforms to the reentrant profiles 140 and 145 of transistors 801 and 802. Insulating layer 830 can be said to coat and maintain the reentrant profiles 140 and 145, and is in contact with the gate layer 825. Dielectric layer 830 is a conformal insulating material layer. Semiconductor material layer 850 also conforms to the first reentrant profile 140 and second reentrant profile 145 of transistors 801 and 802 and maintains the shape, and is in contact with the insulator layer 830. Semiconductor material layer 850 is a conformal semiconductor material layer. The source and drain have conventionally accepted meanings, and either the first electrode 880 or the second electrode 870 can be designated the source (or drain) as is required by the application or circuit. The first electrode 880, second electrode 870 and third electrode 875 can be a single conductive material, as shown, or may comprise any number of conductive material layers. The first electrode 880 is located in contact with a first portion of the semiconductor layer 850 over the top of the vertical-supportelement 120. The second electrode 870 is located in contact with a second portion of the semiconductor layer 850 over the substrate 110 and not over the vertical-support-element 120, as shown in FIG. 8a. The first electrode 880 and second electrode 870 electrode define a first channel in the semiconductor layer between the first electrode 880 and second electrode 870. The elements of bottom-gate VTFT 801 are the same as the elements of the top-gate VTFTs discussed early, serve the same function with the arrangement being that of a bottom-gate rather than a top-gate VTFT. As shown, transistors 801 and 802 have a common gate and are formed in series, and their function should be understood from the description of transistors 100 and 200 of FIGS. 1a and 1b. From the description in the incorporated U.S. application Ser. No. 14/198,628, filed Mar. 6, 2014, it should also be understood that multiple variations of the bottom-gate VTFT formed over a vertical-support-structure are possible, including independently operable bottom-gate VTFTs formed over a single vertical-support-element. Additionally, although the electrically conductive gate structure 820 as shown in FIGS. 8a and 8b is illustrated as constructed from a vertical-support-element 120 and a separate conformal gate layer 825, in alternative embodiments electrically conductive gate structure 820 can be formed by a vertical-support-element 120 formed of conductive materials without the need for a separate gate layer 825.

Turning now to embodiments of the present invention having a bottom-gate and a top-gate vertical transistor formed over a common vertical-support-structure, transistors 803 and 303 are illustrated by the schematic cross-sectional view of FIG. 9a, taken along the line A-A' of the plan view shown in FIG. 9b. As shown, transistor 803 is a bottom-gate vertical transistor and transistor 303 is a top-gate vertical transistor, where both transistors are formed over a single vertical-support-element 120. The vertical-support-element 120 as shown in FIGS. 9a and 9b is an insulating structure, and the conductive layers are conformal and formed separately from the vertical-support-element 120. As shown, there is an electronic device that includes a substrate with a vertical-support-element 120 on the substrate. The vertical-support-element 120 extends away from the substrate 110 and includes a first edge having a first reentrant profile 140 and a second edge having a second reentrant profile 145. A top-gate vertical transistor 303 is formed using first reentrant profile 140. There is a first conformal semiconductor layer 150 in contact with the vertical-support-element 120 in the first reentrant profile 140. The source/drain electrodes of the top-gate VTFT 303 include a first electrode 180 located in contact with a first portion of the first conformal semiconductor layer 150 over the top of the vertical-support-element 120 and a second electrode 170 located in contact with a second portion of the first conformal semiconductor layer 150 over the substrate 110 and not over the vertical-support-element 120, and adjacent to the first edge of the vertical-support-element 120. The gate dielectric of the top-gate VTFT 303 is a first conformal dielectric layer 130 on the first semiconductor layer 150 in the first reentrant profile 140. There is a conformal conductive top-gate 125 on the first conformal dielectric layer 130 in the first reentrant profile 140.

Bottom-gate vertical transistor 803 is formed in the second reentrant profile 145 of vertical-support-element 120. There is a conformal conductive bottom-gate 825 in the second reentrant profile 145 and in contact with the vertical-support-element 120. A second conformal dielectric layer 830 is in the second reentrant profile 145 and in contact with the conformal conductive bottom gate 825. Over the second conformal dielectric layer 830, there is a second conformal semiconductor layer 850 in the second reentrant profile 145 and in contact with the second conformal dielectric layer 830. The source/drain electrodes of the bottom-gate VTFT 803 include a third electrode 875 located over the substrate 110 and not over the vertical-support-element 120, and adjacent to the second edge, the third electrode 875 being in contact with the second semiconductor layer 850, and a fourth electrode 885 located over the top of the vertical-support-element 120 and in contact with the second semiconductor layer 850. The first electrode 180 and the second electrode 170 define a first semiconductor channel of a top-gate vertical transistor 303, and the third electrode 875 and the fourth electrode 885 define a second semiconductor channel of a bottom-gate vertical transistor 803.

As illustrated in FIGS. 9a and 9b, transistors 303 and 803 are formed over a common vertical-support-element 120 and can be formed from common material layers. The elements of each transistor 303 and 803 are shaded as to illustrate which elements are part of a common material layer. As shown the first conformal top-gate layer 125 and the source/drain electrodes of the bottom-gate VTFT 803, third electrode 875 and fourth electrode 885, can be formed in a common material layer, although each is electrically distinct. Similarly, as shown the second conformal bottom-gate layer 825 and the source/drain electrodes of the top-gate VTFT 303, first electrode 180 and second electrode 175, can be formed in a common material layer. As shown the first conformal semiconductor layer 150 is a different material layer than the second conformal semiconductor layer 850. In some embodiments, the first semiconductor layer 150 and the second semiconductor layer 850 can be the same material. In preferred embodiments, transistors 303 and 803 are n-type transistors, more preferably, n-type metal oxide thin film transistors. In preferred embodiments, both the first semiconductor layer 150 and the second semiconductor layer 850 include a ZnO-based semiconductor. As shown, the first conformal dielectric layer 130 and the second conformal dielectric layer 830 are two separate portions of a common dielectric layer, and as such have the same material composition and thickness. Preferably, the dielectric material is an insulating metal oxide.

Selective area deposition can be advantageously used to pattern portions of layers in devices in which a conformal gate layer of one device and the source and drain electrodes of a second device are formed over the same vertical-support-element from a common material layer. In these embodiments, the conformal conductive top-gate, the third electrode, and the fourth electrode have the same material composition and thickness and are part of the same conductive material layer. Preferably, the conductive material composition includes a conductive metal oxide. The conductive material layer must be put down with a conformal deposition process, like ALD, in order to form the conformal gate. In order to pattern a conformal conductive material layer into separated source and drain electrodes on either side of a reentrant profile, a deposition inhibitor can be used to fill in the reentrant profile such that the conductive material is not deposited in the profile. There is no easy photo-lithographic lift-off or etching process that could yield the simultaneous creation of a conformal gate and separated source/drain electrodes over the same VTFT structure.

Figure 10B:
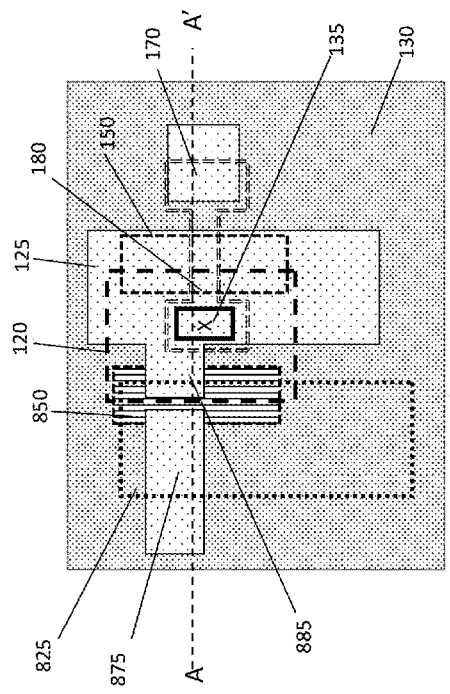
Figure 10C:
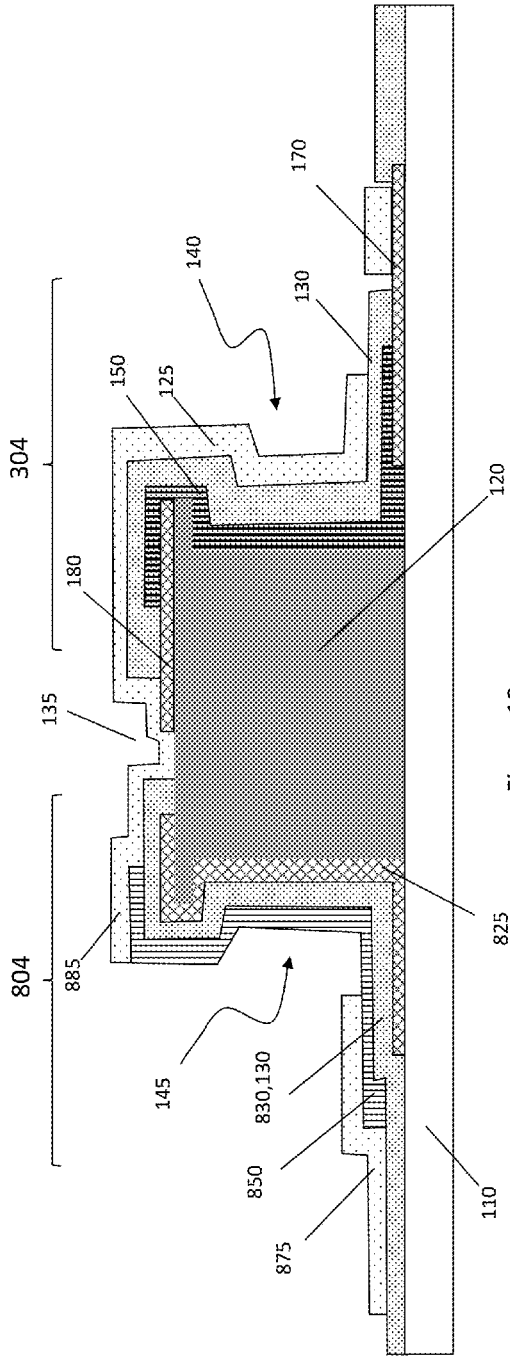

FIG. 10c is a schematic cross-sectional view of FIG. 10b, taken along the line A-A' of the plan view shown in FIG. 10b. As illustrated, bottom-gate VTFT 804 and top-gate VTFT 304 have the same elements as bottom-gate VTFT 803 and top-gate VTFT 303 discussed above with respect to FIGS. 9a and 9b. FIGS. 10a through 10c illustrate the embodiment where a bottom-gate VTFT 804 and top gate VTFT 304 are formed over the same vertical-support-element 120 and are connected to operate as an enhancement-depletion-mode inverter. The equivalent circuit for an enhancement-depletion-mode inverter is shown in FIG. 10a, where T1 is the load transistor and T2 is the drive transistor. In the configuration shown in illustrated in FIGS. 10a through 10c, the top-gate vertical transistor 304 is the load transistor, T1, and the bottom-gate vertical transistor 804 is the drive transistor, T2. The top-gate vertical transistor 304 illustrated in FIGS. 10a through 10c operates in a depletion-mode, while the bottom-gate VTFT 804 operates in an enhancement mode. As shown, bottom-gate VTFT 804 and top gate VTFT 304 share a common dielectric layer 130, with a portion 830 in the region of the channel of the bottom-gate VTFT 804. There is also a via 135 in dielectric layer 130 to allow for electrical connection between the first electrode 180 and the conformal top-gate 125. The conformal top-gate 125 is also extended over the top of the vertical-support-element 120 so as to connect to the fourth electrode 885. As shown in FIG. 10c, the fourth electrode 885 and the conformal top-gate 125 are formed from a single material pattern and layer, having the same material composition and layer thickness. As shown, there is also an optional via in dielectric layer 130 to allow to surface contact to the second electrode 170; the use of this and other vias will be dictated by the contact requirements of the circuitry. The remaining elements of the VTFTs 304, 804 of FIGS. 10a through 10c are equivalent to those described with respect to FIGS. 9a and 9b, and should be understood from the previous description. The specific layout of the inverter is shown in FIGS. 10b and 10c is chosen for simplicity of illustration. Many designs are possible and are within the scope of the current invention as long as they meet the requirements of having bottom-gate and a top-gate vertical transistors formed over a single vertical-support-element 120, and are properly connected as in the equivalent circuit diagram of FIG. 10a.

Figure 11:
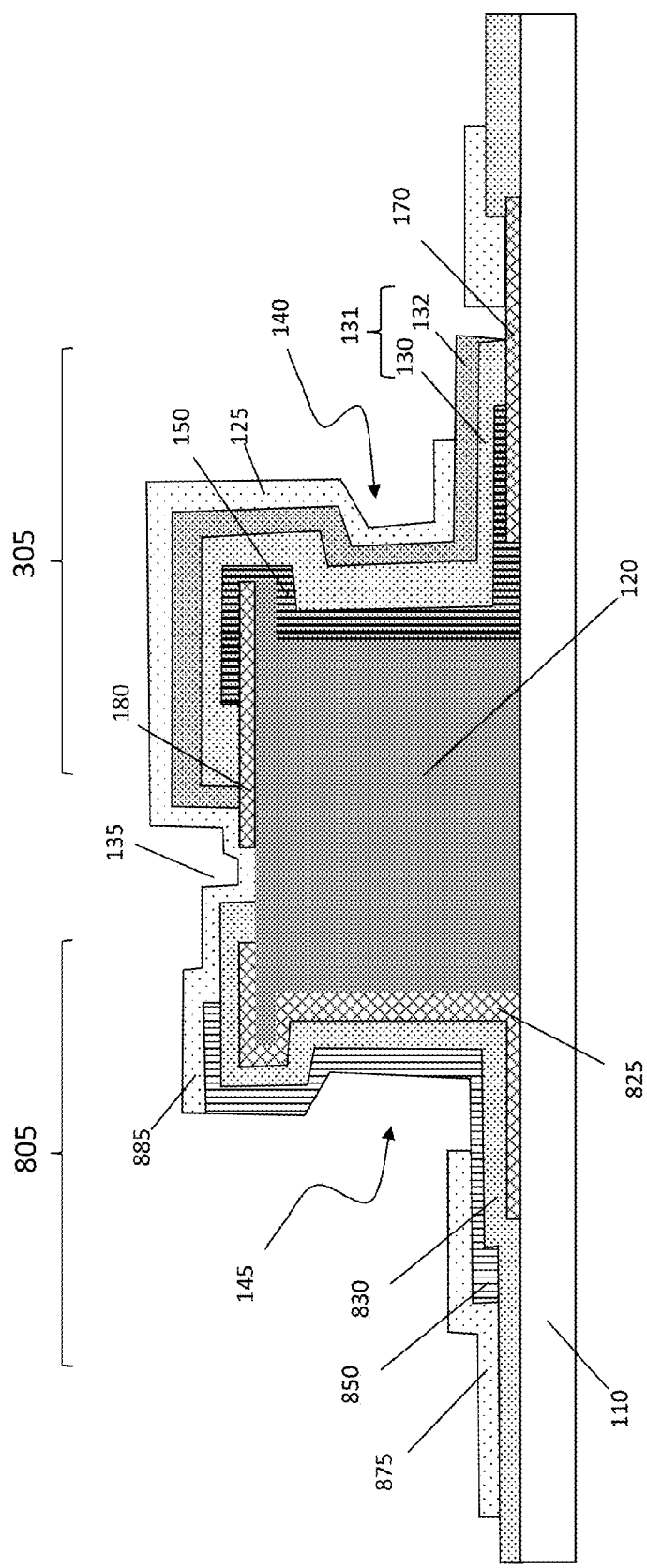
FIG. 11 is a cross-sectional view of a top-gate vertical transistor having a thicker gate dielectric than a bottom-gate transistor on the same vertical-support-element operable as an enhancement-depletion mode inverter.

FIG. 11 is schematic cross-sectional view of an alternative embodiment where a bottom-gate VTFT 805 and top gate VTFT 305 are formed over the same vertical-support-element 120 and are connected to operate as an enhancement-depletion-mode inverter. As shown bottom-gate VTFT 805 and top gate VTFT 305 are equivalent to bottom-gate VTFT 804 and top gate VTFT 304 discussed with respect to FIG. 10a through 10c, and have the same elements with the addition of another dielectric layer element 132. As shown, the first dielectric layer 130 and the second dielectric layer 830 are part of a common shared dielectric layer (as in FIGS. 10a through 10c). As shown in FIG. 11, dielectric layer 130 and additional dielectric layer 132 form dielectric stack 131. The dielectric stack 131 can include a plurality of layers. Additional dielectric layer 132 is patterned so that it adds additional gate-dielectric to top-gate transistor 305, but not to bottom-gate transistor 805 such that the gate-dielectric of top-gate transistor 305 is thicker than the gate-dielectric 830 of bottom-gate VTFT 805. The dielectric stack 131 should be considered as a common variable thickness dielectric stack shared between the top-gate and bottom-gate VTFT. As shown in FIG. 11, the full plurality of dielectric layers included in dielectric stack 131 are present at some regions of the VTFTs (for example, dielectric layers 130 and 132 are both present in reentrant profile 140), while only a portion of the plurality of layers included in dielectric stack 131 is present in other regions of the VTFTs (for example, only dielectric layer 130 is present in reentrant profile 145.

Although the variable thickness dielectric stack is illustrated here in an enhancement-depletion mode inverter arrangement, it should be understood that any arrangement of a bottom-gate VTFT and top-gate VTFT formed over the same vertical-support-element can include this feature.

The vertical-support-element 120 of the present invention can be used to form dual-gate vertical transistors, which is to say transistors having a gate on both sides of the semiconductor layer. Dual-gate devices are useful to tune the performance of the transistor and generally have higher on-currents than single gate devices. Shown in FIG. 12a is a schematic cross-sectional view of two dual-gate vertical transistors 701,702, taken along the line A-A' in the plan view shown in FIG. 12b. As shown, the electronic device includes a substrate 110, and an electrically conductive gate structure 760 on the substrate 110. The electrically conductive gate structure 760 includes vertical-support-element 120 and a conformal conductive bottom-gate layer 720. Preferably, the vertical-support-element 120 is formed from a post and a cap, where the cap extends beyond the edge of the post to form the first reentrant profile 140. As shown in FIG. 12a, the electrically conductive gate structure 760 extends away from the substrate to a top, and the top extends beyond the first edge to define a first reentrant profile. A first conformal dielectric layer 715 is in contact with the electrically conductive gate structure 760 and part of the substrate 110. The first conformal dielectric layer 715 can be said to maintain the reentrant profile 140. Next, there is a conformal semiconductor layer 750 that also maintains the first reentrant profile 140 and is in contact with the conformal electrically dielectric layer 715. A first electrode 780 is located in contact with a first portion of the semiconductor layer 750 over the top of the electrically conductive gate structure 760, and a second electrode 770 is located in contact with a second portion of the semiconductor layer 750, over the substrate 110 and not over the top of the electrically conductive gate structure 760, and adjacent to the first edge of the electrically conductive gate structure 760. A second conformal dielectric layer 730 is on the semiconductor layer 750 in the first reentrant profile 140. A conformal conductive top-gate 725 is on the conformal dielectric layer 730 in the first reentrant profile 140. The first electrode 780 and the second electrode 770 define a semiconductor channel of a dual-gate transistor 701.

As shown in FIG. 12a, the dual-gate vertical TFT 701 is formed in series with vertical TFT 702, and share both the top-gate 725 and the bottom-gate 720. In this configuration there are three electrodes including the shared first electrode 780 over the vertical-support-element 120, a second electrode 770 for TFT 701 not over the vertical-support-element 120, and a third electrode 775 for TFT 702 not over the vertical-support-element 120. As shown, the electrically conductive gate structure 760 has a second reentrant profile 145. The third electrode 775 is located in contact with a third portion of the semiconductor layer 750 over the substrate 110 and not over the vertical-support-element 120, and adjacent to the second reentrant profile 145.

The first electrode 780 and the second electrode 770 define the channel of the first TFT 701, and the third electrode 775 and the first electrode 780 define the channel of the second TFT 702. The configuration shown in FIGS. 12a and 12b allows contact to the vertical transistors 701 and 702 to be made on the substrate level so the transistors are operated in series, rather than making connection at the top of the electrically conductive gate structure 760. It should be understood that the present invention includes a single dual-gate vertical transistor where the electrodes are disposed as 770 and 780 in FIG. 12a. As shown, the electrically conductive gate structure 760 functions as the bottom-gate and the electrically conductive top-gate 725 functions as the top-gate for dual-gate transistors 701 and 702. In some example embodiments of transistor 701, electrode 770 functions as the drain of transistor 701 and electrode 780 functions as the source of transistor 701. In other example embodiments of transistor 701, electrode 770 functions as the source and electrode 780 functions as the drain. The semiconductor device is actuated in the following manner. After transistor 701 is provided, a voltage is applied between the electrode 770 and the electrode 780. A voltage is also applied either to the electrically conductive gate structure 720, or to the electrically conductive top-gate 725, or to both to electrically connect the electrode 770 and the electrode 780. In some embodiments the electrically conductive gate structure 720 and the electrically conductive top-gate 725, are electrically connected and operated simultaneously. In other embodiments, the top-gate acts as a bias electrode, and transistors are operated with independent voltages applied to the electrically conductive gate structure 720 and the electrically conductive top-gate 725.

Figure 13:
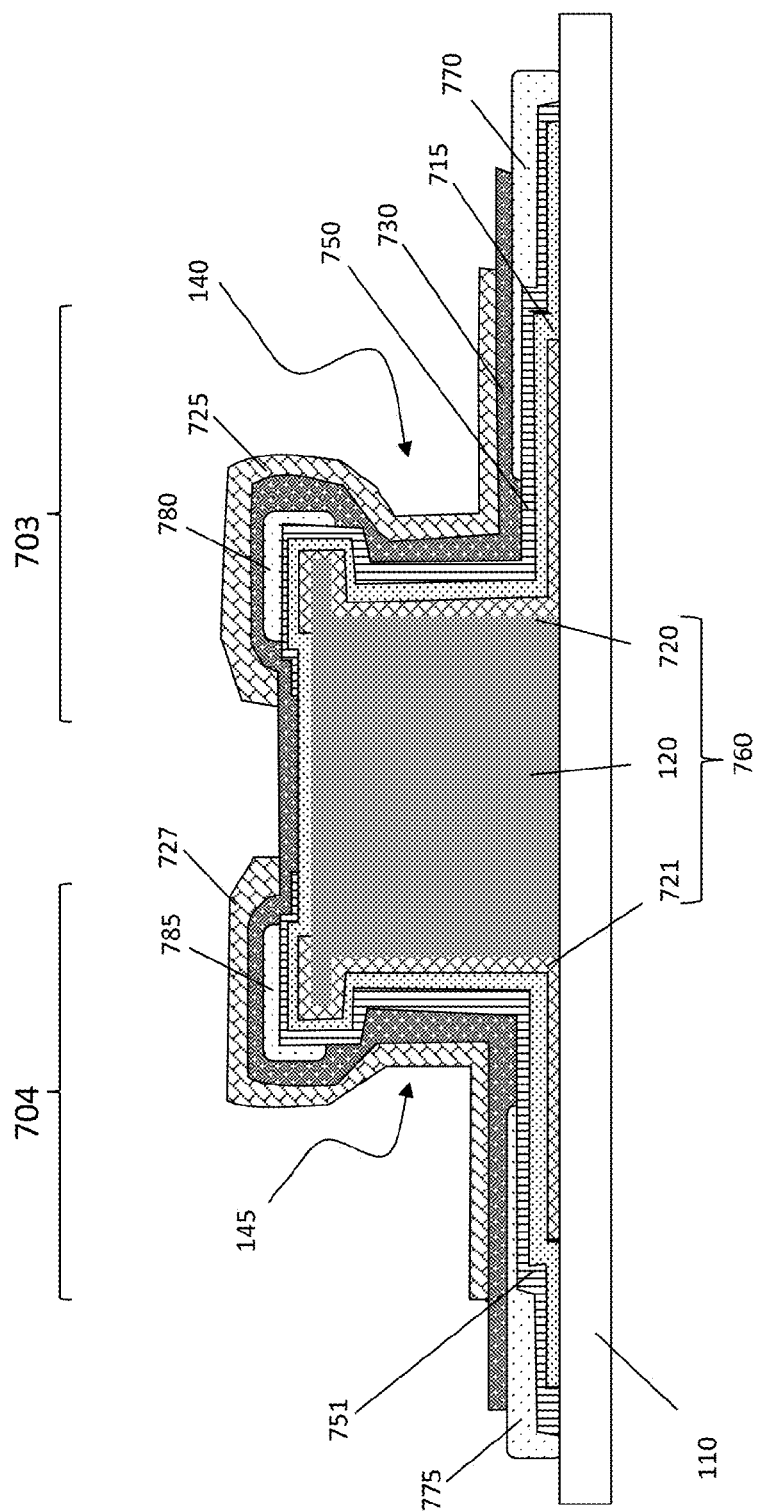
FIG. 13 is a cross-sectional view of two independently operable dual-gate vertical transistors on the same vertical-support-element.

The dual-gate vertical transistors can be configured such that the two dual-gate devices formed over a single vertical-support-element are independently operable. FIG. 13 is a schematic cross-sectional illustration of two independently operable dual-gate VTFTs 703, 704. They are similar in construction to the dual-gate VTFTs 701 and 702 in FIGS. 12a and 12b. As shown, there is an additional fourth electrode 785. The fourth electrode 785 located in contact with a fourth portion of the semiconductor layer 750 over the top of the electrically conductive gate structure 760, and electrically separate from the first electrode 780. The semiconductor layer has been patterned into two regions including a first semiconductor region 750 of the first dual-gate VTFT 703, and a second semiconductor region 751 of the second dual-gate VTFT 704. The conformal conductive top-gate has been patterned to have two independent top-gates, a first conformal conductive top-gate 725 and a second conformal conductive top-gate 727. Similarly, the conformal conductive bottom gate has two independently operable sections a first conformal conductive bottom-gate 720 and a second conformal conductive bottom-gate 721. In this embodiment, the first conformal conductive bottom-gate 720, the second conformal conductive bottom-gate 721, and the vertical-support-element 120 form the electrically conductive gate structure 760.

FIGS. 14a through 14c illustrate the embodiment where the two dual-gate VTFTs formed over a single vertical-support-element are arranged to operate as an inverter. As shown, dual-gate VTFTs 705 and 706 are formed over the same vertical-support-element 120 and are connected to operate as an enhancement-depletion-mode inverter, having an additional node "Vtop" that can be used to drive transistor T2. The equivalent circuit for a dual-gate enhancement-depletion-mode inverter is shown in FIG. 14b, where T1 is the load transistor and T2 is the drive transistor. As shown, the top-gate and bottom-gate of the load transistor T1 are electrically connected, while the top-gate and bottom of the drive transistor T2 are electrically independent. In the configuration shown in illustrated in FIGS. 14a through 14c, the dual-gate vertical transistor 705 is the load transistor, T1, and the dual-gate vertical transistor 706 is the drive transistor, T2. The dual-gate vertical transistor 705 illustrated in FIGS. 14a through 14c operates in a depletion-mode, while the dual-gate VTFT 706 is configured such that the top-gate is a bias electrode to tune the enhancement mode operation of the drive transistor.

As shown, dual-gate VTFTs 705 and 706 share a two common dielectric layers 715 and 730. There is a via 735 in both dielectric layers 715,730 to allow for electrical connection between the first electrode 780 and the conformal top-gate 725. The first electrode 780 is connected to the fourth electrode 785 over the top of the vertical-support-structure; and as shown in FIG. 14a, the fourth electrode 785 and the first electrode 780 are formed from a single material pattern and layer, having the same material composition and layer thickness. The via 735 in dielectric layer 715 allows the first electrode 780 to be connected to the conformal bottom-gate of the load transistor, dual-gate VTFT 705. As shown, there are additional optional vias in dielectric layer 730 to allow surface contact to the second and third electrode 770 and 785; the use of this and other vias will be dictated by the contact requirements of the circuitry. The remaining elements of the dual-gate VTFTs 705 and 706 are equivalent to those described with respect to VTFTs 701,702 and 703,704 of FIGS. 12a, 12, and 13, and should be understood from the previous description. The specific layout of the dual-gate inverter is shown in FIGS. 14a and 14c is chosen for simplicity of illustration. Many designs are possible and are within the scope of the current invention as long as they meet the requirements of having two dual-gate transistors formed over a single vertical-support-element 120, and are properly connected as in the equivalent circuit diagram of FIG. 14b.

Figure 15A:
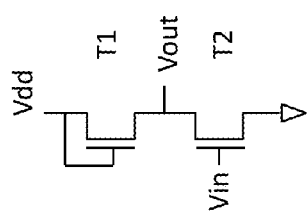
FIG. 15a is a schematic diagram of a circuit.

FIG. 15a illustrates an equivalent circuit for an all-enhancement-mode inverter. An all enhancement-mode inverter includes the first and second transistors T1 and T2. The first transistor T1 functions as a load transistor, and the second transistor T2 functions as a switching or drive transistor. Both the first TFT T1 and the second TFT T2 are operated in an enhancement mode.

As described above, an enhancement mode device is one that is normally off, and has a threshold voltage greater than zero. Each of the first and second transistors T1 and T2 includes a gate, a gate dielectric layer, a semiconductor layer, and source and drain electrodes. The semiconductor layer can be made of a semiconducting metal oxide material, and is preferably a ZnO-based semiconductor, for example, but not limited to, ZnO or $InGaZnO_4$. As shown in an all-enhancement-mode inverter, the source of the load transistor T1 is electrically connected to the drain of the drive transistor T2, and the drain and gate of the load transistor T1 are electrically connected.

Figure 15B:
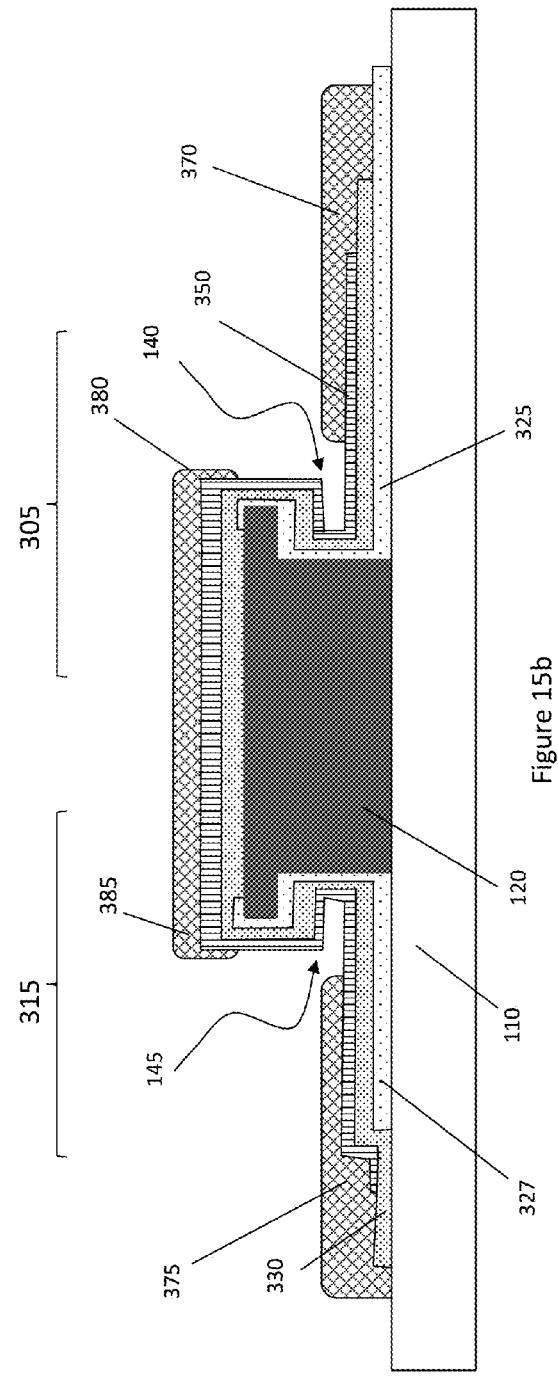

FIG. 15b illustrate a cross-sectional view of two bottom-gate VTFTs on a common vertical-support-element configured to operate as an all-enhancement-mode inverter. The specific layout of the inverter is shown in FIG. 15b was chosen for simplicity of illustration. Many designs are possible and are within the scope of the current invention as long as they meet the requirements of having two transistors formed over a single vertical-support-element 120, and are properly connected as in the equivalent circuit diagram of FIG. 15a.

As shown in FIG. 15b, an enhancement-mode inverter of the present invention has a load transistor T1 that is bottom-gate VTFT 305 with a first source 380, a first drain 370, a load channel region in the semiconductor layer 350, a load gate dielectric in the load channel region of the dielectric layer 330 of VTFT 305 and a first gate electrode 325. The drive transistor 315 of the enhancement-mode inverter of the present invention has a bottom-gate VTFT architecture with a second source 375, a second drain 385, a drive channel region in the semiconductor layer 350, a drive gate dielectric in the drive channel region of the dielectric layer 330 of VTFT 315 and a second gate electrode 327. The load and drive transistors 305, 315 are connected as in the equivalent circuit shown in FIG. 15a; the first source 380 is electrically connected to the second drain 385 and the first gate 325 is electrically connected to the first drain 370. The load and drive TFTs 305, 315 have a common shared dielectric layer 330, where the shared dielectric layer can be a single layer or a multilayer dielectric stack. As shown, TFTs 305 and 315 are on a common vertical-support-element 120, and have their individual elements formed in common layers.

Figure 16:
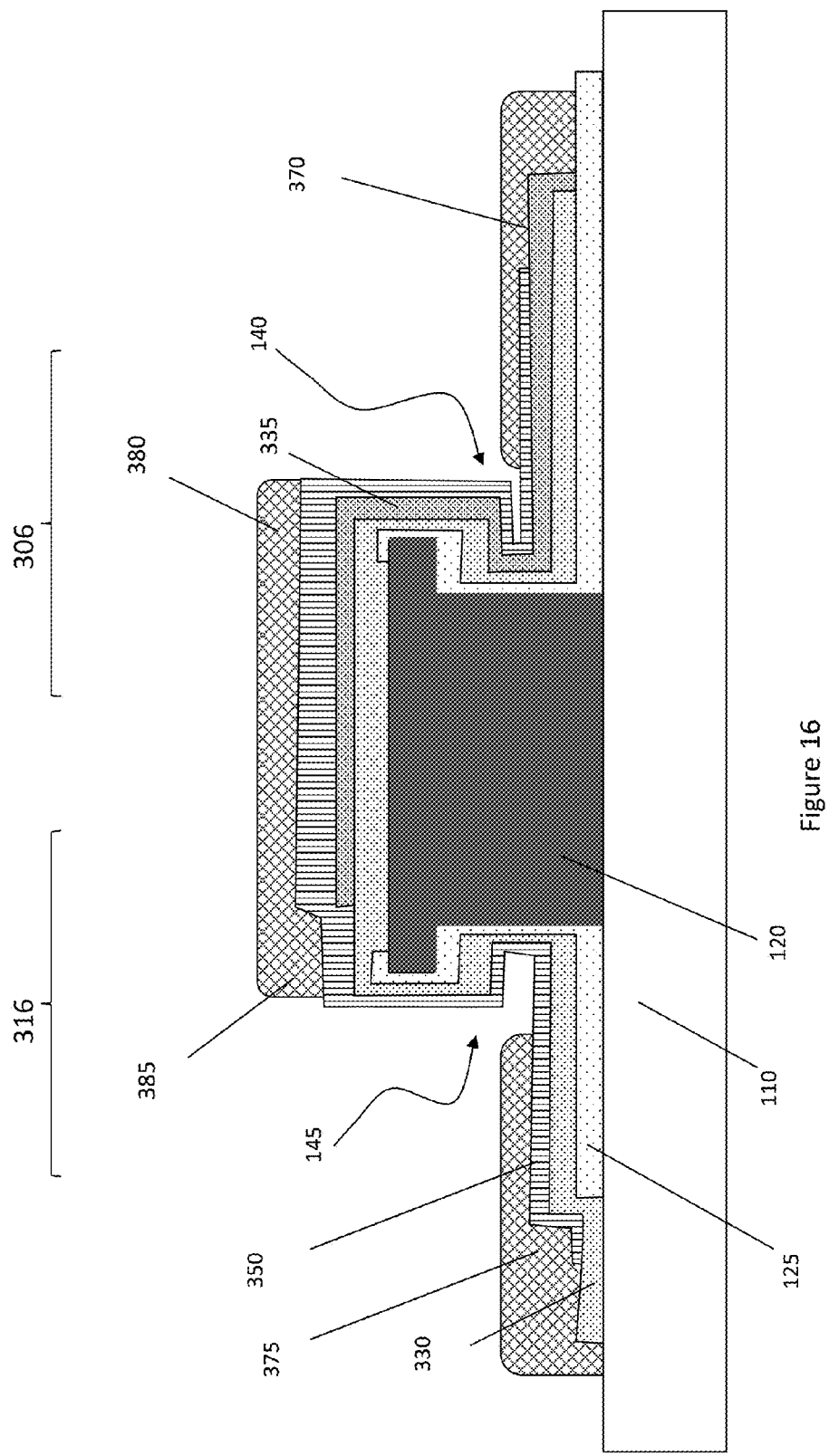
FIG. 16 is a cross-sectional view of an alternative embodiment of an all-enhancement-mode where the load TFT has a thicker dielectric than the drive TFT.

FIG. 16 illustrates an enhancement-mode inverter formed on a single vertical-support-element where tuning the relative current-carrying ability of the drive and load TFTs can be accomplished using the gate dielectric thickness of each TFT in addition to the W/L dimensions of their channels. The use of a common variable thickness dielectric stack as shown in FIG. 16 has the advantage of providing another dimension for optimizing the inverter and circuit design. Unlike standard circuit designs, which are limited to using the channel dimensions of the TFTs, the use of the variable thickness common dielectric stack allows the performance of the drive and load TFTs 316, 306 to be independently tuned using the thickness of the drive gate dielectric and the load gate dielectric. The common dielectric stack has an additional layer 335 in the region of the channel of bottom-gate VTFT 306.

Some embodiments of the present invention relate to planar top-gate thin film transistors (TFTs) which, as previously described, have a semiconductor layer that is between the substrate and the gate layer. Unlike bottom-gate TFTs, top gate TFTs are inherently protected from the environment since the semiconductor layer is between the substrate and the gate dielectric. When forming top-gate planar TFTs on some substrates, including inorganic substrates, the back-channel interface properties can cause the device to operate in the depletion mode.

FIG. 17a is a cross-sectional diagram of a prior art planar top-gate TFT 900, taken along the line A-A' of the plan view shown in FIG. 17c. The TFTs 900 shown in FIGS. 17a and 17b is a planar top-gate device that is representative of any planar top-gate TFT 900, having source and drain electrodes 980,985 in contact with a substrate 910, a semiconductor layer 970 that is over and in contact with the source/drain 980/985, a dielectric layer 930 over and in contact with semiconductor layer 970, and a gate 920 over and in contact with the dielectric layer 930, a so-called staggered structure. FIG. 17b illustrates a different embodiment of a typical top gate TFT where the semiconductor layer 970 is under the source and drain electrodes, in a coplanar structure. The remainder of the device is constructed as shown in FIG. 17a. The substrate 910 can be any previously discussed substrate, and can contain a plurality of predefined layers. The source and drain have conventionally accepted meanings, and either electrode shown can be designated the source (or drain) as is required by the application or circuit. The source and drain electrodes 980,985 can be a single conductive material, as shown in FIGS. 17a and 17b or can comprise any number of conductive material layers. The gap between the source and drain electrodes 980, 985 defines the semiconductor channel of planar top-gate TFT 900, as is conventionally understood. The inorganic semiconductor layer 970 is in contact with both the source and drain electrodes 980, 985 and the substrate 910, as shown in FIG. 17a. The inorganic semiconductor layer 950 can be a metal oxide, for example a ZnO-based material. The dielectric layer 930 can be a single layer of dielectric, as shown, or in embodiments of the present invention the dielectric layer 930 is formed from a variable thickness dielectric layer. The depletion-mode performance of the planar top-gate TFT is useful in combination with the enhancement mode planar or vertical bottom-gate TFTs to construct enhancement-depletion-mode inverters and circuits.

FIG. 18a is a cross-sectional diagram of a prior art bottom gate TFT 1, taken along the line A-A' of the plan view shown in FIG. 18b. The TFT 1 shown in FIGS. 18a and 18b is a planar bottom-gate device that is representative of any planar bottom-gate TFT 1, having a gate 12 in contact with a substrate 110, a dielectric layer 13 over and in contact with the gate 12, and a semiconductor layer 15 over and in contact with the dielectric layer 13. The source and drain electrodes 18, 19 are over and in contact with the semiconductor layer 15 in a coplanar geometry. FIGS. 19a and 19b illustrate a different embodiment of a typical planar bottom-gate TFT 2 where the semiconductor layer 15 is under the source and drain electrodes 18, 19 in a staggered geometry. The remainder of the device is constructed as shown in FIGS. 18a and 18b. The substrate 110 can be any previously discussed substrate, and can contain a plurality of predefined layers. The source and drain have conventionally accepted meanings, and either electrode shown can be designated the source (or drain) as is required by the application or circuit. The source and drain electrodes 18, 19 can be a single conductive material, as shown in FIGS. 18a and 19b or can comprise any number of conductive material layers. The gap between the source and drain electrodes 18, 19 defines the channel of TFT 1 or 2, as is conventionally understood. The inorganic semiconductor layer 15 is in contact with both the source and drain electrodes 18, 19 and the dielectric layer 13. Bottom-gate TFT 1 or 2 can be passivated, meaning TFT 1 or 2 can have an additional layer on the side of the semiconductor layer 15 that is not in contact with the dielectric, the so-called back-side of the semiconductor layer 15, to protect the device for environmental effects. The inorganic semiconductor layer 15 can be a metal oxide, for example a ZnO-based material. The dielectric layer 13 can be a single layer of dielectric, as shown, or in embodiments of the present invention the dielectric layer 13 is formed from a variable thickness dielectric layer. Bottom-gate ZnO-based TFTs can operate in enhancement-mode, meaning that they are normally off. The enhancement-mode performance of planar bottom-gate TFTs is useful in combination with the other enhancement-mode bottom-gate planar TFTs and VTFTs to construct all-enhancement-mode inverters and circuits, and in combination with top-gate planar TFTs and VTFTs to construct enhancement-depletion-mode inverters and circuits.

FIGS. 20a through 20d are schematic cross-sectional views of planar bottom-gate TFTs illustrating different useful configurations a multilayer dielectric stack for use as the dielectric layer. Although illustrated in a planar bottom-gate format, the various embodiments of the multilayer dielectric stack are useful in other TFT architectures to vary the thickness of the gate dielectric and thickness of the cross-over dielectric to tune individual device performance. For example, previously discussed FIG. 11 illustrates the use of a variable thickness dielectric stack in a device having a bottom-gate VTFT and a top-gate VTFT formed over the same vertical-support-element 120. Returning to FIG. 20a through 20d, each Figure illustrates a bottom-gate planar TFT having the same elements as the planar bottom-gate TFT 2 described in relationship to FIGS. 19a and 19b where the single layer dielectric shown as 14 has been replaced with a multilayer dielectric stack 23. The gate 12, source/drain 18/19, semiconductor 15, and substrate 110 should be understood from previous descriptions.

Figure 20A:
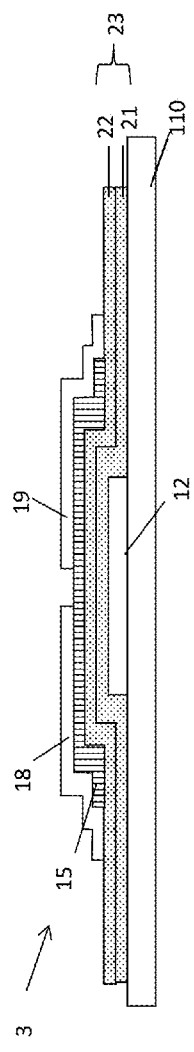
FIGS. 20a through 20d are cross-sectional views of alternative bottom-gate planar TFTs having different dielectric layer configurations.
Figure 20B:
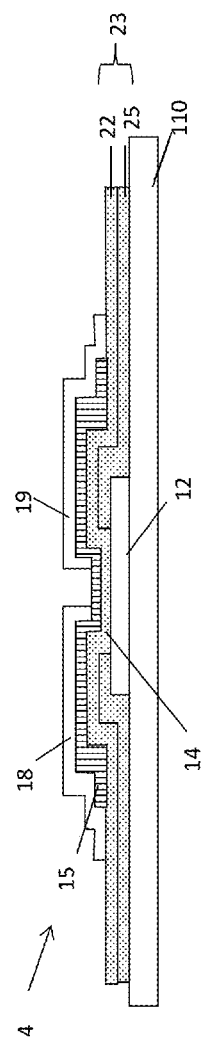
Figure 20C:
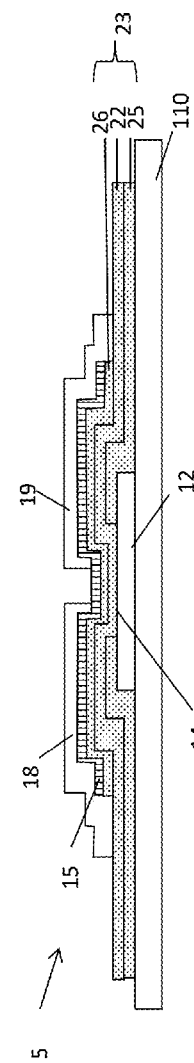

Although multilayer dielectric stack 23 is shown in FIG. 20*a* as having 2 layers, multilayer dielectric stacks can have any number of layers as desired. Preferably the dielectric layers 21 and 22 are insulating thin film inorganic material layers, more preferably layers 21 and 22 are formed from the same material. As shown in FIG. 20*a*, the multilayer dielectric stack 23 can be formed from multiple layers each having the same pattern. FIGS. 20*b* through 20*c* illustrate alternative architectures where the multilayer dielectric stack is composed of multiple layers having different patterns.

FIG. 20*b* illustrates a multilayer dielectric stack 23 with two layers 22 and 25, however TFT 4 has a gate dielectric with a thickness that is the same as the thickness of the second dielectric layer 22. As shown in FIG. 20*b*, dielectric layer 25 has been patterned to have a via 14 in the channel region of TFT 4, such that the second dielectric layer 22 defines the gate dielectric thickness, and dielectric protection layer 25 protects against shorting in the overlap region between the source/drain 18/19 and the gate 12 outside of the channel region of TFT 4.

Figure 20D:
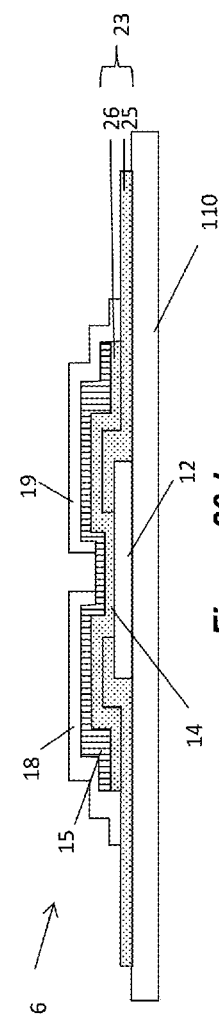

FIG. 20*c* has a three layer 25, 22, 26 multilayer dielectric stack 23 where the second layer 22 and dielectric protection layer 25 are equivalent to those in FIG. 20*b*. TFT 5 of FIG. 20*c* has a buffer layer 26 as part of the multilayer dielectric stack 23. Buffer layer 26 is a dielectric layer having the same x-y pattern as the semiconductor 15. Buffer layer 26 is used in devices formed by selective area deposition processes to control the interface between the gate dielectric (multilayer dielectric stack 23) and the semiconductor 14. FIG. 20*d* illustrates an alternative embodiment of a buffer layer 26 in combination with the dielectric protection layer 25, without other dielectric layers in the multilayer dielectric stack in the region of TFT 6. As shown in FIG. 20*d* the gate dielectric thickness of TFT 6 is defined by the thickness of the buffer layer 26. Although buffer layer 26 and the multilayer dielectric stack 23 are illustrated in FIGS. 20*a* through 20*d* in planar bottom-gate TFTs, they are also useful for vertical bottom-gate transistors.

All of the thin-film transistors described thus far are preferably composed of thin-film inorganic material layers. Each transistor architecture can be fabricated using the combination of SALD and selective area deposition (SAD). Using selective area deposition in combination with ALD to pattern thin-film inorganic layers has the benefit of being an additive patterning technology, where there is no need to be concerned with the relative etch rates of the different materials. Preferably each of the layers of the transistors illustrated are formed from metal oxides, as described earlier. When using an additive patterning technique, like SALD in combination with SAD, multiple types of architectures can easily be fabricated on the same substrate. Transistors of different architectures can be chosen for their individual performance attributes, for example as discussed in previously incorporated by reference U.S. application Ser. No. 14/526,634, filed Oct. 29, 2014, planar top-gate and bottom-gate transistors can be integrated to form enhancement-depletion mode circuitry. As illustrated in FIGS. 10*a* through 10*c* and FIG. 11, top-gate and bottom-gate VTFTs can be built over a single vertical-support-element and can share common patterned material layers. In circuit design, it is usually necessary to vary the width (W) and length (L) of the semiconductor channel of different elements in the circuitry on a single substrate. Vertical transistors typically have short channel lengths, which are advantaged for high current needs. Planar transistors typically have longer channels than vertical transistors, when high-end photolithography is not employed in processing. In some applications, the use of long channel vertical transistors is useful to adjust W and L to achieve the desired relative TFT performance. The ability to mix and match vertical and planar transistors, with both top-gate and bottom-gate architectures, is useful for the ease of sizing transistor components in complex circuitry. Both long channel vertical transistors and planar transistors have channel lengths that are primarily (or fully in the case of a planar TFT) defined by the length of the channel that is parallel to the substrate. Electronic components with mixed devices have a first transistor where at least a portion of the first semiconductor channel extends a direction parallel to the substrate, a vertical-support-element, and a second transistor with a channel having at least a portion extending in a direction orthogonal to the substrate. The length of the first semiconductor channel is shorter than the length of the first semiconductor channel.

Table 1 illustrates different transistor architectures formed from common material layers over a single substrate. In Table 1, staggered contacts are abbreviated as stag, coplanar contacts are abbreviated as cp, bottom-gate is abbreviated BG, top-gate is abbreviated TG, and vertical-support-element is abbreviated as V-S-E.

TABLE 1

| ID | Layer | BG-VTFT | BG-VTFT | TG-VTFT | TG-VTFT | DUAL-VTFT | BG-planar | BG-planar | TG-planar | TG-planar |
|---|---|---|---|---|---|---|---|---|---|---|
| | | | | | | Contact geometry: | | | | |
| | | stag | cp | stag | cp | stag | stag | cp | stag | cp |
| A | Thick Insulator | V-S-E | V-S-E | V-S-E | V-S-E | V-S-E | — | — | — | — |
| B | Conductive Layer | Gate | Gate | S/D | — | Gate | Gate | Gate | S/D | — |
| C | Semiconductor Layer | — | — | Semi | Semi | — | — | — | Semi | Semi |
| D | Dielectric Layer | Diel | Diel | Diel | — | Diel | Diel | Diel | Diel | — |
| E | Semiconductor Layer | Semi | — | — | — | Semi | Semi | — | — | — |
| F | Conductive Layer | S/D | S/D | Gate | S/D | S/D | S/D | S/D | Gate | S/D |
| G | Dielectric Layer | — | — | — | Diel | Diel | — | — | — | Diel |

TABLE 1-continued

| ID | Layer | BG-VTFT | BG-VTFT | TG-VTFT | TG-VTFT | DUAL-VTFT | BG-planar | BG-planar | TG-planar | TG-planar |
|----|-------|---------|---------|---------|---------|-----------|-----------|-----------|-----------|-----------|
|    |       |         |         |         | Contact geometry: |   |           |           |           |           |
|    |       | stag    | cp      | stag    | cp      | stag      | stag      | cp        | stag      | cp        |
| H  | Conductive Layer | — | — | — | Gate | TG | — | — | — | Gate |
| I  | Semiconductor Layer | — | Semi | — | — | — | — | Semi | — | — |

Table 1 illustrates 9 different transistor architectures that are possible to make on the same substrate from the combination of 9 different layers. With the exception of layer A—the thick insulator used to form the vertical-structure-element, the all remaining layers (B-I) are preferably conformal thin-film inorganic layers that were deposited and patterned using the combination of SALD and SAD. Although denoted in Table 1 as layers, each layer in Table 1 could be a single layer or a multilayer stack of the same or different materials as long as the final stack has the properties associated with the layer in Table 1. Table 1 is not limiting in the number of common or shared layers possible in constructing transistors of various architectures on a single substrate. That is, additional layers can be added prior to layer A, after layer I, or in between any of the layers listed in Table 1. For example, it may be desirable to have a patterned conductive layer on the substrate prior to forming layer A to act as the primary power lines for a given circuit. In some circumstances, it is desirable to form a passivation layer after forming the last semiconductor layer I. Furthermore, it is not required that all of the layers A through I are present on the substrate, only that there is a sufficient number of layers to form the desired elements. In one embodiment, there is a bottom-gate VTFT and a bottom-gate planar TFT formed on the same substrate, both having a staggered arrangement for the source/drain electrode. In this embodiment, only 5 common layers A, B, D, E and F are required to form the elements of the two transistor architectures.

Returning to the Figures, FIGS. 21 through 24 are schematic cross-sectional illustrations of various embodiments where a vertical transistor and a planar transistor are formed on a common substrate. As shown, there is an electronic component comprising two transistors on a common substrate. The first transistor on the substrate being a planar transistor having a first semiconductor channel having a first length extending in a direction parallel to the substrate, the first transistor having a first source, a first drain, a first gate dielectric, and a first gate. A vertical-support-element having a first reentrant profile is on the substrate, the vertical-support-element being a structural element used to form the vertical transistor. The second transistor on the substrate is a vertical transistor having a second semiconductor channel, including at least a portion of the second semiconductor channel extending in a direction orthogonal to the substrate in the first reentrant profile of the vertical-support-element. The second semiconductor channel of the vertical transistor has a second length that is less than the first length. The second transistor has a second source, a second drain, a second gate dielectric and a second gate. As used here the length of a semiconductor channel is the commonly accepted definition, meaning the shortest distance between the source and the drain electrodes as drawn along the semiconductor surface.

Turning first to FIG. 21, the first transistor 410 is a planar bottom-gate TFT and the second transistor 420 is a bottom-gate VTFT. The elements of first transistor 410 are the same as the elements of TFT 1 illustrated in FIG. 18a, and are labeled the same for clarity. As shown the dielectric layer 13 over the gate 12 of the first transistor 410, is the first gate-dielectric of first transistor. The second transistor 420 has the same elements of bottom-gate VTFT 801 illustrated in FIG. 8a, and is similarly labeled with the same part numbers. The vertical-support-element 120 has a first reentrant profile 140 and a second reentrant profile 145. The first electrode 880 and the second electrode 870 are the second source and second drain, respectively, of the second transistor 420. The dielectric layer 830 in the region of the channel of the second transistor is the second gate dielectric. The second semiconductor channel should be understood from the previous descriptions, and is defined by the second source and second drain electrodes.

As illustrated in FIG. 21, there is a third transistor 430 whose channel is in the second reentrant profile 145. Third transistor 430 has a third semiconductor channel, where at least a portion of the third semiconductor channel extends in a direction orthogonal to the substrate in the second reentrant profile. The third transistor 430 has a third source, a third drain, a third gate dielectric, and a third gate. The third source is third electrode 875, and the third drain is the portion of the first electrode 880 adjacent the second reentrant profile 145 over the vertical-support-structure 120. The second drain and the third source are electrically connected and physically connected as they are two portions of the first electrode 880. The second gate and the third gate are two portions of the conductive conformal gate layer 825 in the first and second reentrant profiles 140 and 145 respectively.

As shown in FIG. 21, the second vertical transistor and the first planar transistor have 4 common layers, layers B, D, E and F from Table 1 and layer A which has been patterned so that it is only present in the region of the second vertical transistor. Common layers are indicated by common shading in the figure. As shown in FIG. 21, the vertical-support-element 120 is patterned in layer A. The first gate 12 of planar bottom-gate TFT 410 and the second gate in conformal conductive gate layer 825 of bottom-gate TFT 420 are separate regions of a common conformal conductive layer, layer B. The first dielectric 14 of planar bottom-gate TFT 410 and second dielectric portion of dielectric 830 of vertical bottom-gate TFT 420 are separate regions of a common conformal dielectric layer, layer D. Similarly, the first semiconductor 15 planar bottom-gate TFT 420 and second semiconductor portion of semiconductor 850 of vertical bottom-gate TFT 420 are separate regions of a common conformal semiconductor layer, layer E. Finally, the first source and first drain 18, 19 of planar bottom-gate TFT 410 and second source 880 and second drain 870 of vertical bottom-gate TFT 420 are separate regions of a common conformal conductive layer, layer F.

FIG. 22 illustrates another embodiment of the present invention where the first transistor 411 is a planar top-gate TFT and the second transistor 421 is a bottom-gate VTFT. The vertical-support-element 120 of FIG. 22 has a second reentrant profile 145 with a third vertical transistor 431. The second transistor 421 and third transistor 431 are equivalent to the second and third transistors 420,430 of FIG. 21 and should be understood from the previous description. The first transistor 411 has the same elements as the top-gate planar transistor 900 illustrated in FIG. 17b. As shown the dielectric layer 930 under the gate 920 of the first transistor 411, is the first gate dielectric of first transistor 411. The inorganic semiconductor layer 950 is in contact with both the source and drain electrodes 980, 985.

As shown in FIG. 22, the second vertical transistor and the first planar transistor are formed from 6 layers (layers A, AA, B, D, E and F) and have 3 common layers, layers B, D, and F from Table 2. Alternatively, the transistors shown in FIG. 22 could be made from layers A, B, C, D, E, F, G and H from Table 1. Common layers are indicated by common shading in the figure. As shown in FIG. 22, the vertical-support-element 120 is formed in layer A. The first semiconductor 970 of the first transistor 411 is in layer AA. The first source 980 and first drain 985 of planar top-gate TFT 411 and the second gate in conformal conductive gate layer 825 of bottom-gate TFT 421 are separate regions of a common conformal conductive layer, layer B. The first dielectric 930 of planar bottom-gate TFT 411 and second dielectric 830 of vertical bottom-gate TFT 421 are separate regions of a common conformal dielectric layer, layer D. The second semiconductor portion of semiconductor 850 of vertical bottom-gate TFT 421 is in layer E. Finally, the first gate 920 of planar top-gate TFT 411 and second source 880 and second drain 870 of vertical bottom-gate TFT 421 are separate regions of a common conformal conductive layer, layer F.

TABLE 2

| ID | Layer | BG-VTFT stag | TG-planar cp | BG-VTFT stag | TG-planar staggered |
|----|-------|--------------|--------------|--------------|---------------------|
| A  | Thick Insulator | V-S-E | — | V-S-E | — |
| AA | Semiconductor Layer | — | Semi | — | — |
| B  | Conductive Layer | Gate | S/D | Gate | S/D |
| C  | Semiconductor Layer | — | — | — | Semi |
| D  | Dielectric Layer | Diel | Diel | Diel | Diel |
| E  | Semiconductor Layer | Semi | — | Semi | — |
| F  | Conductive Layer | S/D | Gate | S/D | Gate |

In an alternative embodiment of a bottom-gate VTFT and a top-gate planar TFT formed on the same substrate, a top-gate planar TFT having a staggered structure can be used. In this embodiment the top-gate planar transistor would be replaced with a top-gate planar having the architecture illustrated in FIG. 17a. In this embodiment, the first planar top-gate TFT and second bottom-gate VTFT can be formed from 6 layers, A, B, C, D, E and F from Table 1 or 2.

Figure 23:
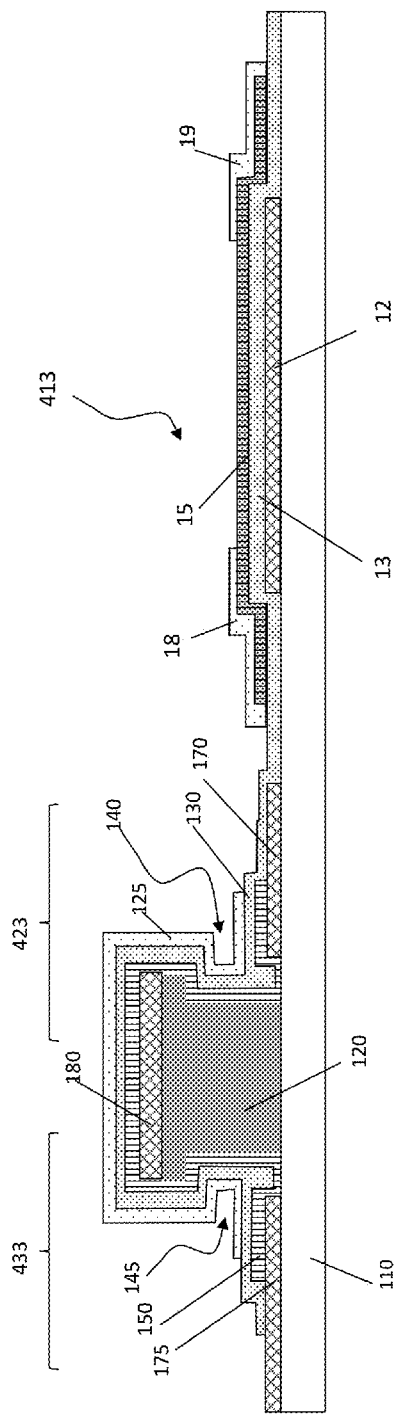
FIG. 23 is a cross-sectional view of an electronic element of the present invention with a top-gate VTFT and a bottom-gate planar TFT on the same substrate having the same material layers.
Figure 24:
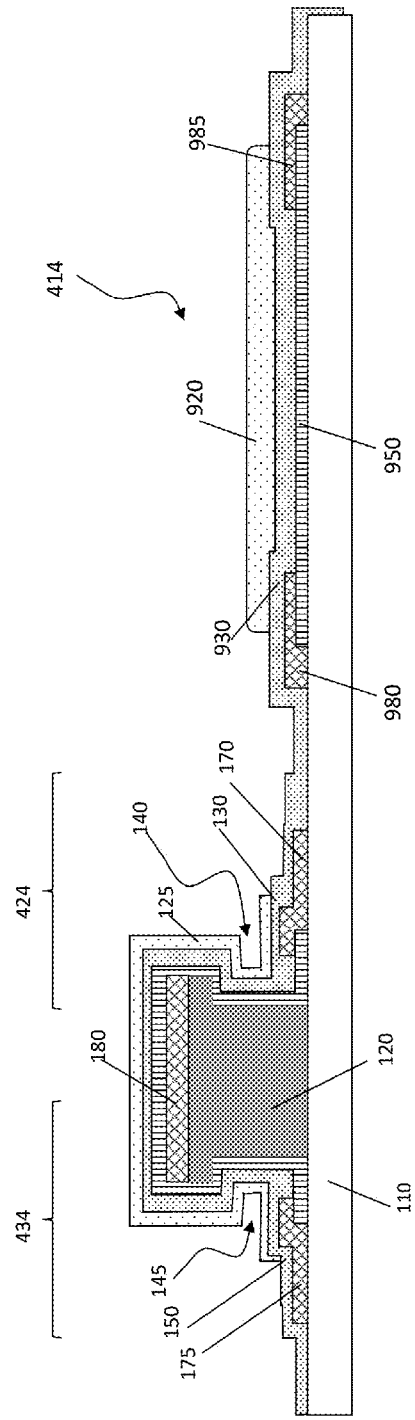
FIG. 24 is a cross-sectional view of an electronic element of the present invention with a top-gate VTFT and a top-gate planar TFT on the same substrate, having the same material layers.

The embodiments illustrated in FIGS. 23 and 24 are the analogs of the embodiments shown in FIGS. 21 and 22 where the second transistor is a top-gate VTFT. As shown in FIG. 23, an electronic element has a first transistor that is a planar bottom-gate TFT and a second transistor that is a top-gate VTFT. The elements of first transistor 410 are the same as the elements of TFT 410 illustrated in FIG. 21 and should be understood from the previous description. The second transistor 423 has the same elements of top-gate VTFT 100 illustrated in FIG. 1a, and is similarly labeled with the same part numbers. The vertical-support-element 120 has a first reentrant profile 140 and a second reentrant profile 145. The first electrode 180 and the second electrode 170 are the second source and second drain, respectively, of the second transistor 423. The dielectric layer 130 in the region of the channel of the second transistor 423 is the second gate dielectric. The second semiconductor channel should be understood from the previous descriptions, and is defined by the second source and second drain electrodes 180, 170.

As illustrated in FIG. 23, there is a third transistor 433 whose channel is in the second reentrant profile 145. Third transistor 433 has a third semiconductor channel, where at least a portion of the third semiconductor channel extends in a direction orthogonal to the substrate in the second reentrant profile. The third transistor has a third source, a third drain, a third gate dielectric, and a third gate. The third source is third electrode 175, and the third drain is the portion of the first electrode 180 adjacent the second reentrant profile 145 over the vertical-support-structure 120. The second drain and the third source are electrically and physically connected, as they are two portions of the first electrode 180. The second gate and the third gate are two portions of the conductive conformal gate layer 125 in the first and second reentrant profiles 140, 145, respectively.

As shown in FIG. 23, the second top-gate vertical transistor 423 and the first bottom-gate planar transistor 410 can be formed from 6 layers, A, B, C, D, E and F from Table 1. Common layers are indicated by common shading in the figure. As shown in FIG. 23, the vertical-support-element 120 is formed in layer A. The first gate 12 of planar bottom-gate TFT 410 and the second source 180 and second drain 170 of top-gate VTFT 423 are separate regions of a common conformal conductive layer, layer B. The second semiconductor portion of semiconductor 150 of vertical top-gate TFT 423 is in layer C. The first dielectric 13 of planar bottom-gate TFT 413 and second dielectric portion of dielectric 130 of vertical bottom-gate TFT 423 are separate regions of a common conformal dielectric layer, layer D. The first semiconductor 15 of planar bottom-gate TFT 413 is in a semiconductor layer, layer E. Finally, the first source and first drain 18, 19 of planar bottom-gate TFT 413 and conformal conductive gate of vertical top-gate TFT 423 are separate regions of a common conformal conductive layer, layer F.

FIG. 24 is illustrative of the embodiment of the present invention where a second top-gate VTFT 424 is on a common substrate with a first top-gate planar TFT 414. Top-gate planar TFT 404 has the same elements as the top-gate planar TFT 401, and should be understood from the previous description. The second transistor 424, is equivalent to the top-gate VTFT 104 described with respect to FIG. 2c, and should be understood from the previous description. As illustrated, first planar top-gate TFT 404 and the second top-gate VTFT 424 share 5 common layers, A, C, F, G and H from Table 1. Common layers are indicated by common shading in the figure. As shown in FIG. 24, the vertical-support-element 120 is formed in layer A. The first semiconductor 950 planar top-gate TFT 414 and second semiconductor portion of semiconductor 150 of vertical top-gate TFT 424 are separate regions of a common conformal semiconductor layer, layer C. The first source and first drain 980,985 of planar top-gate TFT 414 and second source 180 and second drain 170 of vertical top-gate TFT 424 are separate regions of a common conformal conductive layer, layer F. The first dielectric 930 of planar bottom-gate TFT 414 and second dielectric portion of dielectric 130 of vertical top-gate TFT 424 are separate regions of a common conformal dielectric layer, layer G. Finally, first gate 920 of planar top-gate TFT 414 and the second gate in conformal conductive gate layer 125 of top-gate VTFT 424 are separate regions of a common conformal conductive layer, layer H.

FIGS. 25a through 25c are illustrative of an embodiment of the present invention where the bottom-gate VTFTs 425, 435 and the planar bottom-gate TFT 415 are configured to operate as an all-enhancement-mode inverter. As illustrated, bottom-gate VTFT 425 is formed over the same vertical-support-element 120, and in series with, bottom-gate VTFT 435. This arrangement of using two VTFTs in series as an equivalent drive transistor for an all-enhancement-mode inverter is shown in the equivalent circuit of FIG. 25a. Using two VTFTs in series over a single vertical-support-element as an equivalent drive transistor is useful in any logic gate or circuit where the drive TFT is vertical TFT (a short channel device) and the load TFT is a planar device. The bottom-gate VTFTs 425 and 435 are equivalent to the bottom-gate VTFTs 420 and 430 of FIG. 21, and should be understood from the previous description. Similarly, the bottom-gate planar TFT 415 is equivalent to the bottom-gate planar TFT 410 of FIG. 21, and should be understood from the previous description. As with FIG. 21, the three transistors on the common substrate 110 of FIGS. 25b and 25c are formed from 5 layers, with each with elements in 4 common layers B, D, E and F from Table 1. As shown in FIGS. 25b and 25c, the first source 18 of the first planar bottom-gate TFT 415 is electrically and physically connected to the drain/source 870 of the second TFT 425. The first drain 19 of the first planar bottom-gate TFT 415 is connect to its own gate 12, through a via in the common dielectric layer, as shown by an X in FIG. 25b.

FIG. 26 is illustrative of an embodiment of the present invention where the bottom-gate VTFT 426 and the bottom-gate transistor 416 are configured to operate as an all-enhancement-mode inverter. The bottom-gate transistor 416 is a long channel vertical transistor, where the length of the semiconductor channel is primarily determined by the portion of the channel that is parallel to the substrate. This is to say that the length of the portion of the first semiconductor channel extending in the direction parallel to the substrate is greater than the length of the portion of the first semiconductor channel extending in the direction orthogonal to the substrate. Preferably the length of the portion of the first semiconductor channel extending in the direction parallel to the substrate is at least 10 times greater than the length of the portion of the first semiconductor channel extending in the direction orthogonal to the substrate. The long-channel bottom-gate VTFT 416 has a channel dimension that is typical of a planar transistor, but has source and drain electrodes that are at different distances from the substrate (making it a vertical transistor). The benefit of using long-channel bottom-gate VTFT 416 over a planar transistor is a reduction in the overall footprint of the device, the ability to leverage the second reentrant profile. The architecture shown in FIG. 26 is advantaged over standard VTFTs in that length of the channel of VTFT 416 can be controlled independent of the height of the vertical-support-element. The all-enhancement-mode inverter of FIG. 26 has an equivalent circuit shown in FIG. 15a (standard equivalent circuit of an enhancement-mode inverter). As shown in FIG. 26, the first bottom-gate TFT 416 has a first semiconductor channel with a portion extending in a direction orthogonal to the substrate in the second reentrant profile 146 of vertical-support-element 120. The length of the portion of the semiconductor channel that is parallel to the substrate is much longer than the portion in the second reentrant profile 146, preferably the parallel portion is at least 10 times longer. It can be said the length of the semiconductor channel of VTFT 416 is predominately defined by the portion of the channel that is parallel to the substrate. As shown in FIG. 26, the first reentrant profile 141 is used to form the second vertical bottom-gate transistor 426, having a second source 871 and second drain 880. The first source 18 is on top of the vertical-support-element 120 adjacent to the second reentrant profile 146, and electrically and physically connected to the second drain 880. The two transistors on the common substrate 110 of FIG. 26 are formed from 5 common layers, A, B, D, E and F from Table 1.

FIG. 27 is illustrative of an embodiment of the present invention where the bottom-gate VTFT 427 and the long-channel top-gate VTFT 417 are configured to operate as an enhancement-depletion-mode inverter. The enhancement-depletion-mode inverter has the standard equivalent circuit shown in FIG. 10a. As shown in FIG. 27, the first top-gate TFT 417 has a first semiconductor channel with a portion extending in a direction orthogonal to the substrate in the second reentrant profile 146 of vertical-support-element 120. The embodiment illustrated in FIG. 27 is similar to the embodiment of an enhancement-depletion-mode inverter illustrated in FIGS. 10a through 10c of a bottom-gate VTFT 804 and a top-gate VTFT 304 that share a common vertical-support-element. In FIG. 27, the top-gate depletion-mode TFT 417 is a long-channel top-gate VTFT since its channel length is predominately determined by the portion of the semiconductor layer that is parallel to the substrate rather than the portion of the portion that is in the reentrant profile 146. Preferably, 90% or greater of the length of the semiconductor channel of the long-channel top-gate VTFT 417 is parallel to the substrate. The elements of FIG. 27 are the same as the elements of FIG. 22. The second vertical transistor 427 and the first transistor 417 have 6 layers, with 4 common layers and are on a common substrate 110. The first source 980 is electrically connected to the second drain 880 and the first gate 920.

Figure 28:
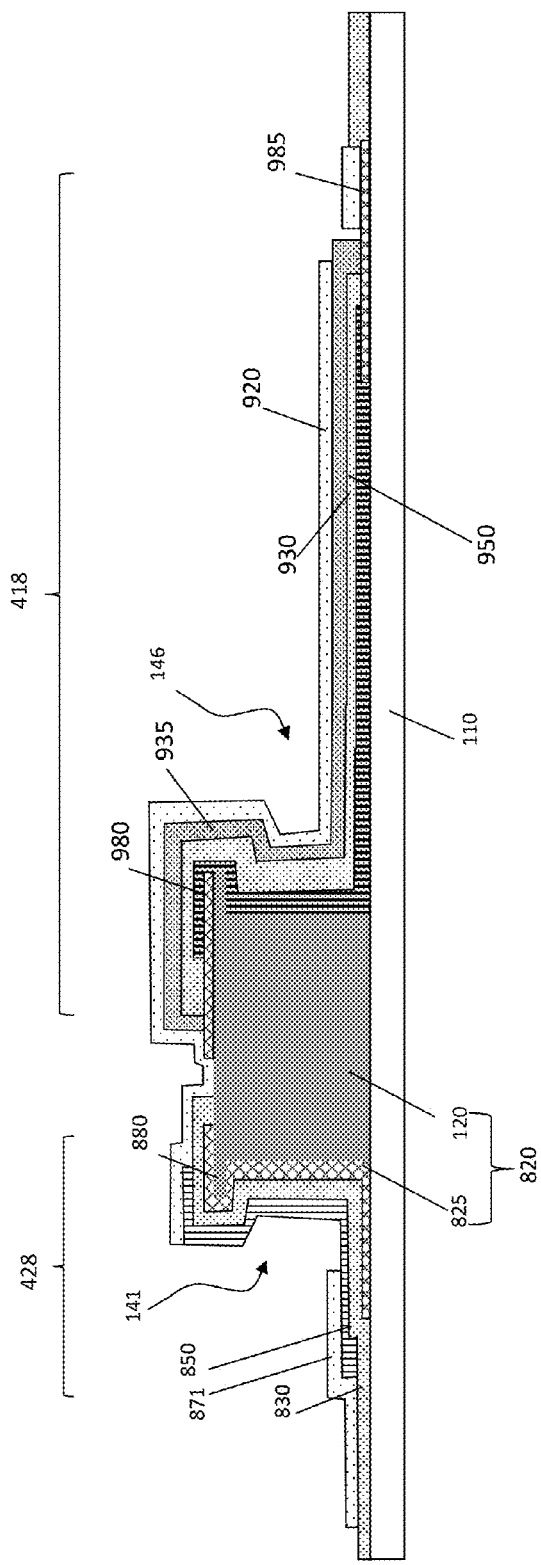
FIG. 28 is a cross-sectional view of a top-gate vertical transistor having a thicker gate dielectric than a bottom-gate transistor on the same vertical-support-element operable as an enhancement-depletion mode inverter.

FIG. 28 is an alternative embodiment having bottom-gate vertical TFT 428 on a common substrate with a long-channel top-gate VTFT 418. The elements of the electronic device of FIG. 28 are the same as those in FIG. 27, with the addition of additional dielectric layer 435 in long-channel top-gate VTFT 418 such that the electronic device has a variable thickness dielectric stack.

EXAMPLES

Figure 29:
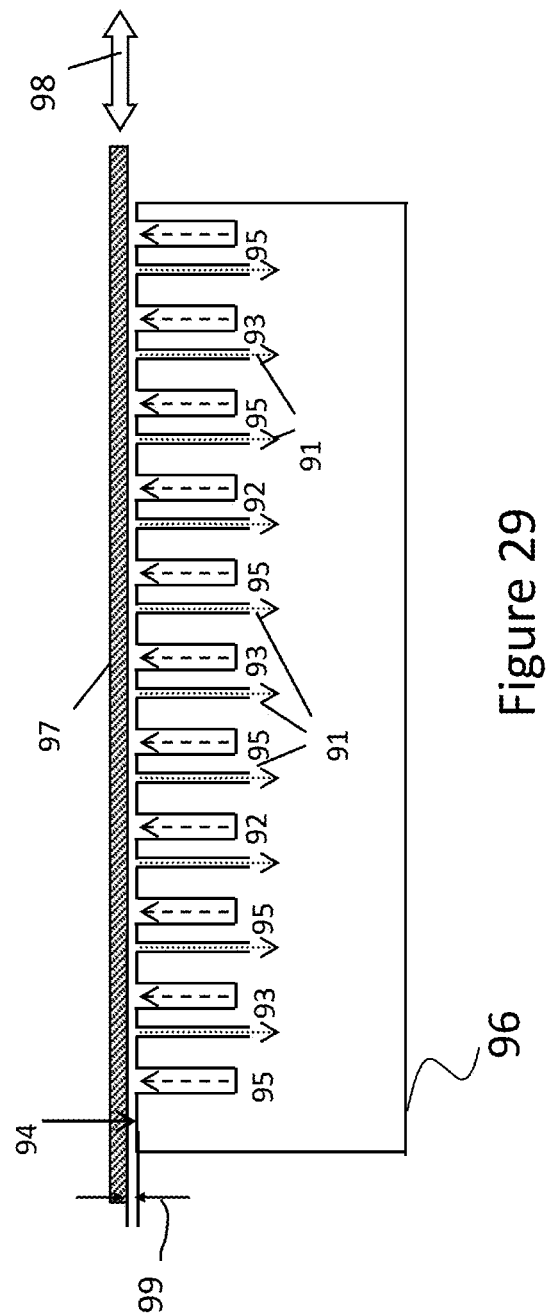
FIG. 29 is a cross-sectional side view of a deposition device, showing the arrangement of gaseous materials provided to a substrate that is subject to the thin film deposition process of the Examples.

The preparation of a thin film coating of the material layers on glass substrates, as used in the examples, is described below. The ALD coating device used to prepare these layers, namely aluminum oxide, ZnO:N, and Al-doped ZnO (AZO), has been described in detail in US Patent Application Publication No. US 2009/0130858, the disclosure of which is herein incorporated by reference in its entirety. The coating device has an output face (facing up) that contains spatially separated elongated gas channels and operates on a gas bearing principle. The coating device can be understood with respect to delivery head 96 shown in FIG. 29. Each gas channel is composed of an output slot 95, 93, 92 which supplies gas to the output face 94, and adjacent exhaust slots 91 which remove gas from the output face 94. The order of the gas channels is P-O-P-M-P-O-P-M-P-O-P where P represents a purge channel, O represents a channel containing an oxygen based precursor, and M represents a channel containing a metal based precursor. As a substrate moves relative to the coating head it sees the above sequence of gases which results in ALD deposition.

A 2.5 by 2.5 inch square (63.5 by 63.5 mm square) glass substrate attached to a heated backer is positioned above the output face of the coating device and is maintained in close proximity to the output face by an equilibrium between the pull of gravity, the flow of the gases supplied to the output face, and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally, ammonia vapor. The metal reactive precursor M can be one active metal alkyl vapor, or a mixture of active metal alkyl vapors, in nitrogen.

The metal alkyl precursors used in these examples were dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through a mass flow controller and mixing with the water vapor stream. All bubblers were held at room temperature. The temperature of the coating was established by controlling heating of both the coating device and the backer to a desired temperature. Experimentally, the flow rates of the individual gasses were adjusted to the settings shown in Table 3 for each of the material layers coated in the examples contained herein. The flows shown are the total flows supplied to the coating device, and thus are partitioned equally among the individual gas channels.

The coating process was then initiated by oscillating the substrate across the coating head for the number of cycles necessary to obtain a uniform deposited film of the desired thickness for the given example. The coating head as described above contains two full ALD cycles (two oxygen and two metal exposures per single direction pass over the head), therefore a round trip oscillation represents 4 ALD cycles. All samples were coated at a substrate temperature of 200° C. and a residence time of 50 ms.

Vertical TFT Experiments

The top-gate VTFTs of the present invention have advantages over planar transistor formed using the same materials. In some embodiments, where the entire vertical transistor is formed using printing processes the channel length of the transistor is less than the print resolution (which is unobtainable for a planar transistor whose channel is defined by printing). Generally, the vertical transistors of the present invention have shorter channel lengths than are easily obtainable from the same processing applied to planar transistors. The vertical transistors of the present invention with insulating cores allow for the gate to be located on the side of the semiconductor opposite the vertical-support-element, allowing for more design freedom than VTFTs formed with a conductive metal core, and can be fabricated using simple printing processes. The following Examples serve to illustrate the advantages of various embodiments of the present invention and present process.

Printed Top-Gate Vertical Transistors

Top-Gate vertical thin film transistors with polymer cores were fabricated using an all printing process as described above where each layer is patterned with the combination of selective area deposition and SALD, where the patterned inhibitor is applied using an inkjet printer. They were formed on 2.5 inch square glass substrates.

Inventive Example I1

One Pixel Width Printed Top-Gate VTFT

To fabricate Inventive Example I1, a glass substrate was provided and cleaned using an $O_2$ plasma (100 W 0.3 Torr for 1 minute). Next, a 35 wt % solution of SU-8 2010 in cyclopentanone was spun for 10 sec at 500 rpm and ramped to a final spin of 30 sec at 2000 rpm. This coating was cured using a recipe consisting of a two minute pre-exposure hot plate bake at 95° C., a 90 second blanket exposure, a two minute post-exposure hot plate bake at 95° C. and a final hard bake at 225° C. for 5 minutes resulting in a nominal 6000 Å film of cured SU-8.

Next, the surface of the SU-8 was treated with a 30 second $O_2$ plasma to activate the surface of the SU-8. The inorganic cap was formed over the SU-8 layer using the combination of SAD and ALD. Selective area deposition was done using a patterned deposition inhibiting material layer using a Fuji Dimatix 2500 piezo-inkjet printer. The inhibitor ink was a 2 wt % solution of polyvinyl pyrrolidone k-30 (PVP) in diacetone alcohol. The 10 pL cartridge was used with the Dimatix printer, and the print drop spacing was set to be 70 microns. The PVP ink was printed in a pattern such that the open area defined the pattern of the inorganic cap. Next, 250 Å of $Al_2O_3$ using DMAI as the metal precursor was deposited using the S-ALD system described above and the conditions in Table 1.

TABLE 3

| Layer | DMAI bubbler flow (sccm) | TMA bubbler flow (sccm) | DEZ bubbler flow (sccm) | NH3 flow (sccm) | Water bubbler flow (sccm) | $N_2$ dilution with Metal Alkyl (sccm) | $N_2$ dilution with water (sccm) | $N_2$ Inert Purge (sccm) |
|---|---|---|---|---|---|---|---|---|
| $Al_2O_3$ | 65 | 0 | 0 | 0 | 65 | 1500 | 2250 | 3000 |
| $Al_2O_3$ | 0 | 30 | 0 | 0 | 22.5 | 1500 | 2250 | 3000 |
| ZnO | 0 | 0 | 60 | 0 | 45 | 1500 | 2250 | 3000 |
| AZO | 10 | 0 | 30 | 0 | 22.5 | 1500 | 2250 | 3000 |

After forming the patterned inorganic thin film layer ($Al_2O_3$) for the cap, the post was formed using a 300 W 0.4 Torr $O_2$ plasma for 10 minutes, resulting in an inorganic cap and a structural polymer post that together are the vertical-support-element. As shown in the Figures, this results is a vertical-support-element with reentrant profiles 140 and 145. The $O_2$ plasma removed the PVP inhibitor and etched the SU-8 in the same process step.

Next, the drain and source electrodes were formed by using selective area deposition of a conductive inorganic material using an atomic layer deposition process. This was done by printing a patterned polymeric inhibitor such that the inhibitor wicks (that is, moves by capillary action) along the reentrant profile in the length dimension of the post. In Example I1, the open area in the inhibitor pattern was designed to be 1 pixel wide in the area of the reentrant profile. The same PVP ink and Dimatix printer was used in this step as was used in the previous patterning steps, such that 1 pixel is the equivalent distance of 70 microns. The inhibitor wicks, or moves by capillary action, along the reentrant profile from each edge of the open pattern. In order to have a functional VTFT, the inhibitor ink must meet up, such that the reentrant profile is completely protected along the width of the transistor. The pattern for the source/drain electrodes was chosen so that only a single top-gate VTFT was formed over the vertical-support-element as shown in FIGS. 7a and 7b. In this embodiment the pattern is chosen such that the inhibitor ink is not allowed to fully wick in reentrant profile 145.

After printing the inhibitor pattern containing the open area, 1000 Å of AZO was deposited using the conditions listed for AZO in Table 1 as the drain/source electrodes (180, 170). The wicked inhibitor prohibited the growth of AZO within the reentrant profile 140, thus forming separate electrodes via selective area deposition. The inhibitor was removed with a 2 minute 100 W oxygen plasma.

The combination of SAD and ALD was also used to pattern the semiconductor layer 150. In the present Example I1, nitrogen doped zinc oxide (ZnO:N) was deposited as the semiconductor layer 150 at 200° C., using the conditions listed for ZnO:N in Table 1. Immediately following the deposition of the semiconductor layer 150, the same inhibitor was used to pattern 300 Å of $Al_2O_3$ for the first layer of a multilayer dielectric stack. DMAI was used as the metal precursor and was deposited using the S-ALD system described above and the conditions in Table 1.

Next, the dielectric layer was completed by depositing two patterned layers of 125 Å of $Al_2O$. For each layer, the inhibitor that was used to pattern the previous layer was removed using a 100 W oxygen plasma, then the desired new inhibitor pattern was printed using the Dimatix printer, and $Al_2O_3$ was deposited using DMAI as the metal precursor in the SALD system described above and the conditions in Table 1. The combination of these patterning/deposition steps provides a gate-dielectric-stack having a total thickness of 550 Å.

Both the semiconductor layer 150 and the dielectric layer 130 (multi-layer stack) are present at least in the reentrant profile 140. Because Inventive Example I1 was formed on the same substrate as bottom-gate VTFT devices (see discussion of bottom gate VTFT examples BG1 and BG2 below), the top gate VTFT of Inventive Example I1 had inhibitor coating the whole device area of the VTFT, which inhibited the growth of ZnO:N and $Al_2O_3$ layers during the deposition of the semiconductor and buffer layer of the bottom gate devices. The Inventive Example I1, then had the inhibitor removed with a low-power oxygen plasma prior to printing the inhibitor pattern for the gate layer.

The conductive gate layer was provided, using the combination of SAD and ALD, providing a gate having 1000 Å of AZO within the reentrant profile. This was done by printing the PVP ink in the gate layer pattern, and depositing 1000 Å of AZO using the SALD system described above and the conditions in Table 1. The VTFT of Inventive Example I1 was complete after the deposition of the AZO, and testing was completed without removing the deposition inhibitor material.

Inventive Example I2

Two Pixel Width Printed Top-Gate VTFT

Inventive Example I2 was formed using the same process, and on the same substrate, as Inventive Example I1. The only difference between Inventive Example I2 and I1, is that Inventive Example I2 had a 2 pixel wide pattern used to define the width of the transistor when forming the source and drain electrodes.

Inventive Example I3

Three Pixel Width Printed Top-Gate VTFT

Inventive Example I3 was formed using the same process, and on the same substrate, as Inventive Example I1. The only difference between Inventive Example I4 and I1, is that Inventive Example I4 had a 3 pixel wide pattern used to define the width of the transistor when forming the source and drain electrodes.

Figure 30:
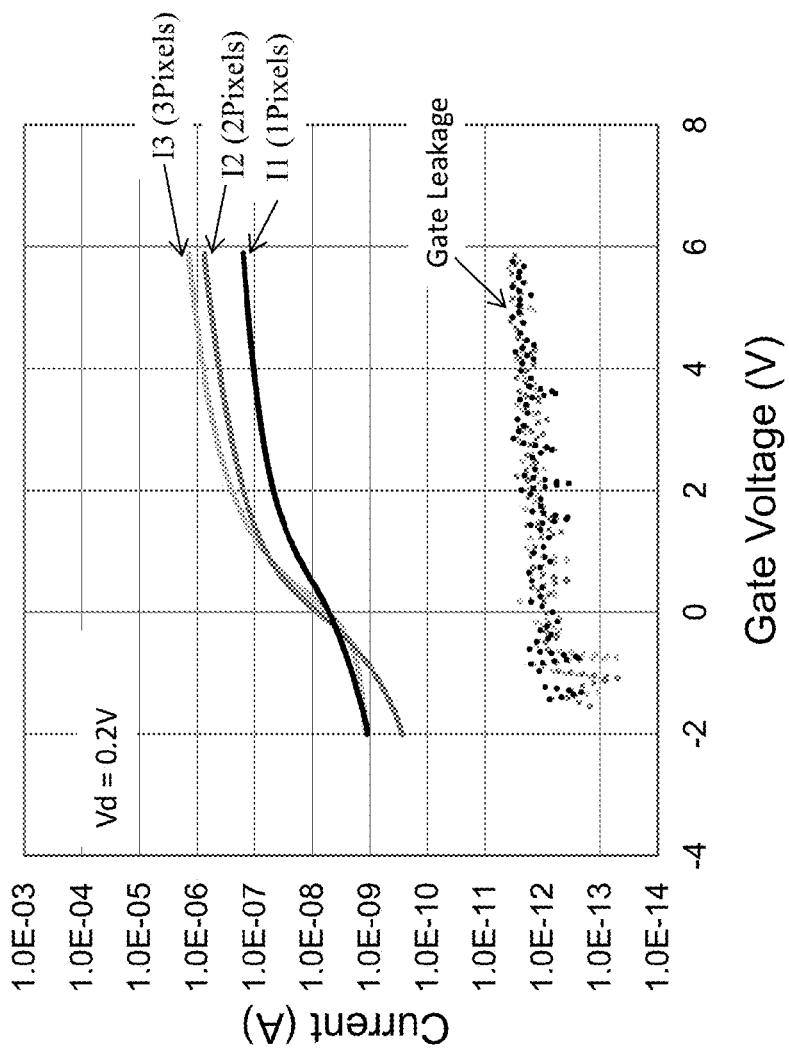
FIG. 30 is a graph illustrating the relationship between gate voltage and drain and gate current for top-gate VTFTs of Inventive Examples I1, I2 and I3.

Electrical testing of Inventive Examples I1-I3 was accomplished by using a probe station to contact the AZO gate and the two electrodes at the substrate level (the first electrode 180 and second electrode 1705 as shown in FIG. 7). The transistors were swept in the linear regime, with the drain being held constant at 0.2 V (Vd=0.2), and the gate voltage was swept from −2 V to 6 V. The curves can be found in FIG. 30, and it is clear that the source and drain electrodes are not shorted to each other, or to the gate of the vertical transistors. Additionally, the expected increase in current with increasing width of the transistor is observed.

Inventive Example I4

Two Pixel Width Printed Top-Gate VTFT

Inventive Example I4 is a replicate of Inventive Example I2.

Inventive Example I5

Two Pixel Width Printed Top-Gate VTFT—2 TFTs in Series

Inventive Example I5 was formed using the same process, and on the same substrate, as Inventive Example I2. The only difference between Inventive Example I5 and I2, is that Inventive Example I2 had a 2 pixel wide pattern that spanned across the vertical-support-element and was used to define the width of the two vertical transistors connected in series as shown in FIGS. 1a and 1b.

Bottom-Gate VTFT BG1: Two Pixel Width Printed Bottom-Gate VTFT

Bottom-gate VTFT BG1 was formed using the same process, and on the same substrate, as Inventive Examples I1-I5. The difference between the top-gate Inventive Examples I1-I5 and the Bottom-gate VTFT BG1 result from the pattern that was used to pattern the thin film layers. After forming the vertical-support-element as in Inventive Example I1, the conductive bottom-gate was formed using the combination of SAD and ALD, providing a gate having 1000 Å of AZO within the reentrant profile. This was done in the same SAD-SALD step as the formation of the source/drain electrodes for Inventive Example I1. Next, when forming the semiconductor layer and first dielectric layer of Inventive Example I1, the inhibitor was patterned to prevent the growth of ZnO:N and $Al_2O_3$ in the area of Bottom-gate VTFT BG1. Next, the dielectric layer for Bottom-gate VTFT BG1 was begun by patterning the inhibitor to allow the growth of the two patterned layers of 125 Å of $Al_2O$ as in Inventive Example I2. For each layer, the inhibitor that was used to pattern the previous layer was removed using a 100W oxygen plasma, then the desired new inhibitor pattern was printed using the Dimatix printer, and $Al_2O_3$ was deposited using DMAI as the metal precursor in the SALD system described above and the conditions in Table 1.

After removing the inhibitor from the dielectric pattern, the inhibitor was applied in the area of the Bottom-gate VTFT BG1 to pattern the semiconductor layer. Following the patterning of the inhibitor, 150 Å of $Al_2O_3$ was deposited as the buffer layer for BG1. DMAI was used as the metal precursor and was deposited using the SALD system described above and the conditions in Table 1. Immediately following the deposition of the $Al_2O_3$ buffer layer for BG1, the same inhibitor was used to pattern nitrogen-doped zinc oxide (ZnO:N). The semiconductor layer was deposited, using the conditions listed for ZnO:N in Table 1. The combination of these patterning/deposition steps provides BG1 a gate-dielectric-stack having a total thickness of 400 Å.

The device was completed by forming the source/drain electrode in the same SAD-SALD patterning-deposition step that was used to form the conformal conductive top-gate for Inventive Example I1. The pattern for the source/drain electrodes was chosen so that only a single top-gate VTFT was formed having a width of 2 pixels. As in the top-gate VTFT, the inhibitor wicks, or moves by capillary action, along the reentrant profile from each edge of the open pattern. The inhibitor ink meets up such that the reentrant profile was completely protected along the width of the transistor, thus forming two electrically distinct electrodes in the same deposition step. The Bottom-Gate VTFT BG1 was complete after the deposition of the AZO, and testing was performed without removing the deposition inhibitor material.

Bottom-Gate VTFT BG2: Two Pixel Width Printed Bottom-Gate VTFT—2 Vertical TFTs in Series Bottom-Gate VTFT BG2 was formed using the same process, and on the same substrate, as Bottom-Gate VTFT BG1. The only difference between Bottom-Gate VTFT BG1 and BG2, is that Inventive Example BG2 had a 2 pixel wide pattern that spanned across the vertical-support-element and was used to define the width of two transistors connected in series as shown in FIGS. 8a and 8b.

Figure 31:
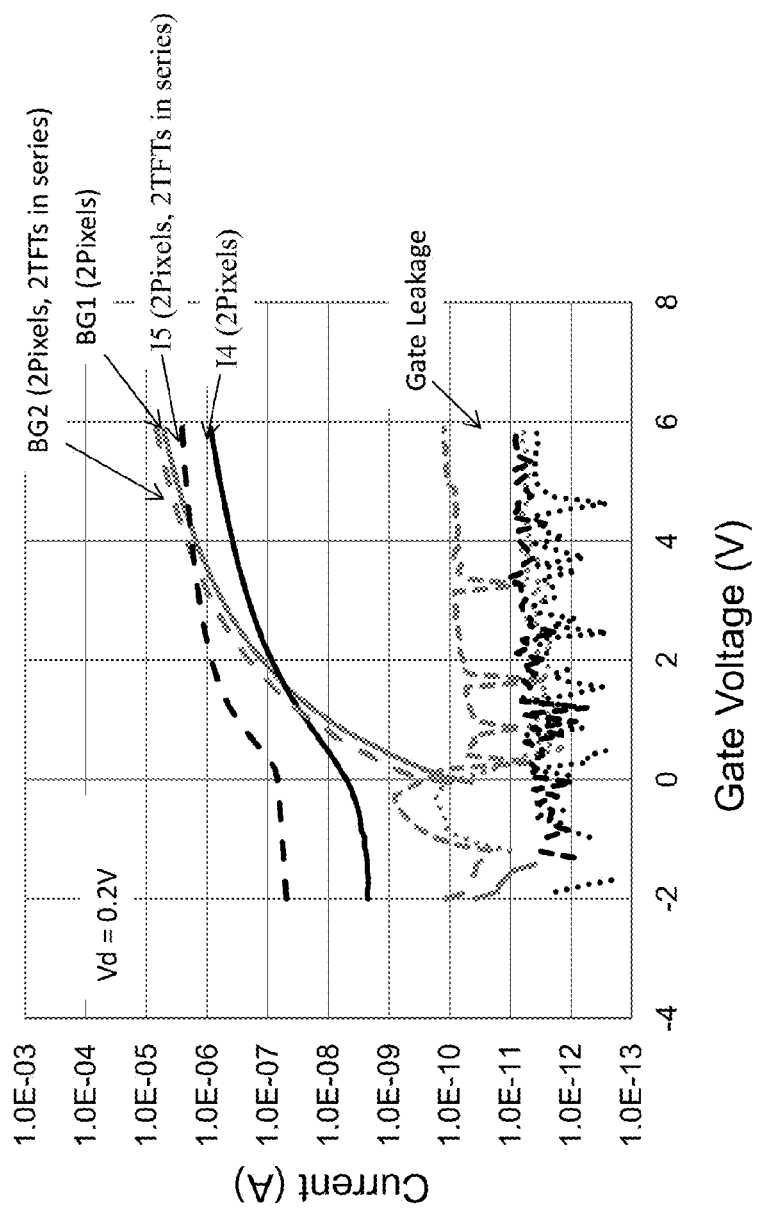
FIG. 31 is a graph illustrating the relationship between input voltage and output voltage for the enhancement-top-gate VTFTs of Inventive Examples I4 and I5 and bottom-gate VTFTs BG1 and BG2.

Electrical testing of Inventive Examples I4, I5, BG1, and BG2 was accomplished by using a probe station to contact the AZO gate and the source/drain electrodes at the substrate level. The transistors were swept in the linear regime, with the drain being held constant at 0.2 V (Vd=0.2), and the gate voltage was swept from −2 V to 6 V. The curves can be found in FIG. 31, and it is clear that the source and drain electrodes are not shorted each other, or to the gate of the vertical transistors. Additionally, it is clear that top-gate and bottom-gate VTFTs can be formed on a single substrate and share multiple layers in common.

Inverters Formed Over a Common Vertical-Support-Element

In some embodiments of the present inventions two vertical transistors that are configured to operate as an inverter can be formed over vertical-support-element. This has advantages over inverters formed from two vertical transistors having independent vertical-support-elements. One clear advantage is a reduction in circuit footprint. Furthermore, the ability to build both top-gate and bottom-gate VTFTs over a common vertical-support-element allows for the design and fabrication of both all-enhancement-mode and enhancement-depletion-mode inverters. The choice of design is dictated by the circuit requirements for a given application. The specific layout of the inverter, including channel dimensions of the individual transistors and arrangement over the vertical-support-element can vary with circuit requirements including footprint. Many designs are possible and are within the scope of the current invention as long as they meet the requirements of having two transistors formed over a single vertical-support-element, and are properly connected as having an inverter.

Inventive Example I6

Enhancement-Depletion Inverters Having Two VTFTs Over a Common Vertical-Support-Element The inverter of Inventive Example I6 was formed using the same process, and on the same substrate, as Inventive Examples I1 and Bottom-gate VTFT BG1. The patterns of the printed inhibitor in the area of the inverter I6 were chosen such that a top-gate VTFT was formed in one reentrant profile, and a bottom-gate VTFT was formed in the second reentrant profile of a common vertical-support-element. The layout and structure can be seen in FIGS. 10a through 10c and FIG. 11. The inverter of Inventive Example I6 has a top-gate VTFT with a thicker gate-dielectric (550 Å) than the bottom-gate VTFT gate-dielectric (400 Å) formed on the common vertical-support structure, as shown in FIG. 11. The bottom-gate VTFT has a channel width of 2 pixels (nominally 140 microns) and a channel length that is determined by the profile of the wicked inhibitor. The channel length is shorter than the obtainable printed feature size, and varies as a function of the width of the VTFT (the distance the inhibitor is required to wick). The 2 pixel bottom-gate VTFT of the inverter of Inventive Example I6 has an approximate average length of 25 microns (while the minimum printed feature is greater than 70 microns). The top-gate VTFT has a channel width of 1 pixel, and an approximate average length of 50 microns.

Inventive Example I7

Enhancement-Depletion Inverters Having a VTFT and a Long-Channel Top-Gate VTFT Connected Over a Vertical-Support-Element The inverter of Inventive Example I7 was formed using the same process, and on the same substrate, as inverter of Inventive Example I7. The pattern of the printed inhibitor in the area of the inverter I7 was chosen to form a bottom-gate VTFT in the first reentrant profile of a vertical-support-element, and a top-gate planar TFT having a channel with a portion extending in a direction orthogonal to the substrate in the second reentrant profile. The structure I7 should be understood from the cross-sectional view of FIG. 27, with the additional elements required to form a top-gate planar TFT having a thicker gate-dielectric (550 Å) than the bottom-gate VTFT gate-dielectric (400 Å). As shown, the channel length of the long-channel top-gate VTFT is primarily defined by the portion of the channel that is parallel to the substrate. The equivalent circuit for inverter I7 is the same as that of I6. The bottom-gate VTFT on inverter I7 is equivalent to the bottom-gate VTFT of I6, and has a channel width of 2 pixels (nominally 140 microns) and an approximate average channel length of 25 microns. The long-channel top-gate VTFT has a channel width of 2 pixels, and a nominal channel length of 80 microns. The channel length of the long-channel top-gate VTFT was defined by printing a 2 pixel by 1 pixel feature adjacent to the second reentrant profile. In this way, the channel dimensions are defined by printing and are much larger than could be obtained by wicking the inhibitor into the reentrant profile (80 microns>25 microns). Furthermore the portion of the channel of the long-channel top-gate first transistor (first semiconductor channel) that extends in a direction parallel to the substrate is approximately 130 times greater than the height of the vertical-support-element (channel length=80 microns, vertical-support-element height=0.6 microns).

Figure 32:
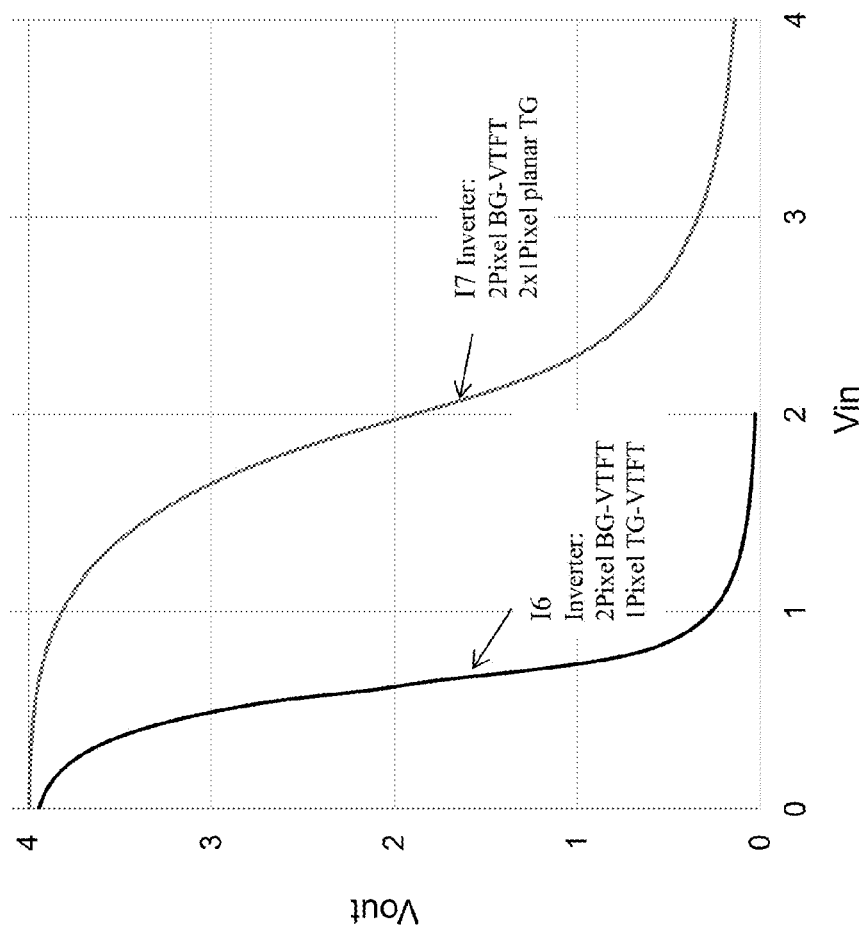
FIG. 32 is a graph illustrating the relationship between input voltage and output voltage for the enhancement-depletion inverters of Inventive Examples I6 and I7.

Electrical testing of Inventive Examples I6 and I7 was done using a probe station to contact the AZO Vdd, ground, Vin and Vout nodes of the inverters. The response of Vout as a function of Vin, for Vdd=4 V can be seen in FIG. 32. As shown, both Inventive Examples form functional inverters. The performance of the inverters of the present invention can be tuned by changing the channel dimensions of either the drive or load TFT, or by varying the gate-dielectric thickness for each TFT independently. Although FIG. 32 illustrates the response of an enhancement-depletion mode inverter from two transistors—namely a top-gate one load TFT and a bottom-gate drive TFT—from the previous description it should be clear that dual-gate inverters having similar features could be formed.

Mixed Circuit Experiments

The electronic devices of the present invention have advantages over devices formed with a single device architecture. By using processes that allow for the easy fabrication of vertical and planar transistors on a common substrate, the size of the transistor can be varied by orders of magnitude without a corresponding impact on circuit footprint. Furthermore, the use of thin film metal-oxide allows the various transistor architectures to be fabricated from a common set of material layers. The use of selective area deposition brings further advantages in patterning, including the independent control of the gate dielectric thickness for elements on a common substrate.

Comparative Example C1

Enhancement-Mode Ring Oscillator

Comparative Example C1 is a 7-stage enhancement-mode ring oscillator formed from all planar bottom-gate TFTs. Comparative Example C1 was fabricated in a similar manner as Inventive Example I1, using the combination of spatial ALD and selective area deposition (SAD). Comparative Example C1, did not have a vertical-support-element formed on the substrate. Each transistor in the ring oscillator had a gate layer of 1000 Å of AZO, gate-dielectric of 750 Å of $Al_2O_3$, 200 Å of ZnO:N for the semiconductor layer and 1000 Å AZO for the source and drain electrodes. As with Inventive Example I1, the printed inhibitor used to pattern each of the device layers was a 2 wt % polyvinyl pyrrolidone (PVP) k30 in diacetone alcohol solution which was printed using a Dimatix 2500 printer. The printing was done using the 10 pL cartridge which resulted in a spot size on the substrate of approximately 90 microns under typical operating conditions. The patterns were printed at a pixel-to-pixel distance of 70 microns (363 dpi). The pattern of PVP used to pattern the AZO layer in the source and drain pattern was left on the device during testing, such that the back channel of the semiconductor layer was covered by a thin layer of PVP k30.

Each inverter of the ring oscillator was connected as the equivalent circuit shown in FIG. 26a. The drive transistors for each inverter had an as designed W=12 pixel/L=1 pixel, and the load transistors for each inverter had an as designed channel of W=2 pixel/L=5 pixel. The sample was analyzed by using a probe station to contact the AZO Vdd, ground, and output nodes of the ring oscillator, and the oscillator was characterized as a function of Vdd (Input Voltage). The time per stage as a function of Input Voltage can be found in FIG. 33.

Inventive Example I8

Enhancement-Mode Ring Oscillator with VTFT Drive Transistors and Planar TFT Load Transistors Inventive Example I8 is a 9-stage enhancement-mode ring oscillator formed from the combination of vertical and planar bottom-gate TFTs. Inventive Example I8 was fabricated in a similar manner as Bottom-Gate VTFT BG2, using the combination of spatial ALD and selective area deposition (SAD). The vertical-support-element was formed as in Bottom-Gate VTFT BG2, and the SU-8 structural polymer was removed from the substrate in the area of the planar bottom-gate load transistors. Each transistor in the ring oscillator had a gate layer of 1000 Å of AZO, gate-dielectric of 400 Å of $Al_2O_3$ (250 Å primary dielectric layer and a 150 Å buffer layer), 200 Å of ZnO:N for the semiconductor layer and 1000 Å AZO for the source and drain electrodes.

The inverters of the ring oscillator were configured as illustrated in FIGS. 25a through 26c, where the drive transistor of a typical enhancement-mode inverter is replaced with two bottom-gate VTFTs that are connected in series. The two vertical drive transistors each had a channel width of 2 pixels, and a channel length that was defined by the wicked inhibitor along the reentrant profile (approximate average length of 25 microns). The planar bottom-gate load transistor had an as designed channel of W=2 pixel/L=5 pixel as in Comparative Example C1. Inventive Example I8 was characterized like Comparative Example C1; the time per stage as a function of Input Voltage can be found in FIG. 33.

Inventive Example I9

Enhancement-Mode Ring Oscillator with VTFT Drive Transistors and Planar TFT Load Transistors Inventive Example I9 is a 9-stage enhancement-mode ring oscillator formed from the combination of vertical and planar bottom-gate TFTs. Inventive Example I9 was fabricated in the same manner and on the same substrate as Inventive Example I8. Configuration and layer thickness of the ring oscillator of Inventive Example I9 are equivalent to those of Inventive Example I8, with the exception of the dimensions of the drive and load transistors. The two vertical drive transistors each had a channel width of 4 pixels, and a channel length that was defined by the wicked inhibitor along the reentrant profile (approximate average length of 4 microns). The planar bottom-gate load transistor had an as designed channel of W=2 pixel/L=2 pixel. Inventive Example I9 was characterized like Comparative Example C1; the time per stage as a function of Input Voltage can be found in FIG. 33.

Figure 33:
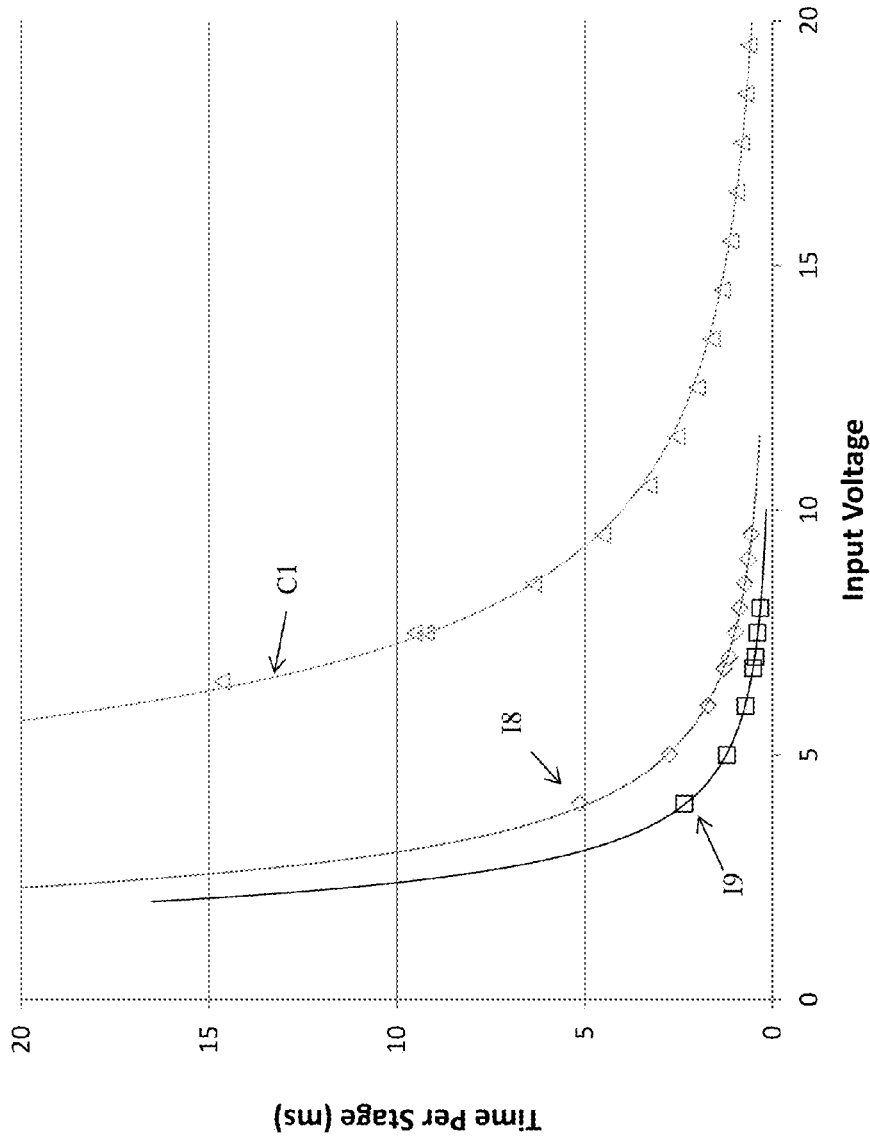
FIG. 33 is a graph illustrating the relationship between time per stage and input voltage for the ring oscillators of Inventive Examples I8 and I9 and Comparative Example C1.

The time per stage as a function of Input Voltage for Comparative Example C1 and Inventive Examples I8 and I9 can be seen in FIG. 33. As shown, both Inventive Examples I8 and I9 form functional ring oscillators with shorter time per stage than the all-planar TFT oscillator of Comparative Example C1. As shown, the performance of the ring oscillators of the present invention can be tuned by changing the channel dimensions of either the drive or load TFT, or by varying the gate-dielectric thickness for each TFT independently. Inventive Example I9 has a stronger drive and load transistor configuration and gives a shorter time per stage. Both Inventive Example I8 and I9 have a smaller footprint than Comparative Example C1, even though they have a larger number of stages.

The invention has been described in detail with particular reference to certain preferred embodiments thereof, but it will be understood that variations and modifications can be effected within the scope of the invention.

PARTS LIST 1 planar bottom-gate TFT
2 planar bottom-gate TFT
3 planar bottom-gate TFT
4 planar bottom-gate TFT
5 planar bottom-gate TFT
6 planar bottom-gate TFT
12 gate
13 dielectric layer
14 via region
15 semiconductor layer
18,19 source, drain
20 post
21,22 dielectric layer
23 multilayer dielectric stack
25 additional protection dielectric layer
26 buffer layer
30 cap
91 exhaust channels
92 metal precursor flow
93 oxidizer-containing flow
94 output face
95 nitrogen purge flow
96 delivery head
97 example substrate
98 arrow
99 gap
100 top-gate vertical transistor
102 top-gate vertical transistor
103 top-gate vertical transistor
104 top-gate vertical transistor
105 top-gate vertical transistor
106 top-gate vertical transistor
107 top-gate vertical transistor
108 top-gate vertical transistor
110 substrate
115 second conformal dielectric layer
120 vertical-support-element
125 conformal conductive gate layer
125a, 125b conformal gate
127 gate
130 dielectric
131 multilayer dielectric stack
132 dielectric
135 via
140 first reentrant profile
141 first reentrant profile
145 second reentrant profile
146 second reentrant profile
150 semiconductor
155 semiconductor
170 second electrode
175 third electrode
180 first electrode
181 first electrode
185 fourth electrode
200 top-gate vertical transistor
202 top-gate vertical transistor
203 top-gate vertical transistor
204 top-gate vertical transistor
205 top-gate vertical transistor
206 top-gate vertical transistor
207 top-gate vertical transistor
303 top-gate vertical transistor
304 top-gate vertical transistor
305 bottom-gate vertical transistor
306 bottom-gate vertical transistor
315 bottom-gate vertical transistor
316 bottom-gate vertical transistor
325 bottom-gate
327 bottom-gate
330 dielectric
335 dielectric
350 semiconductor
370 second electrode
375 third electrode
380 first electrode
385 fourth electrode
410 planar bottom-gate TFT
411 planar top-gate TFT
413 planar bottom-gate TFT
414 planar top-gate TFT
415 planar bottom-gate TFT
416 long channel bottom-gate VTFT
417 long channel top-gate TFT
418 top-gate VTFT
420 bottom-gate VTFT
421 bottom-gate VTFT
423 top-gate VTFT
424 top-gate VTFT
425 bottom-gate VTFT
426 bottom-gate VTFT
427 bottom-gate VTFT
428 bottom-gate VTFT
430 bottom-gate VTFT
431 bottom-gate VTFT
433 top-gate VTFT
434 top-gate VTFT
435 bottom-gate VTFT
500a,b,c width of top 505a,b,c minimum width defining reentrant profile
510a,b,c first side
520a,b,c second side
530a,b,c height of vertical-support-element
535a,b,c top of vertical-support-element
540a,b,c first reentrant profile
545a,b,c second reentrant profile
701 dual-gate vertical transistor
702 dual-gate vertical transistor
703 dual-gate vertical transistor
704 dual-gate vertical transistor
705 dual-gate vertical transistor
706 dual-gate vertical transistor
715 dielectric
720 conformal bottom gate
721 conformal bottom gate
725 conformal top gate
727 conformal top gate
730 dielectric
735 via
750 semiconductor
751 semiconductor
760 electrically conductive gate structure
770 second electrode
775 third electrode
780 first electrode
785 fourth electrode
801 bottom-gate vertical transistor
802 bottom-gate vertical transistor
803 bottom-gate vertical transistor
804 bottom-gate vertical transistor
805 bottom-gate vertical transistor
820 electrically conductive gate structure
825 gate layer
830 dielectric
850 semiconductor
870 second electrode
875 third electrode
880 first electrode
885 fourth electrode
900 planar top-gate TFT
910 substrate
920 top-gate
930 dielectric
950 semiconductor
980.985 source/drain
A,A'
C1,C1'
C2,C2'
C3,C3'P,P'
d

The invention claimed is:
1. An electronic device comprising:
   a substrate;
   a top-gate transistor and a bottom-gate transistor sharing an insulating vertical-support-element located on the substrate, the vertical-support-element extending away from the substrate, the vertical-support-element having an outer surface including a first edge having a first reentrant profile and a second edge having a second reentrant profile;
   wherein the top-gate transistor includes:
      a first conformal semiconductor layer in contact with and conforming to the outer surface of the vertical-support-element in the first reentrant profile;
      a first electrode located in contact with a first portion of the first conformal semiconductor layer over the top of and in contact with the vertical-support-element;
      a second electrode located in contact with a second portion of the first conformal semiconductor layer over the substrate and not over the vertical-support-element, and adjacent to the first edge of the vertical-support-element, wherein the second electrode is in direct contact with the substrate, and wherein a third portion of the first conformal semiconductor layer between the first portion and the second portion of the first conformal semiconductor layer is in direct contact with the first edge of the vertical-support-element;
      a first conformal dielectric layer in contact with and conforming to the first semiconductor layer in the first reentrant profile; and
      a conformal conductive top-gate in contact with and conforming to the first conformal dielectric layer in the first reentrant profile;
      wherein the first electrode and the second electrode define a first semiconductor channel of the top-gate transistor, and wherein the first conformal semiconductor layer, the first conformal dielectric layer and the conformal conductive top-gate maintain a shape of the first reentrant profile; and
   wherein the bottom-gate transistor includes:
      a conformal conductive bottom-gate in contact with and conforming to the outer surface of the vertical-support-element in the second reentrant profile;
      a second conformal dielectric layer in the second reentrant profile and in contact with and conforming to the conformal conductive bottom-gate;
      a second conformal semiconductor layer in the second reentrant profile and in contact with and conforming to the second conformal dielectric layer;
      a third electrode located over the substrate and not over the vertical-support-element, and adjacent to the second edge, the third electrode in contact with the second semiconductor layer; and
      a fourth electrode located over the top of the vertical-support-element and in contact with the second semiconductor layer;
      wherein the third electrode and the fourth electrode define a second semiconductor channel of the bottom-gate transistor, and wherein the conformal conductive bottom-gate, the second conformal dielectric layer, and the second conformal semiconductor layer maintain a shape of the second reentrant profile;
   wherein the conformal conductive top-gate, the third electrode, and the fourth electrode have a same material composition and thickness, and wherein the conformal conductive bottom-gate, the first electrode, and the second electrode have a same material composition and thickness.

2. The electronic device of claim 1, wherein the conformal conductive top-gate, the third electrode, and the fourth electrode are parts of a single conductive material layer.

3. The electronic device of claim 2, wherein the conductive material layer includes a conductive metal oxide.

4. The electronic device of claim 1, wherein the conformal conductive bottom-gate, the first electrode, and the second electrode are parts of a single conductive material layer.

5. The electronic device of claim 1, wherein the first dielectric and the second dielectric have a same material composition and thickness, and are two portions of a same layer.

6. The electronic device of claim 5, wherein the material composition includes an insulating metal oxide.

7. The electronic device of claim 1, wherein the vertical-support-element includes a polymer post and an inorganic material cap on top of the polymer post.

8. The electronic device of claim 1, wherein the top-gate transistor and the bottom-gate transistor are n-type transistors.

9. The electronic device of claim 1, wherein top-gate transistor and the bottom-gate transistor are metal oxide thin film transistors.

10. The electronic device of claim 1, wherein the first semiconductor layer and the second semiconductor layer have the same material composition.

11. The electronic device of claim 1, the first dielectric layer and the second dielectric layer each having a thickness, wherein the thickness of the first dielectric layer is greater than the thickness of the second dielectric layer.

12. The electronic device of claim 1, wherein the first dielectric and the second dielectric are part of a common shared dielectric stack.

13. The electronic device of claim 12, wherein the common shared dielectric stack includes a plurality of layers.

14. The electronic device of claim 13, wherein each of the plurality of layers of the common shared dielectric stack has the same material composition.

15. The device of claim 13, wherein one of the plurality of layers has a different pattern than another of the plurality of layers.

16. The electronic device of claim 1, the top-gate transistor and the bottom-gate transistor being configured to operate as an enhancement-depletion-mode inverter in which the first electrode is electrically connected to the fourth electrode and the conformal conductive top-gate.

17. The electronic device of claim 1, wherein the top-gate transistor is a load transistor configured to operate in a depletion mode, and the bottom-gate transistor is a drive transistor configured to operate in an enhancement mode.

* * * * *